US012048141B2

(12) United States Patent
Lee et al.

(10) Patent No.: US 12,048,141 B2
(45) Date of Patent: Jul. 23, 2024

(54) SEMICONDUCTOR MEMORY DEVICE AND A METHOD OF FABRICATING THE SAME

(71) Applicant: SAMSUNG ELECTRONICS CO., LTD., Suwon-si (KR)

(72) Inventors: Kiseok Lee, Hwaseong-si (KR); Hui-Jung Kim, Seongnam-si (KR); Min Hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 17/574,666

(22) Filed: Jan. 13, 2022

(65) Prior Publication Data

US 2022/0375941 A1 Nov. 24, 2022

(30) Foreign Application Priority Data

May 18, 2021 (KR) .................. 10-2021-0064374

(51) Int. Cl.
*H10B 12/00* (2023.01)
*H01L 29/786* (2006.01)

(52) U.S. Cl.
CPC ....... *H10B 12/30* (2023.02); *H01L 29/78693* (2013.01); *H10B 12/03* (2023.02); *H10B 12/05* (2023.02); *H10B 12/50* (2023.02)

(58) Field of Classification Search
CPC ....... H01L 2225/06541; H01L 25/0657; H01L 29/78693; H10B 12/03; H10B 12/05; H10B 12/30; H10B 12/482; H10B 12/50; H10B 61/22; H10B 63/84
See application file for complete search history.

(56) References Cited

U.S. PATENT DOCUMENTS

| 9,236,122 B2 | 1/2016 | Yan et al. |
| 9,236,417 B2 | 1/2016 | Park |
| 9,953,870 B2 | 4/2018 | Or-Bach et al. |
| 10,224,200 B2 | 3/2019 | Park et al. |
| 10,784,272 B2 | 9/2020 | Lee et al. |
| 10,854,617 B2 | 12/2020 | Derner et al. |
| 10,861,854 B2 | 12/2020 | Kim et al. |
| 11,152,386 B2 | 10/2021 | Or-Bach et al. |

(Continued)

FOREIGN PATENT DOCUMENTS

| CN | 110268523 | 9/2019 |
| EP | 3629329 | 4/2020 |
| TW | 201829430 | 8/2018 |

*Primary Examiner* — Nicholas J Tobergte
*Assistant Examiner* — Kevin Quinto
(74) *Attorney, Agent, or Firm* — F. CHAU & ASSOCIATES, LLC

(57) ABSTRACT

A semiconductor memory device including: a stack structure including a plurality of layers that are vertically stacked on a substrate, each of the plurality of layers including a word line, a channel layer, and a data storage element electrically connected to the channel layer; and a bit line that vertically extends on one side of the stack structure, wherein the word line includes: a first conductive line that extends in a first direction; and a gate electrode that protrudes in a second direction from the first conductive line, the second direction intersecting the first direction, wherein the channel layer is on the gate electrode, and wherein the bit line includes a connection part electrically connected to the channel layer.

19 Claims, 54 Drawing Sheets

(56) References Cited

U.S. PATENT DOCUMENTS

| | | |
|---|---|---|
| 2011/0298037 A1 | 12/2011 | Choe et al. |
| 2019/0378933 A1* | 12/2019 | Inoue .................. H01L 29/7391 |
| 2020/0202900 A1 | 6/2020 | Kang et al. |
| 2020/0279601 A1 | 9/2020 | Kim et al. |
| 2021/0013210 A1 | 1/2021 | Lee et al. |
| 2021/0020747 A1 | 1/2021 | Chen |
| 2021/0043629 A1 | 2/2021 | Kim et al. |
| 2021/0202488 A1* | 7/2021 | Choi ....................... H01L 28/90 |
| 2022/0077151 A1* | 3/2022 | Lee ......................... H01L 28/40 |

* cited by examiner

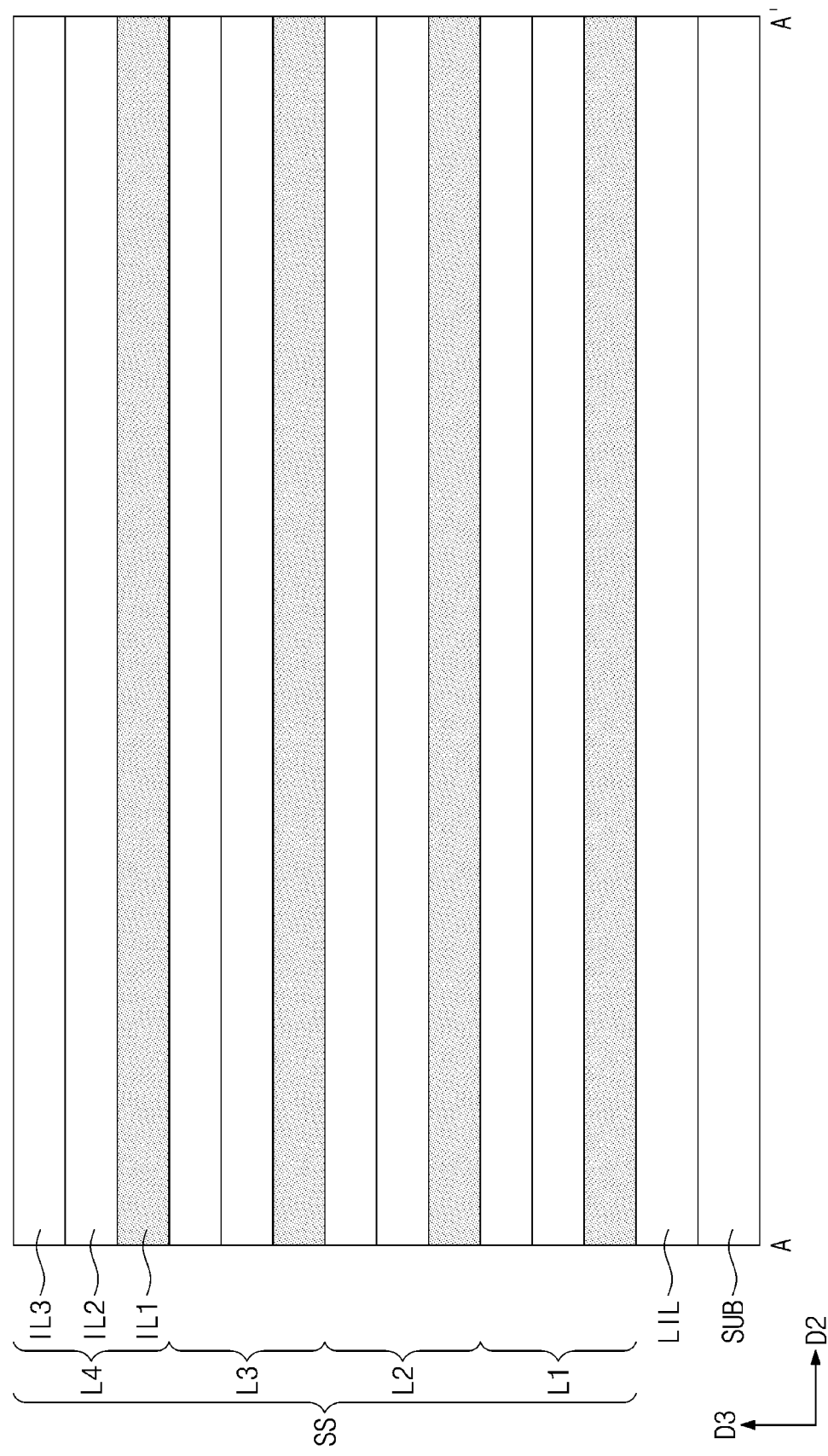

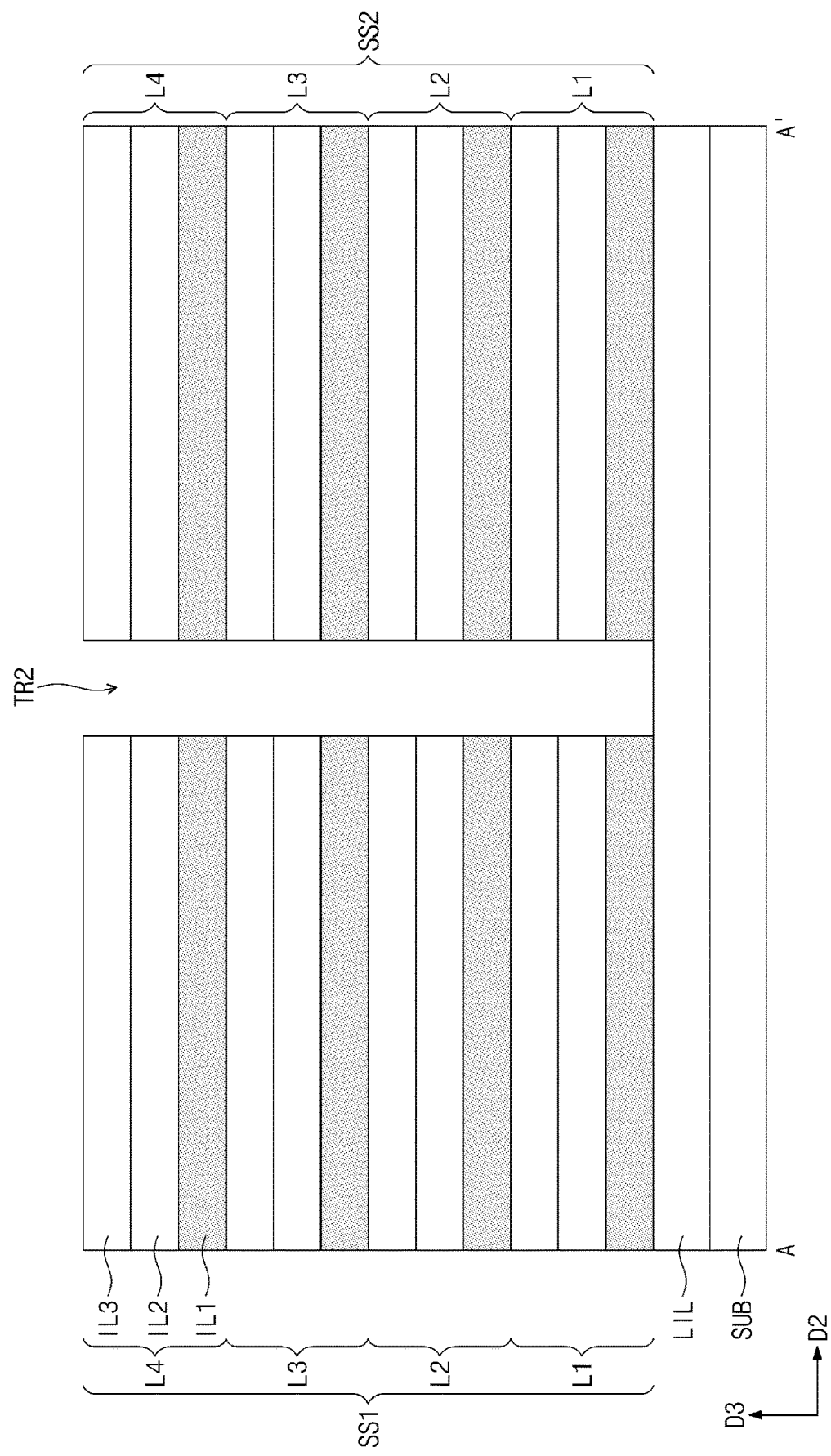

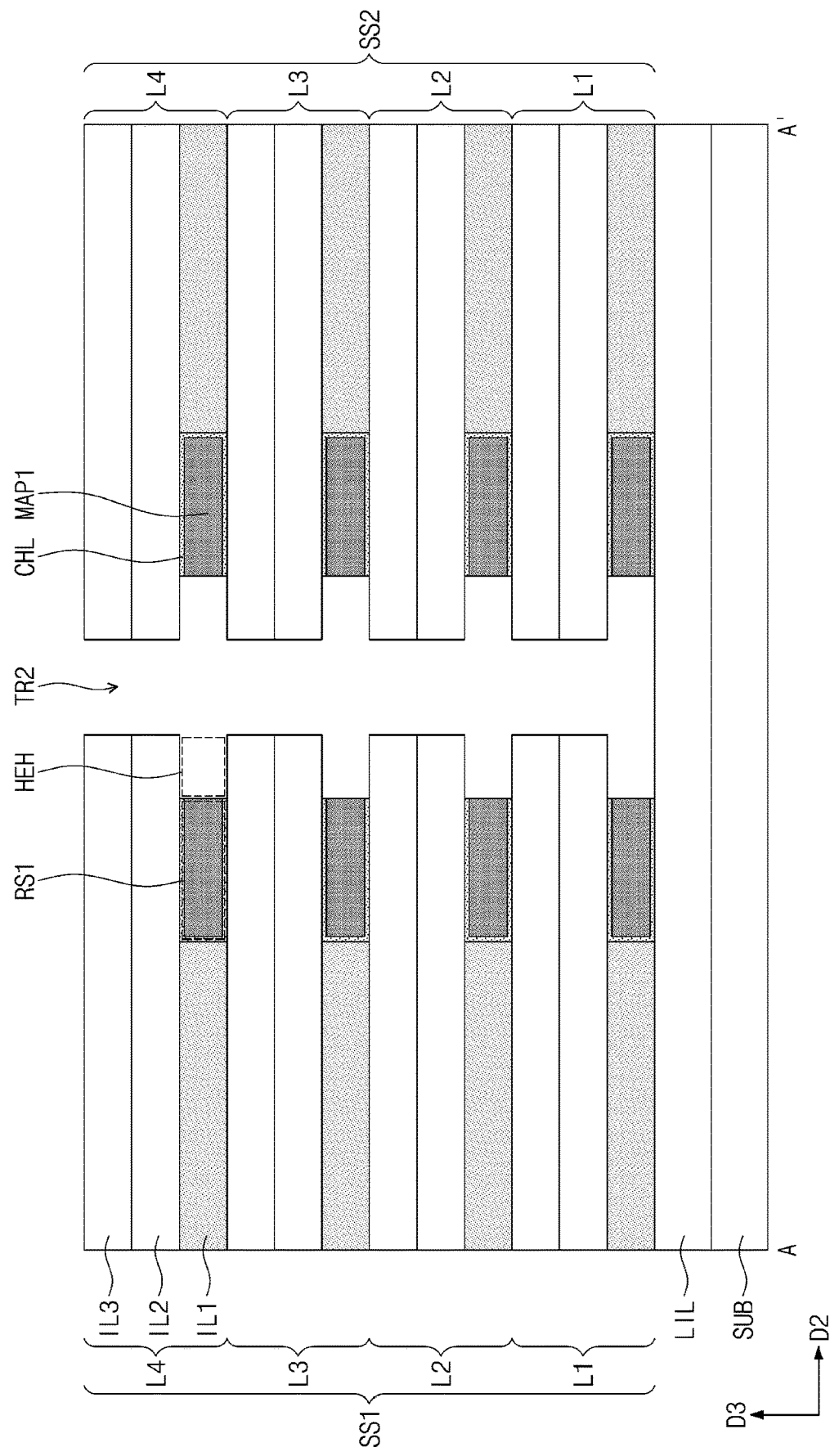

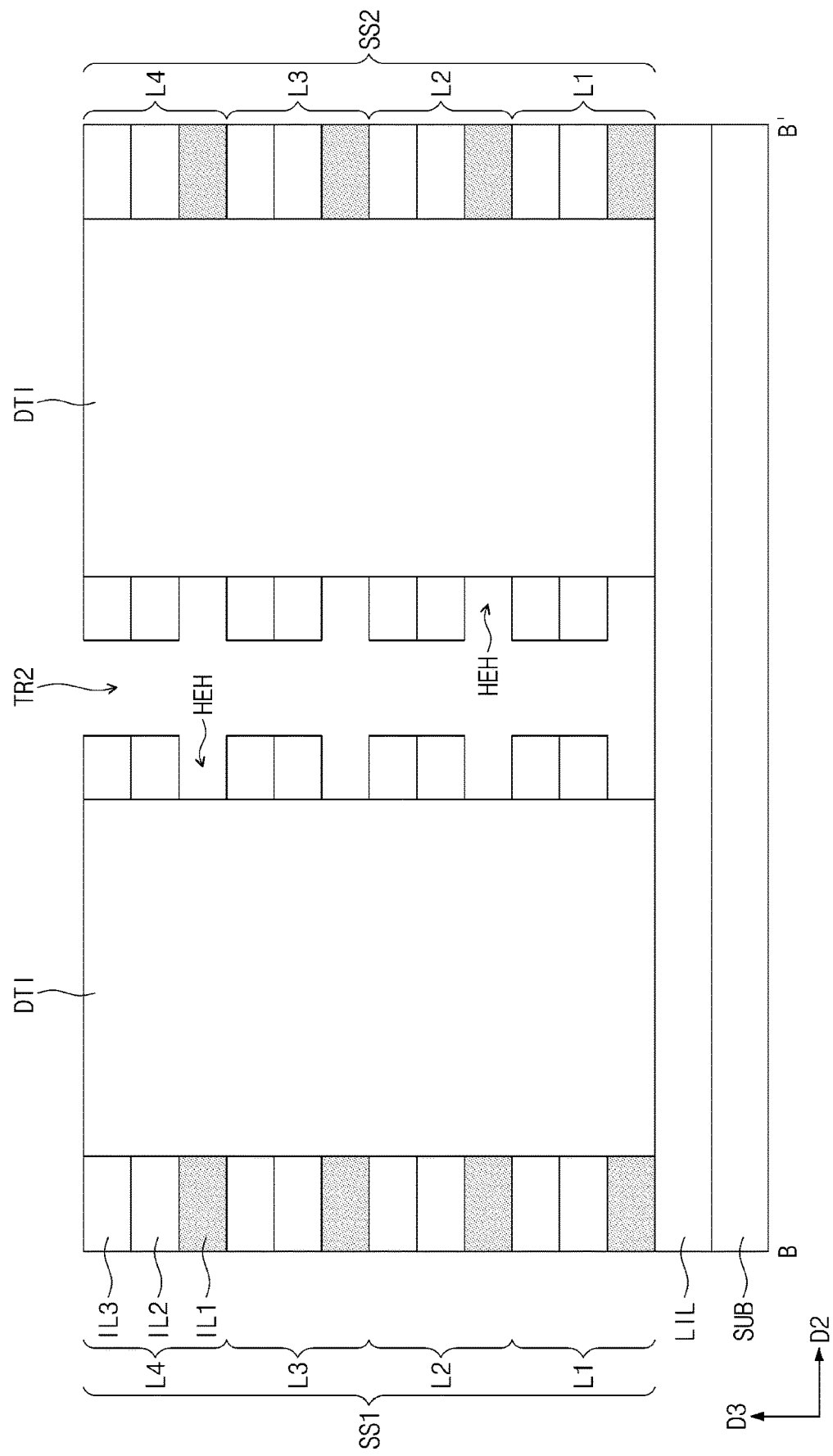

SEMICONDUCTOR MEMORY DEVICE AND A METHOD OF FABRICATING THE SAME

CROSS-REFERENCE TO RELATED APPLICATION

This U.S. nonprovisional application claims priority under 35 U.S.C. § 119 to Korean Patent Application No. 10-2021-0064374 filed on May 18, 2021 in the Korean Intellectual Property Office, the disclosure of which is incorporated by reference herein in its entirety.

TECHNICAL FIELD

The present inventive concept relates to a semiconductor memory device and a method of fabricating the same, and more particularly, to a three-dimensional semiconductor memory device and a method of fabricating the same.

DISCUSSION OF RELATED ART

Semiconductor devices, such as semiconductor memory, have been highly integrated to provide high performance and low manufacturing costs. Because integration of semiconductor devices can reduce product price, highly integrated semiconductor devices are in demand. The integration density of two-dimensional or planar semiconductor devices is primarily determined by the area occupied by a unit memory cell. Therefore, the integration density of the 2D or planar semiconductor devices may be greatly influenced by a technique of forming fine patterns. However, since extremely expensive processing equipment is needed to increase pattern fineness, the integration density of the two-dimensional or planar semiconductor devices continues to increase but is still limited. Therefore, three-dimensional semiconductor memory devices, which include three-dimensionally arranged memory cells, have been developed.

SUMMARY

Some embodiments of the present inventive concepts provide a three-dimensional semiconductor memory device with improved electrical properties and increased integration.

Some embodiments of the present inventive concepts provide a method of fabricating a three-dimensional semiconductor memory device with improved electrical properties and increased integration.

According to an embodiment of the inventive concept, a semiconductor memory device may include: a stack structure including a plurality of layers that are vertically stacked on a substrate, each of the plurality of layers including a word line, a channel layer, and a data storage element electrically connected to the channel layer; and a bit line that vertically extends on one side of the stack structure, wherein the word line includes: a first conductive line that extends in a first direction; and a gate electrode that protrudes in a second direction from the first conductive line, the second direction intersecting the first direction, wherein the channel layer is on the gate electrode, and wherein the bit line includes a connection part electrically connected to the channel layer.

According to an embodiment of the inventive concept, a semiconductor memory device may include: a plurality of word lines that are stacked and spaced apart from each other on a substrate, the word lines extending in a first direction parallel to a top surface of the substrate; a bit line that extends vertically across the word lines; a gate electrode that protrudes in a second direction from a corresponding one of the word lines, wherein the second direction intersects the first direction and is parallel to the top surface of the substrate; a channel layer overlapping the gate electrode; and a data storage element electrically connected to the channel layer, wherein the channel layer has a hollow shape, wherein the gate electrode is provided in an internal space of the channel layer, and wherein the bit line is electrically connected to the channel layer.

According to an embodiment of the inventive concept, a semiconductor memory device may include: a word line on a substrate, the word line including a first conductive line that extends in a first direction parallel to a top surface of the substrate and a plurality of gate electrodes that protrude in a second direction from the first conductive line, the second direction intersecting the first direction; a plurality of bit lines that intersect the word line and extend vertically; a plurality of channel layers, each of the plurality of channel layers disposed between a corresponding one the plurality of bit lines and a corresponding one of the plurality of gate electrodes; and a plurality of data storage elements, wherein each of the data storage elements is electrically connected to a corresponding one of the channel layers, wherein the word line has a comb shape.

According to an embodiment of the inventive concept, a method of fabricating a semiconductor memory device may include: forming a stack structure including a plurality of layers that are vertically stacked on a substrate, each of the plurality of layers including a first dielectric layer, a second dielectric layer, and a third dielectric layer that are sequentially stacked; forming a trench that penetrates the stack structure; removing a portion of the first dielectric layer exposed to the trench to form an extension hole that extends in a first direction and to form a first recess that extends in a second direction from the extension hole; forming a channel layer in the first recess, the channel layer being deposited to not completely fill the first recess; forming a word line that fills the extension hole and the first recess, the word line including a first conductive line formed in the extension hole and a gate electrode formed in the first recess, the gate electrode being surrounded by the channel layer; forming in the trench a bit line that extends vertically; and removing a remaining portion of the first dielectric layer to form a data storage element electrically connected to the channel layer.

BRIEF DESCRIPTION OF THE DRAWINGS

FIGS. 11A, 13A, 15A, 17A, 19A, 21A, 23A, 25A, and 27A illustrate cross-sectional views taken along line A-A' of FIGS. 10, 12, 14, 16, 18, 20, 22, 24, and 26, respectively.

FIGS. 11B, 13B, 15B, 17B, 19B, 21B, 23B, 25B, and 27B illustrate cross-sectional views taken along line B-B' of FIGS. 10, 12, 14, 16, 18, 20, 22, 24, and 26, respectively.

DETAILED DESCRIPTION OF THE EMBODIMENTS

Figure 1:
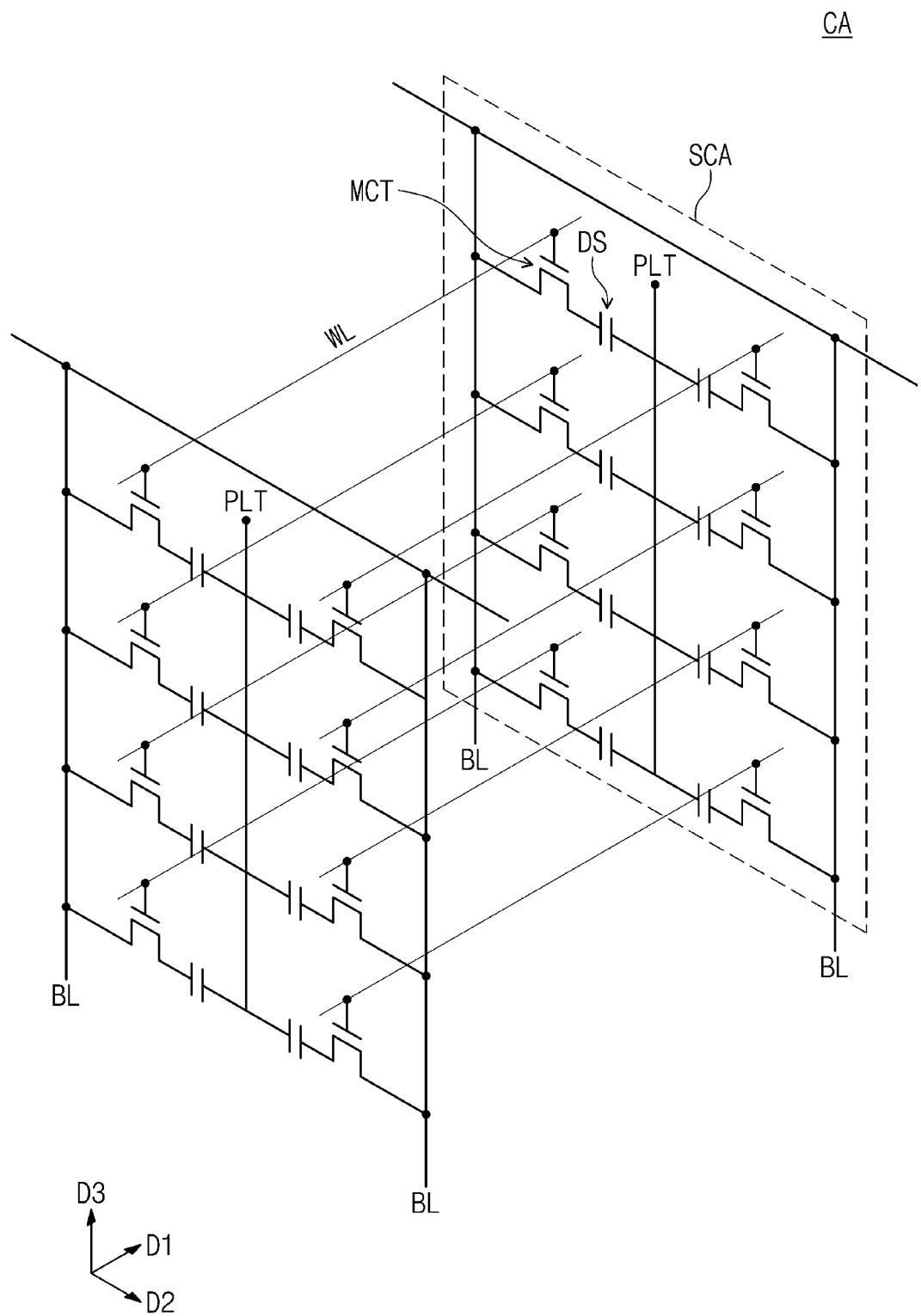
FIG. 1 illustrates a simplified circuit diagram showing a cell array of a three-dimensional semiconductor memory device according to some embodiments of the present inventive concept.

FIG. 1 illustrates a simplified circuit diagram showing a cell array of a three-dimensional semiconductor memory device according to some embodiments of the present inventive concept.

Referring to FIG. 1, a three-dimensional semiconductor memory device according to some embodiments of the present inventive concept may include a cell array CA including a plurality of sub-cell arrays SCA. The sub-cell arrays SCA may be arranged along a first direction D1.

Each of the sub-cell arrays SCA may include a plurality of bit lines BE, a plurality of word lines WE, and a plurality of memory cell transistors MCT. One memory cell transistor MCT may be disposed between one word line WL and one bit line BL.

Each of the bit lines BE may be a conductive pattern (e.g., a metal line) that extends in a vertical direction (e.g., third direction D3) with respect to a substrate. The bit lines BE in one sub-cell array SCA may be arranged in a second direction D2. The bit line BL may be connected in common to the memory cell transistors MCT that are stacked along the third direction D3.

The word lines WL may be conductive patterns (e.g., metal lines) that extend in the third direction D3 on the substrate. Each of the word lines WL may extend in the first direction D1. Each of the word lines WL may be connected in common to the memory cell transistors MCT of the sub-cell arrays SCA, while extending in the first direction D1.

A gate of the memory cell transistor MCT may be connected to the word line WL, and a first source/drain of the memory cell transistor MCT may be connected to the bit line BL. A second source/drain of the memory cell transistor MCT may be connected to a data storage element DS. For example, the data storage element DS may be a capacitor. The second source/drain of the memory cell transistor MCT may be connected to a first electrode of the capacitor.

Figure 2:
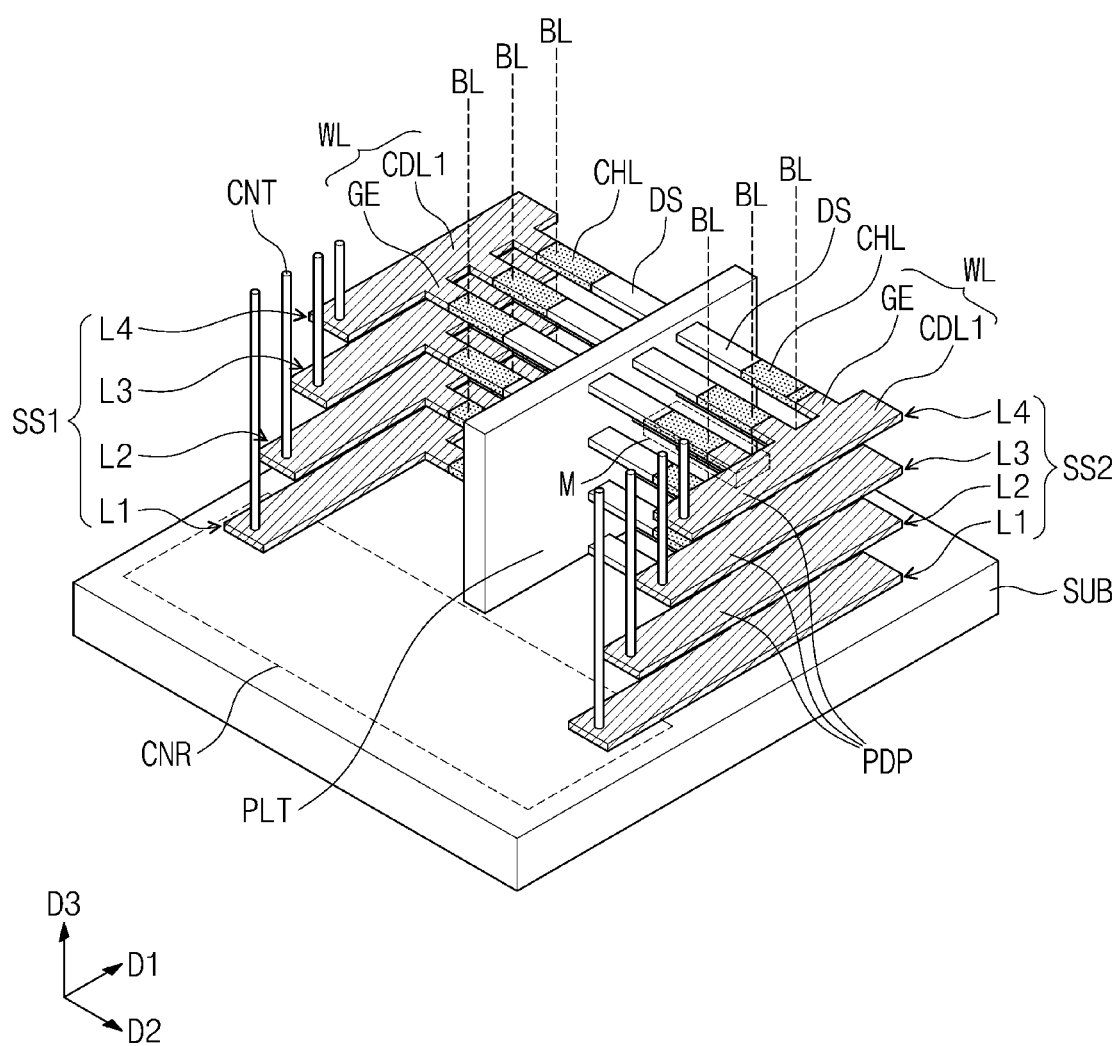
FIG. 2 illustrates a perspective view showing a three-dimensional semiconductor memory device according to some embodiments of the present inventive concept.
Figure 3:
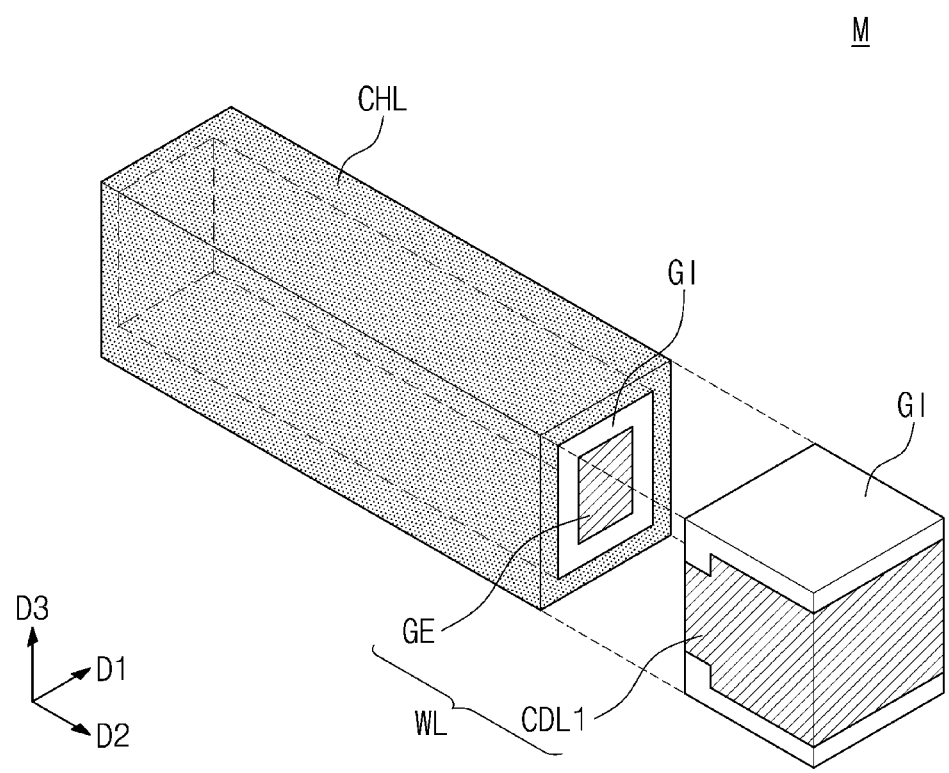
FIG. 3 illustrates an enlarged perspective view showing section M of FIG. 2.
Figure 4A:
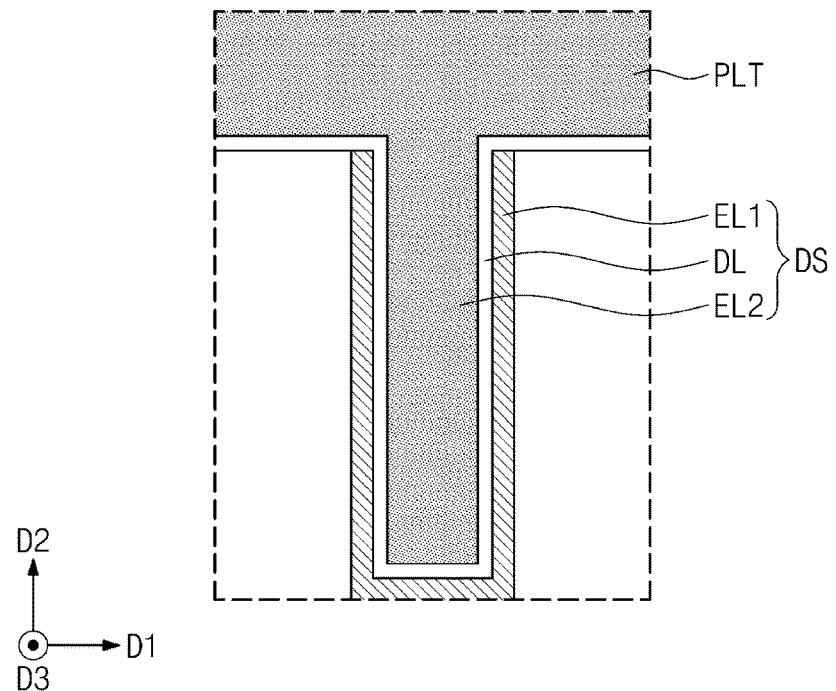
FIGS. 4A, 4B and 4C illustrate cross-sectional views showing examples of a data storage element depicted in FIG. 2.
Figure 4B:
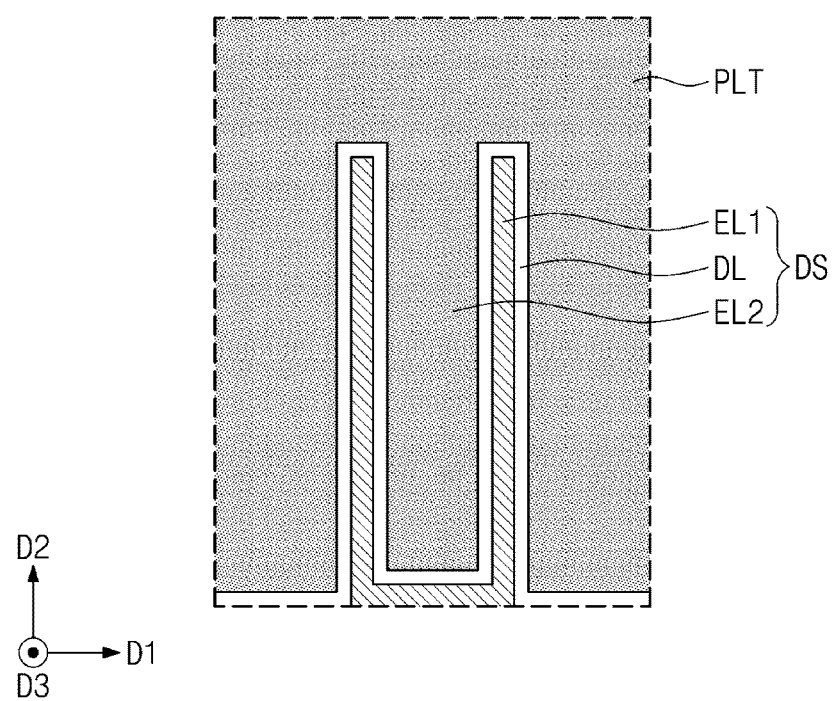
Figure 4C:
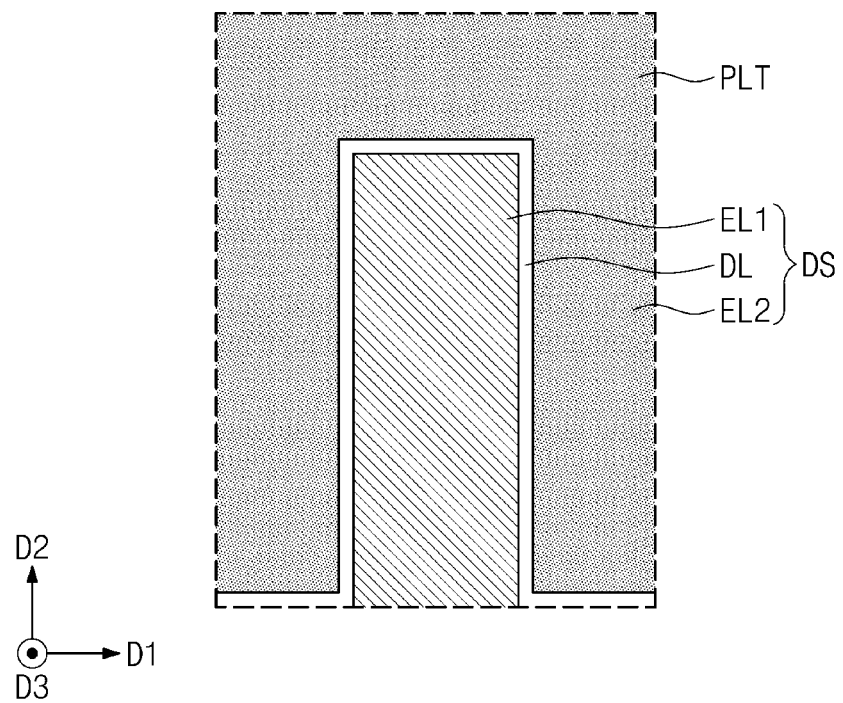

FIG. 2 illustrates a perspective view showing a three-dimensional semiconductor memory device according to some embodiments of the present inventive concept. FIG. 3 illustrates an enlarged perspective view showing section M of FIG. 2. FIGS. 4A to 4C illustrate cross-sectional views showing examples of a data storage element depicted in FIG. 2.

Referring to FIGS. 1 and 2, a substrate SUB may be provided thereon with a first stack structure SS1 and a second stack structure SS2. The substrate SUB may be a silicon substrate, a germanium substrate, or a silicon-germanium substrate. The first and second stack structures SS1 and SS2 may constitute the cell array CA of the three-dimensional semiconductor memory device discussed above with reference to FIG. 1.

For example, each of the first and second stack structures SS1 and SS2 may include a first layer L1, a second layer L2, a third layer L3, and a fourth layer L4 that are sequentially stacked on the substrate SUB. The first to fourth layers L1 to L4 may be stacked and spaced apart in a vertical direction (e.g., the third direction D3). Each of the first to fourth layers L1 to L4 may include a first conductive line CDL1, a plurality of gate electrodes GE connected to the first conductive line CDL1, a plurality of channel layers CHL, and a plurality of data storage elements DS. The plurality of data storage elements DS may be provided between the plurality of channel layers CHL and the plurality of gate electrodes GE.

The word line WL may be constituted by the first conductive line CDL1 and the plurality of gate electrodes GE connected to the first conductive line CDL1. The first conductive lines CDL1 may have a linear shape that extends in the first direction D1. The gate electrodes GE may protrude like a comb shape from a sidewall of the first conductive line CDL1. The gate electrodes GE may protrude in a direction parallel to the second direction D2 that intersects the first direction D1. The first conductive line CDL1 and the plurality of gate electrodes GE connected thereto may give the word line WL to have a comb shape.

The channel layers CHL may be provided on corresponding gate electrodes GE. The first conductive line CDL1 may extend in the first direction D1, while running across the channel layers CHL in a single layer. The gate electrodes GE that protrude from the first conductive line CDL1 may be inserted into corresponding channel layers CHL. The channel layer CHL and the gate electrode GE will be discussed in detail with reference to FIG. 3.

The gate electrode GE may have a bar shape that extends in the second direction D2. The first conductive line CDL1 may be connected to one end of the gate electrode GE. The gate electrode GE and the first conductive line CDL1 may be connected to each other to constitute a single word line WL. The word line WL may include a conductive material. For example, the conductive material may include one of doped semiconductor materials (e.g., doped silicon, doped germanium, etc.), a conductive metal nitride (e.g., titanium nitride, tantalum nitride, etc.), a metal (e.g., tungsten, titanium, tantalum, etc.), and metal-semiconductor compounds (e.g., tungsten silicide, cobalt silicide, titanium silicide, etc.).

A gate dielectric layer GI may be provided to cover a surface of the gate electrode GE. The gate dielectric layer GI may extend from the surface of the gate electrode GE to a surface of the first conductive line CRL1. The gate dielectric layer GI may surround the gate electrode GE. The gate dielectric layer GI may include a high-k dielectric layer, a silicon oxide layer, a silicon nitride layer, a silicon oxynitride layer, or a combination thereof. The high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The channel layer CHL may be provided on the gate electrode GE. The gate dielectric layer GI may be interposed between the channel layer CHL and the gate electrode GE. For example, the channel layer CHL may be spaced apart from the gate electrode GE across the gate dielectric layer GI. The channel layer CHL may surround the gate electrode GE. The channel layer CHL may have an empty square pillar shape or a hollow cylindrical shape. The gate electrode GE may be inserted into an internal space of the channel layer CHL. For example, the gate electrode GE may have an inner gate structure inserted into a channel. A memory cell transistor according to some embodiments of the present inventive, concept may have a three-dimensional channel-all-around structure in which a channel surrounds a gate.

The channel layer CHL may surround the gate electrode GE, but may not surround the first conductive line CDL1. For example, the channel layer CHL and the first conductive line CDL1 may not overlap each other. The gate dielectric layer GI may be disposed on opposite sides of the first conductive line CDL1. The channel layer CHL may include a semiconductor material capable of being formed by using a deposition process performed on the gate electrode GE. Even when a deposition process is employed to form an amorphous semiconductor material, the channel layer CHL may include the semiconductor material as long as the semiconductor material can serve as channels of memory cell transistors.

In some embodiments of the present inventive concept, the channel layer CHL may include an amorphous oxide semiconductor. The channel layer CHL may include a compound of oxygen (O) and at least two metals selected from zinc (Zn), indium (In), gallium (Ga), and tin (Sn). For example, the channel layer CHL may include indium-gallium-zinc oxide (IGZO) or indium-tin-zinc oxide (ITZO).

In some embodiments of the present inventive concept, the channel layer CHL may include a two-dimensional semiconductor. For example, the channel layer CHL may include a metal chalcogenide, a transition metal chalcogenide, graphene, or phosphorene. Either the metal chalcogenide or the transition metal chalcogenide may be a metal oxide that is represented by a chemical formula, MXy (e.g., subscript y is an integer of 1, 2, or 3). In the chemical formula, a symbol M may be a metal atom or a transition metal atom, such as W, Mo, Ti, Zn, Zs, or Zr, A symbol X may be a chalcogen atom, such as S, Se, O, or Te. For example, the channel layer CHL may include one selected from graphene, phosphorene, $MoS_2$, $MoSe_2$, $MoTe_2$, $WS_2$, $WSe_2$, $WTe_2$, $ReS_2$, $ReSe_2$, $TiS_2$, $TeSe_2$, $TiTe_2$, $ZnO$, $ZnS_2$, $ZsSe_2$, $WO_3$, and $MoO_3$. The channel layer CHL may have a mono-layered structure or a multi-layered structure in which two to one hundred layers are stacked. The multi-layered structure may be achieved when a monolayer and its adjacent monolayer are combined with each other by van der Walls force.

Referring to FIG. 2, the data storage element DS may be connected to one end of the channel layer CHL. The data storage element DS may be disposed parallel to an extending direction of the channel layer CHL. A first electrode EL1, which will be discussed below, included in the data storage element DS may extend in a direction parallel to the second direction D2.

The data storage element DS may be a memory element capable of storing data. The data storage element DS may be a memory element using one of a capacitor, a magnetic tunnel junction pattern, and a variable resistance body that includes a phase change material. For example, the data storage element DS may be a capacitor.

The data storage elements DS of the first and second stack structures SS1 and SS2 may be three-dimensionally arranged. The data storage elements DS may be connected in common to a plate PLT provided between the first and second stack structures SS1 and SS2.

FIGS. 4A to 4C show various examples of a capacitor, or the data storage element DS. Referring to FIG. 4A, the data storage element DS may include a first electrode EL1, a second electrode EL2, and a dielectric layer DL. The first electrode EL1 may be connected to one end of the channel layer CHL. The first electrode EL1 may serve as a drain region (or a source region). The second electrode EL2 may be connected to the plate PLT. For example, the second electrode EL2 may be integrally formed with the plate PLT. The dielectric layer DL may be interposed between the first electrode EL1 and the second electrode EL2. The first electrode EL1 may have a hollow cylindrical shape. The second electrode EL2 may be inserted into an internal space of the first electrode EL1 shaped like a cylinder.

The first and second electrodes EL1 and EL2 may independently include at least one selected from metallic materials (e.g., titanium, tantalum, copper, or aluminum), conductive metal nitrides (e.g., titanium nitride or tantalum nitride), and doped semiconductor materials (e.g., doped silicon or doped germanium). The dielectric layer DL may include a high-k dielectric material, such as hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof.

Referring to FIG. 4B, the first electrode EL1 may have a hollow cylindrical shape which is the same as that discussed in FIG. 4A. The second electrode EL2 may be provided not only in an internal space of the first electrode EL1 but also on an outer surface of the first electrode EL1. For example, the second electrode EL2 may surround the first electrode EL1. The dielectric layer DL may remain interposed between the first electrode EL1 and the second electrode EL2.

Referring to FIG. 4C, the first electrode EL1 may have a solid cylindrical shape, or a pillar shape. The second electrode EL2 may surround an outer surface of the first electrode EL1. In this configuration, the second electrode EL2 may have an opening to accommodate the first electrode EL1.

The data storage element DS according to some embodiments of the present inventive concept is not limited to a particular capacitor structure, but may have various capacitor structures as shown in FIGS. 4A to 4C.

The substrate SUB may be provided thereon with a plurality of bit lines BL that extend in a vertical direction e.g., the third direction D3). The channel layers CHL vertically stacked may be perpendicularly connected to each other through the bit line BL.

The bit lines BL may be arranged along the first direction D1. The bit lines BL may be electrically connected to corresponding source regions (or drain regions) of the channel layers CHL that are vertically stacked. The following will explain detailed examples of the bit line BL.

Each of the bit lines BL may include a conductive line that vertically extends. The conductive line may be one of doped semiconductor materials, conductive metal nitrides, metals, and metal-semiconductor compounds.

Each of the word lines WL may include a pad part PDP on a connection region CNR of the substrate SUB. The pad part PDP may be provided at an end of the word line WL. The pad parts PDP stacked on the connection region CNR may have a stepwise structure. A plurality of contacts CNT may be coupled to corresponding pad parts PDP that constitute the stepwise structure.

Empty spaces in the first and second stack structures SS1 and SS2 may be filled with a dielectric material. For example, the dielectric material may include at least one selected from a silicon oxide layer, a silicon nitride layer, and a silicon oxynitride layer. The first and second stack structures SS1 and SS2 may be provided thereon with wiring lines that are electrically connected to the bit lines BL and the word lines WL. For example, the wiring line may be electrically connected through the contact CNT to the word line WL.

Figure 5:
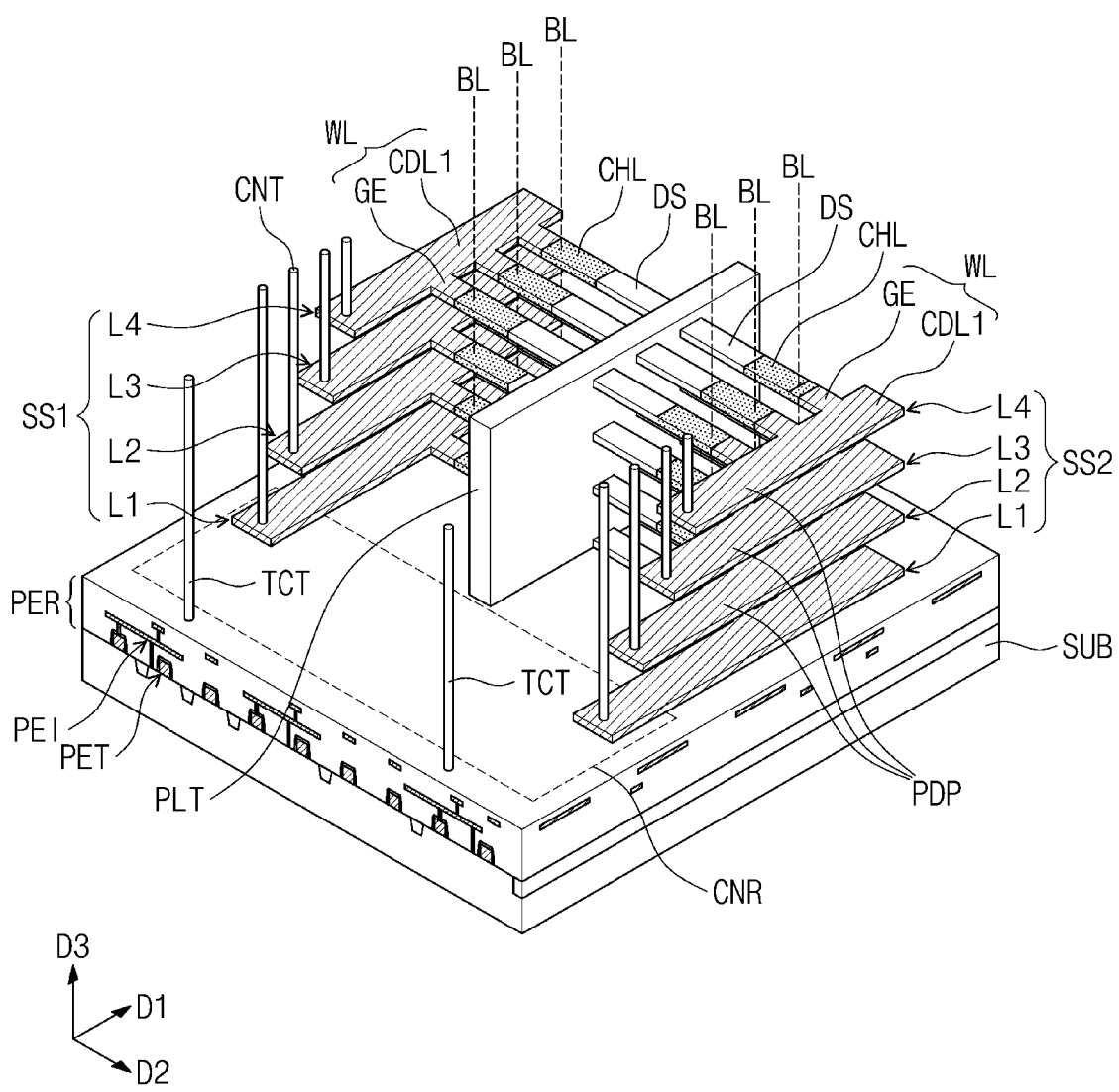
FIGS. 5, 6, and 7 illustrate perspective views showing a three-dimensional semiconductor memory device according to some embodiments of the present inventive concept.
Figure 6:
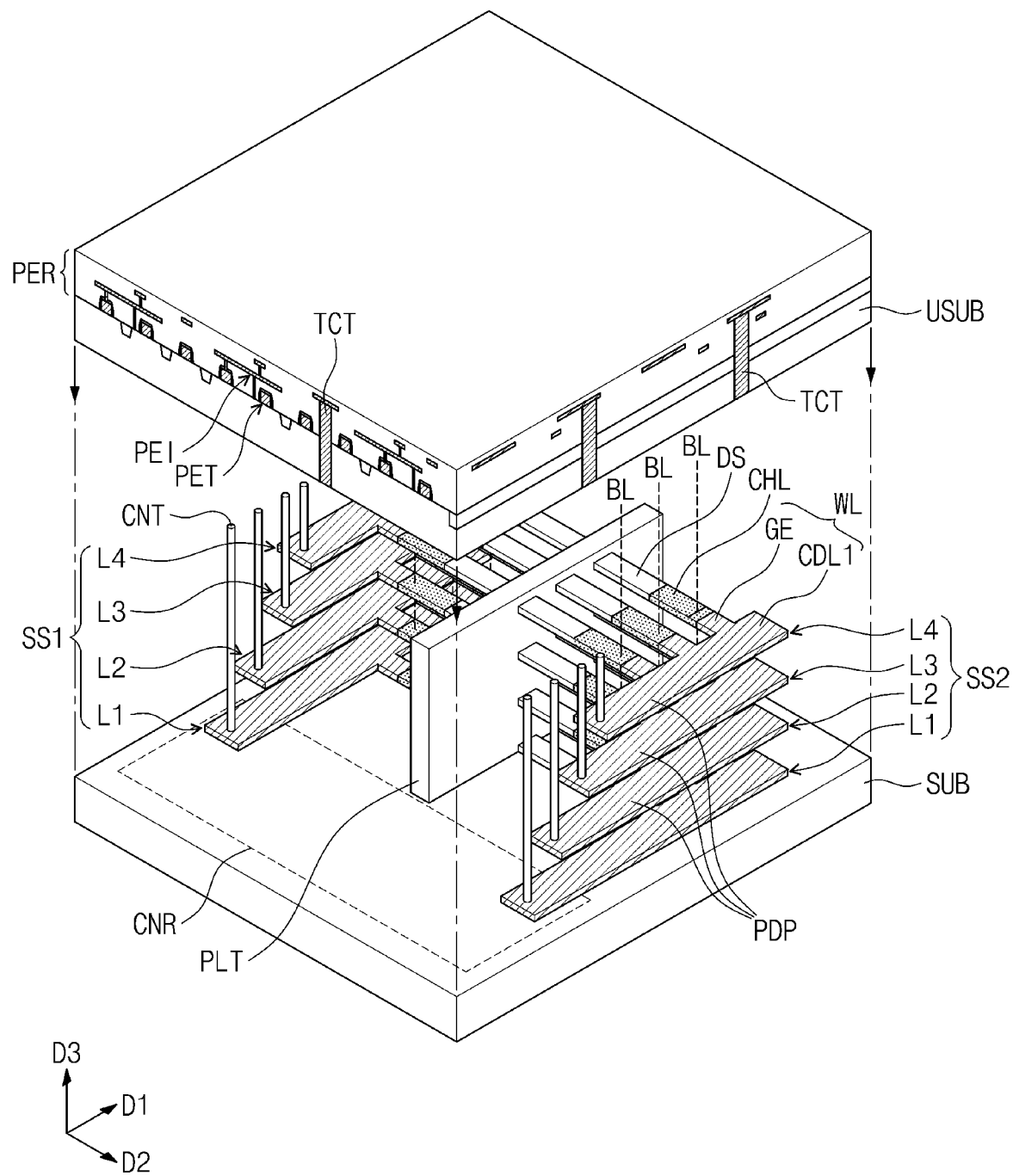
Figure 7:
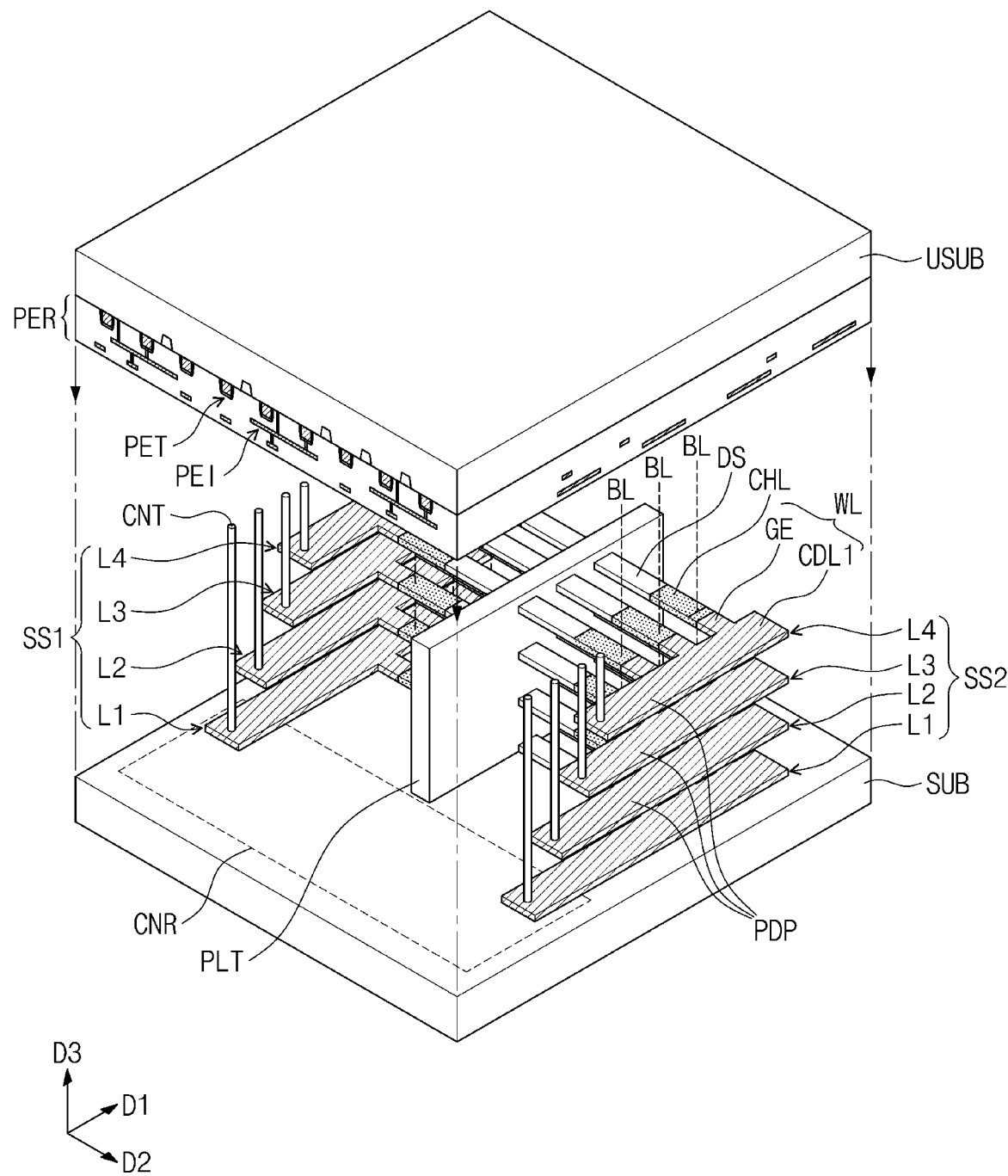

FIGS. 5, 6, and 7 illustrate perspective views showing a three-dimensional semiconductor memory device according to some embodiments of the present inventive concept. In the following embodiments according to FIGS. 5 to 7, a detailed description of technical features repetitive to those discussed with reference to FIGS. 1 to 4C will be omitted, and a difference thereof will be discussed in detail.

Referring to FIG. 5, a peripheral circuit layer PER may be provided on the substrate SUB. The peripheral circuit layer PER may be interposed between the substrate SUB and the first and second stack structures SS1 and SS2. For example, the peripheral circuit layer PER may be provided below a memory cell array layer that is constituted by the first and second stack structures SS1 and SS2.

The peripheral circuit layer PER may include a plurality of peripheral transistors PET and a plurality of peripheral lines PEI on the substrate SUB. The peripheral lines PEI may be provided on the peripheral transistors PET and may be connected through contacts to the peripheral transistors PET.

The peripheral circuit layer PER may further be provided thereon with through contacts TCT. The through contacts TCT may vertically extend toward the peripheral circuit layer PER from wiring lines on the first and second stack structures SS1 and SS2. The through contacts TCT may be adjacent to the connection region CNR of the substrate SUB. The peripheral circuit layer PER may be electrically connected via the through contacts TCT to the wiring lines on the first and second stack structures SS1 and SS2.

In some embodiments of the inventive concept, the peripheral circuit layer PER may include a sense amplifier electrically connected to the bit lines BL. The peripheral circuit layer PER may include sub-word line drivers and/or row decoders electrically connected to word lines WL.

Referring to FIG. 6, an upper substrate USUB and a peripheral circuit layer PER may be provided on a memory cell array layer that is constituted by the first and second stack structures SS1 and SS2. The peripheral circuit layer PER may be provided on the upper substrate USUB (e.g., a semiconductor wafer). A description of the peripheral circuit layer PER may be similar to that discussed above with reference to FIG. 5. A wafer bonding method may be employed to bond the upper substrate USUB to the substrate SUB on which are stacked the first and second stack structures SS1 and SS2.

One or more through contacts TCT may be provided to vertically extend from the peripheral lines PEI of the peripheral circuit layer PER and to penetrate the upper substrate USUB. The through contacts TCT may be provided between adjacent peripheral transistors PET. The through contacts TCT may be connected to the wiring lines on the first and second stack structures SS1 and SS2. For example, the peripheral circuit layer PER may be electrically connected via the through contacts TCT to the wiring lines on the first and second stack structures SS1 and SS2.

Referring to FIG. 7, an upper substrate USUB and a peripheral circuit layer PER may be provided on a memory cell array layer that is constituted by the first and second stack structures SS1 and SS2. The peripheral circuit layer PER may be provided to face the substrate SUB. For example, the upper substrate USUB may be positioned at a top portion, thereby being externally exposed. In other words, the upper substrate USUB may form a top of the structure shown in FIG. 7. The peripheral circuit layer PER may be directly bonded to the memory cell array layer.

One or more metal pads (e.g., copper) may be provided between and electrically connected to the peripheral circuit layer PER and the memory cell array layer. For example, a first metal pad at an uppermost portion of the memory cell array layer may be bonded to a second metal pad at a lowermost portion of the peripheral circuit layer PER, and thus the wiring line of the memory cell array layer may be electrically connected to the peripheral line PEI of the peripheral circuit layer PER.

Figure 8:
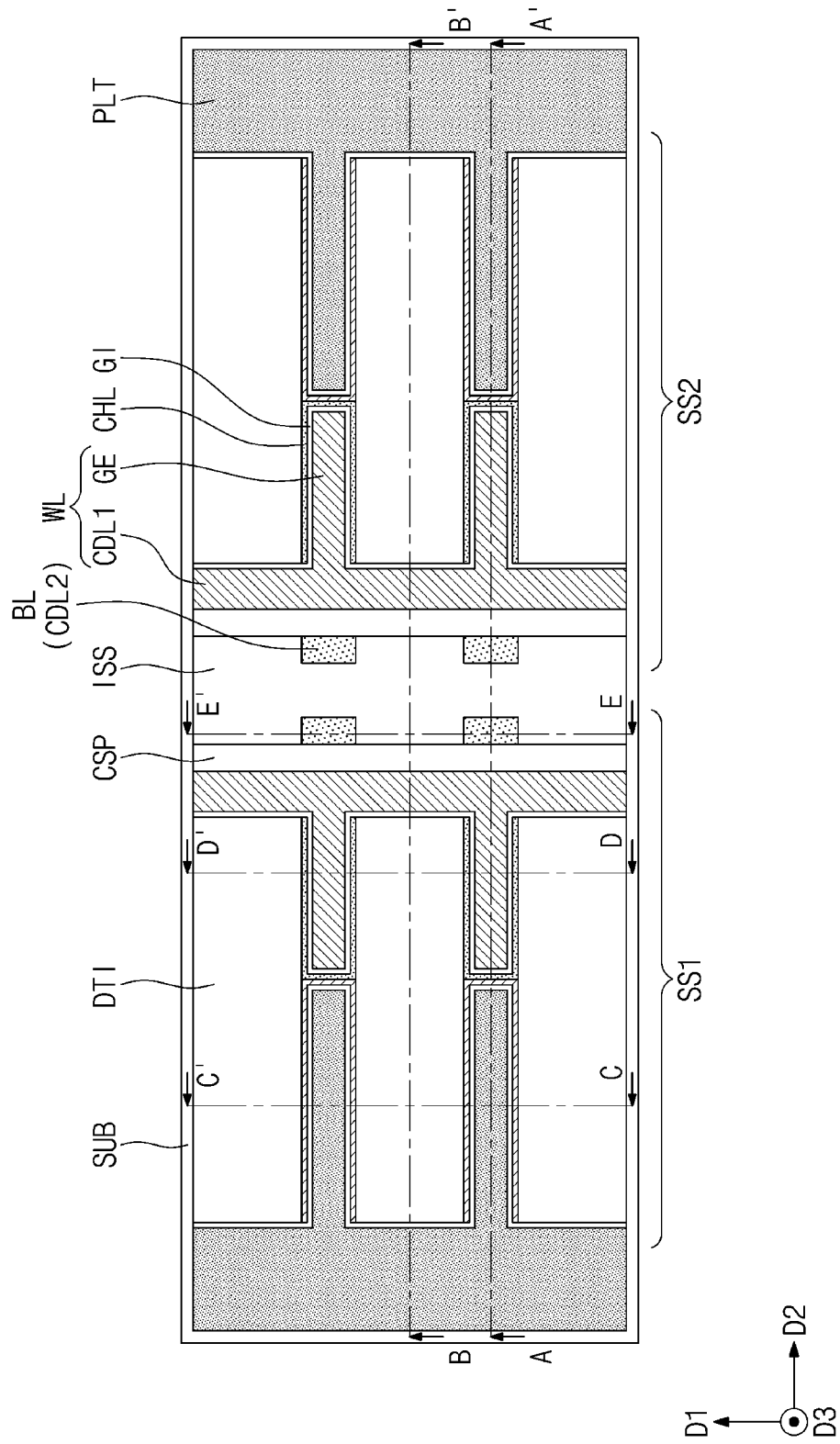
FIG. 8 illustrates a plan view showing a three-dimensional semiconductor memory device according to some embodiments of the present inventive concept.
Figure 9A:
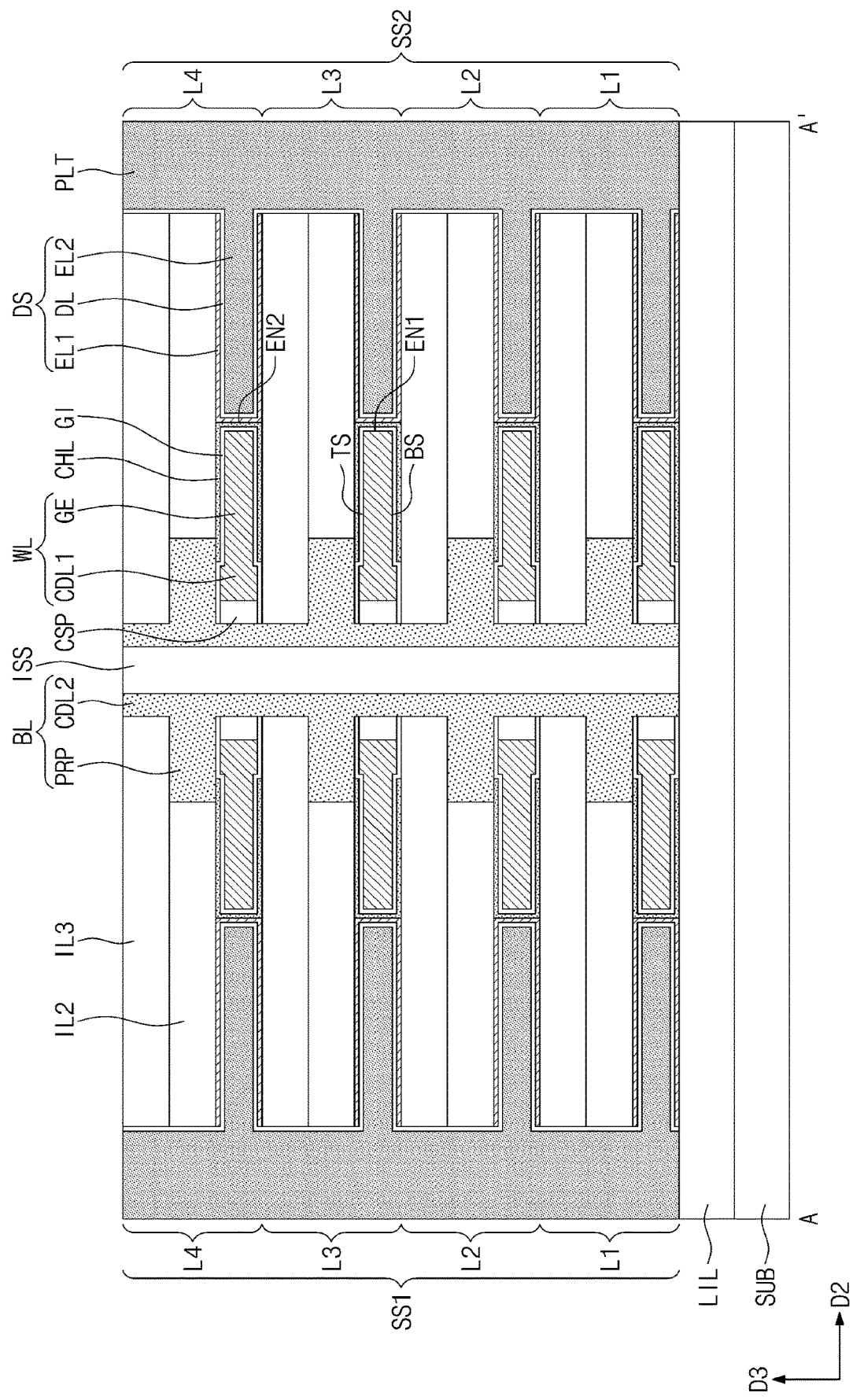
FIGS. 9A, 9B, 9C, 9D, and 9E illustrate cross-sectional views respectively taken along lines A-A', B-B', C-C', D-D', and E-E' of FIG. 8.
Figure 9B:
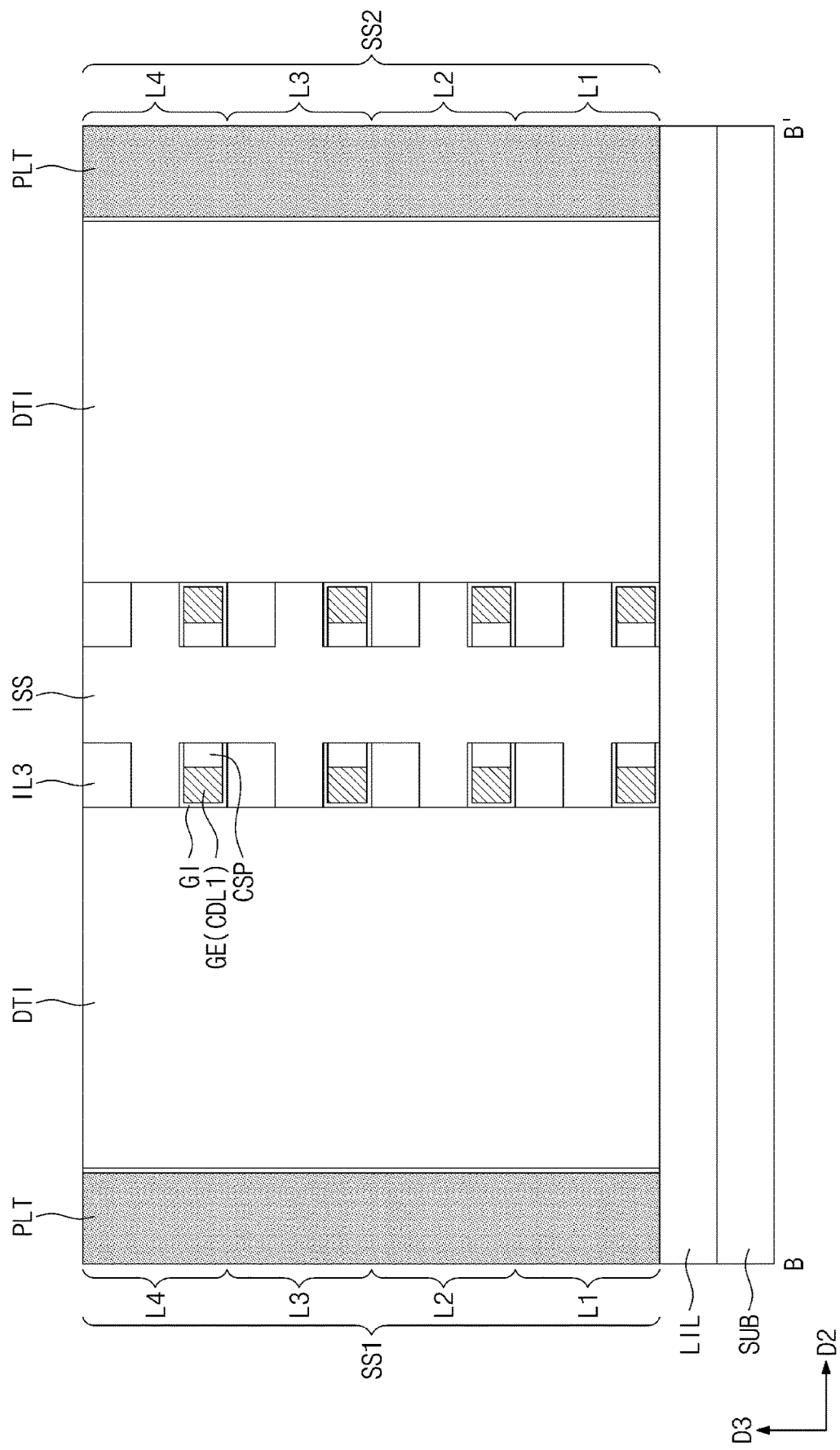
Figure 9C:
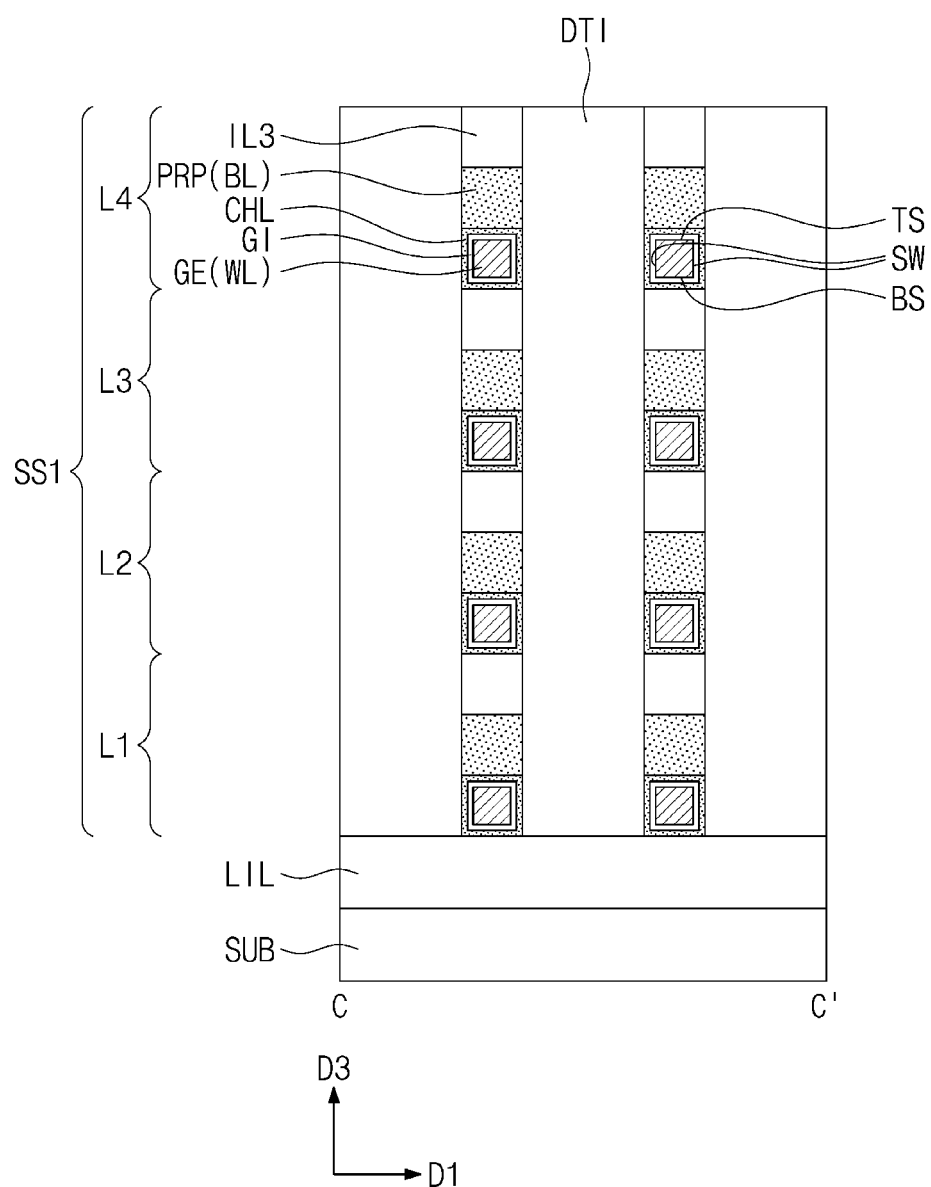
Figure 9D:
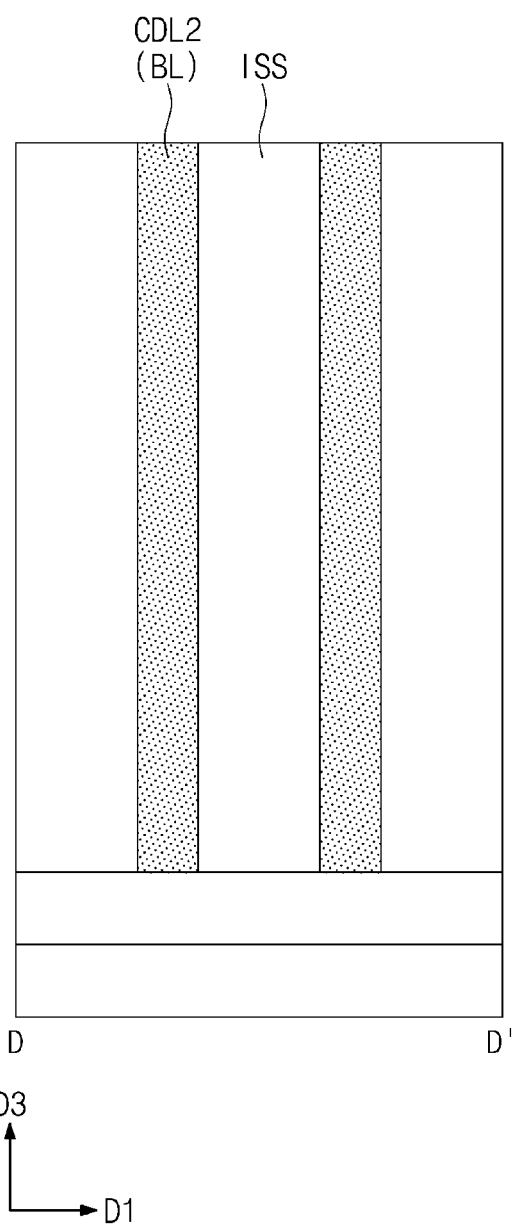
Figure 9E:
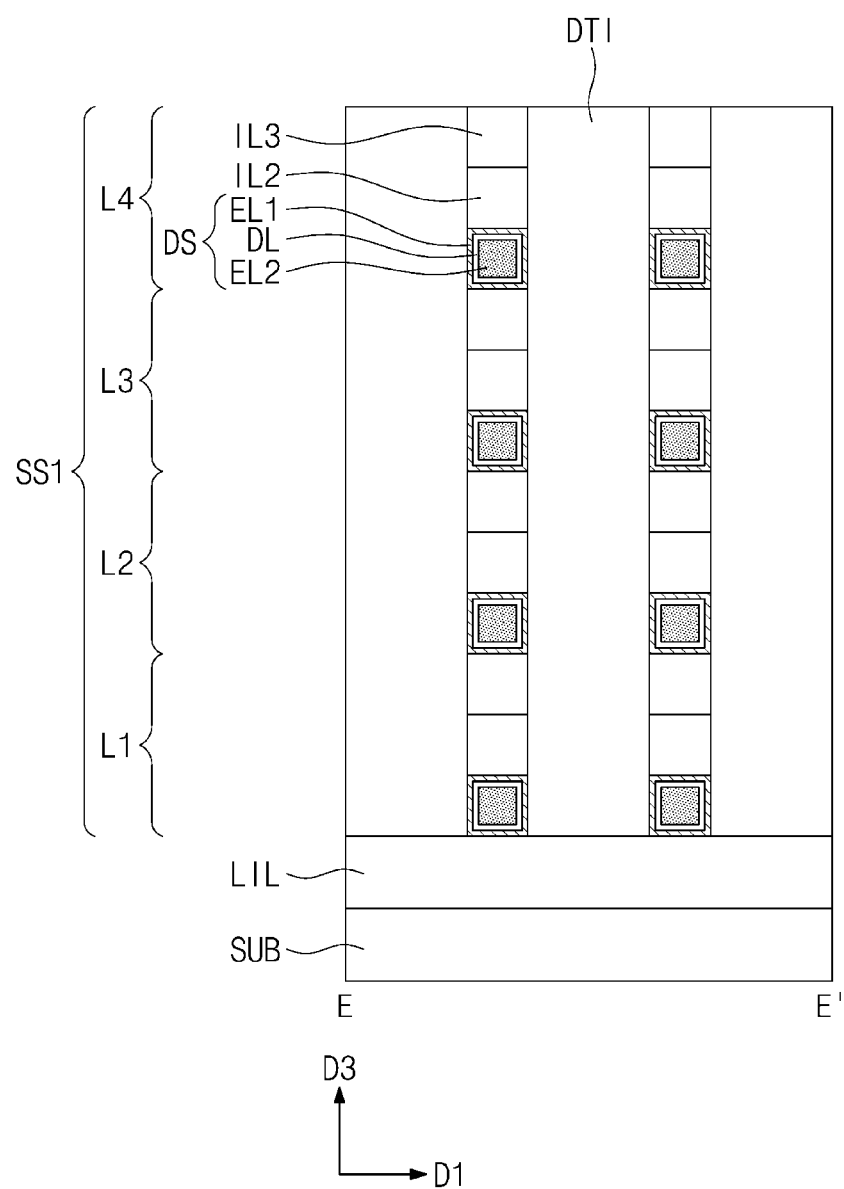
Figure 10:
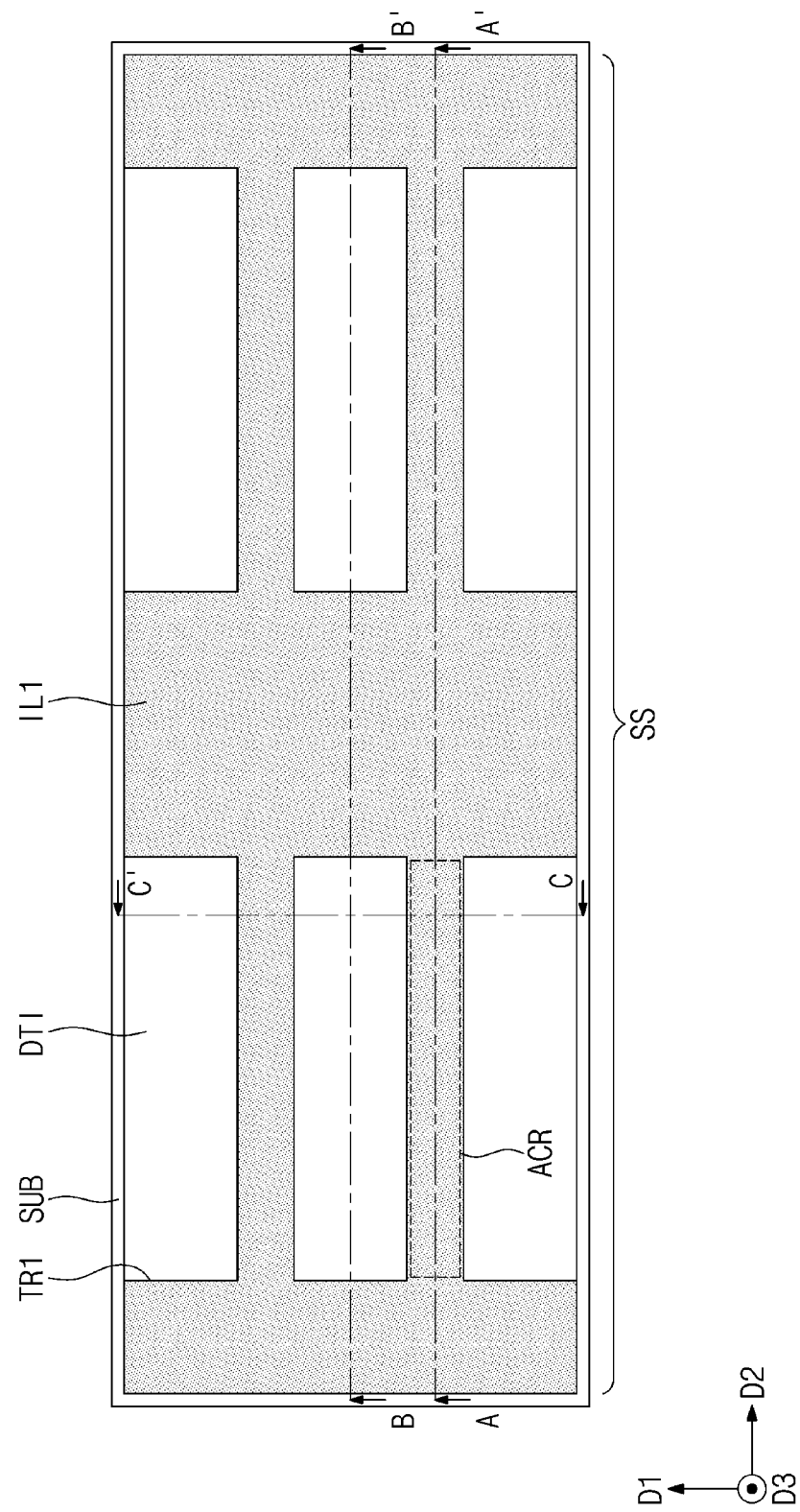
FIGS. 10, 12, 14, 16, 18, 20, 22, 24, and 26 illustrate plan views showing a method of fabricating a three-dimensional semiconductor memory device according to some embodiments of the present inventive concept.
Figure 11B:
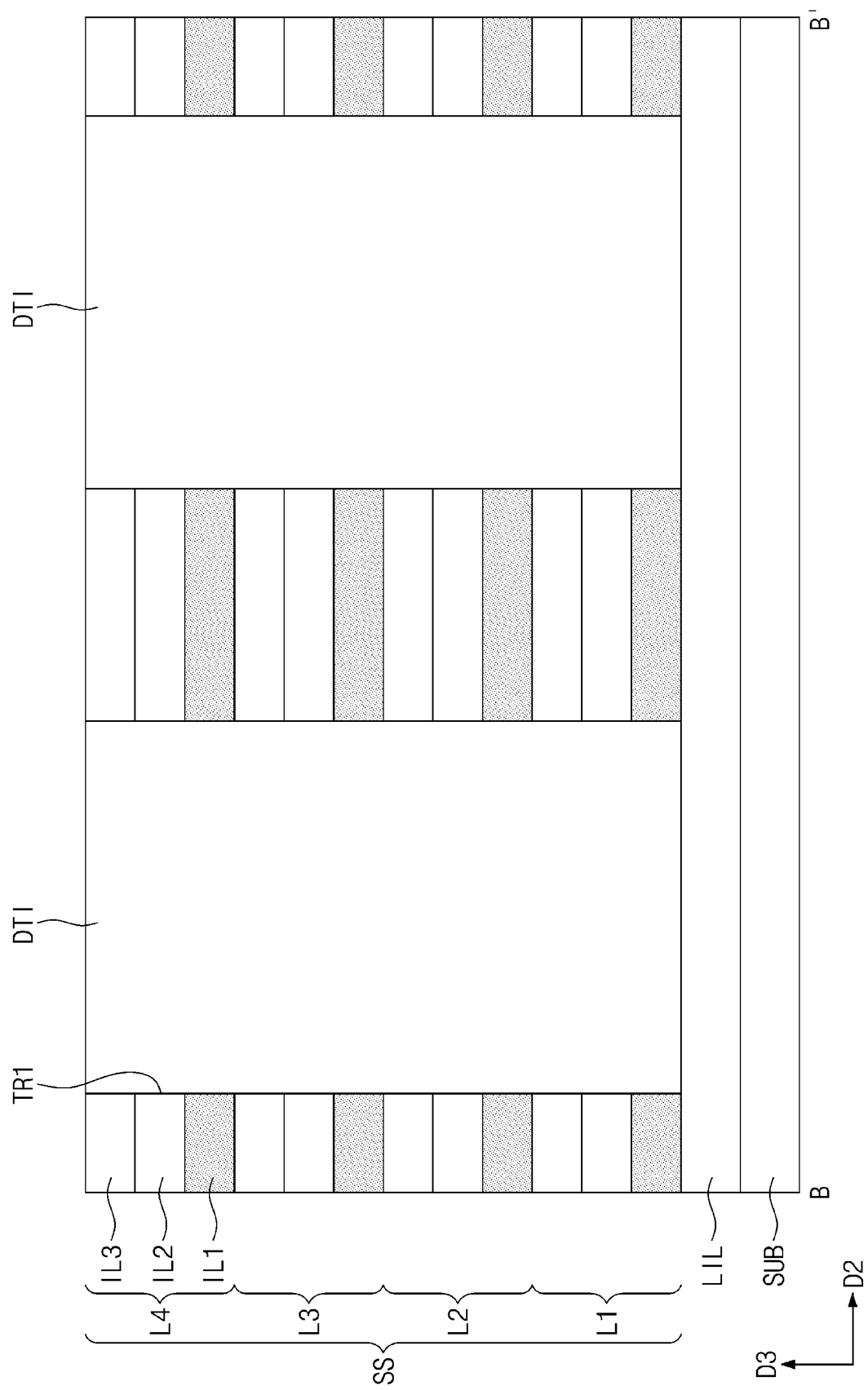
Figure 11C:
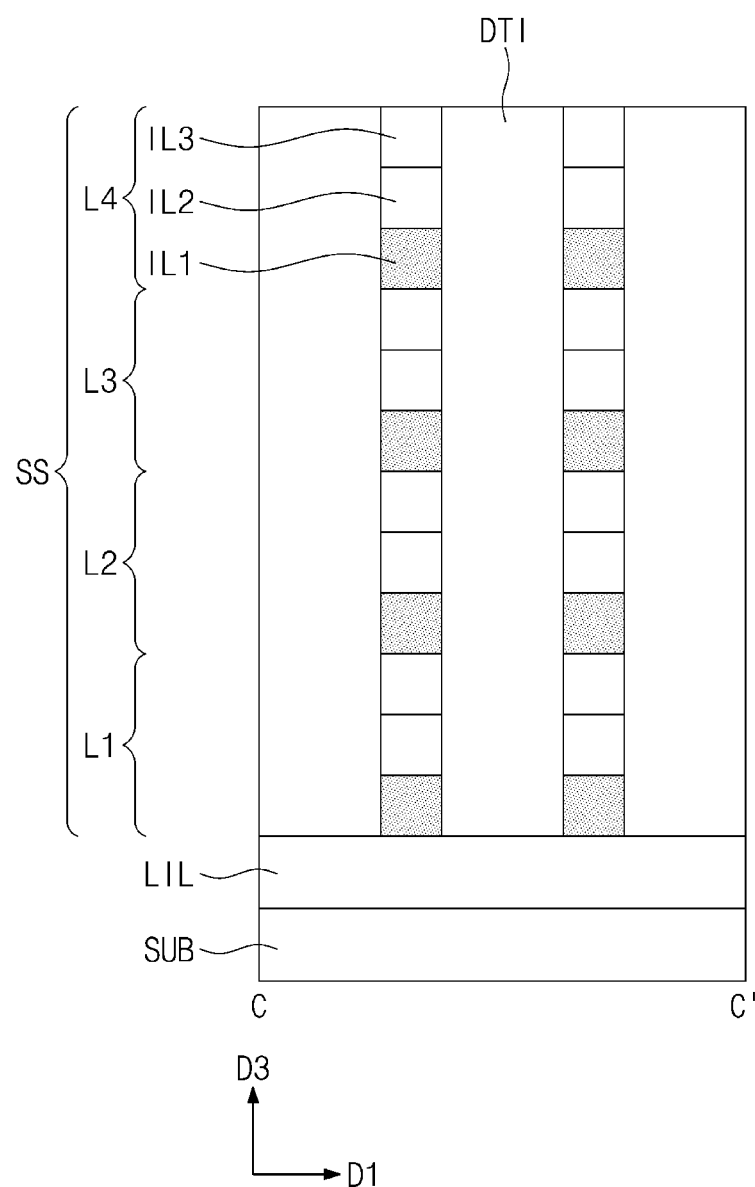
FIGS. 11C, 13C, 15C, 17C, 19C, 21C, 23C, 25C, and 27C illustrate cross-sectional views taken along line C-C' of FIGS. 10, 12, 14, 16, 18, 20, 22, 24, and 26, respectively.
Figure 12:
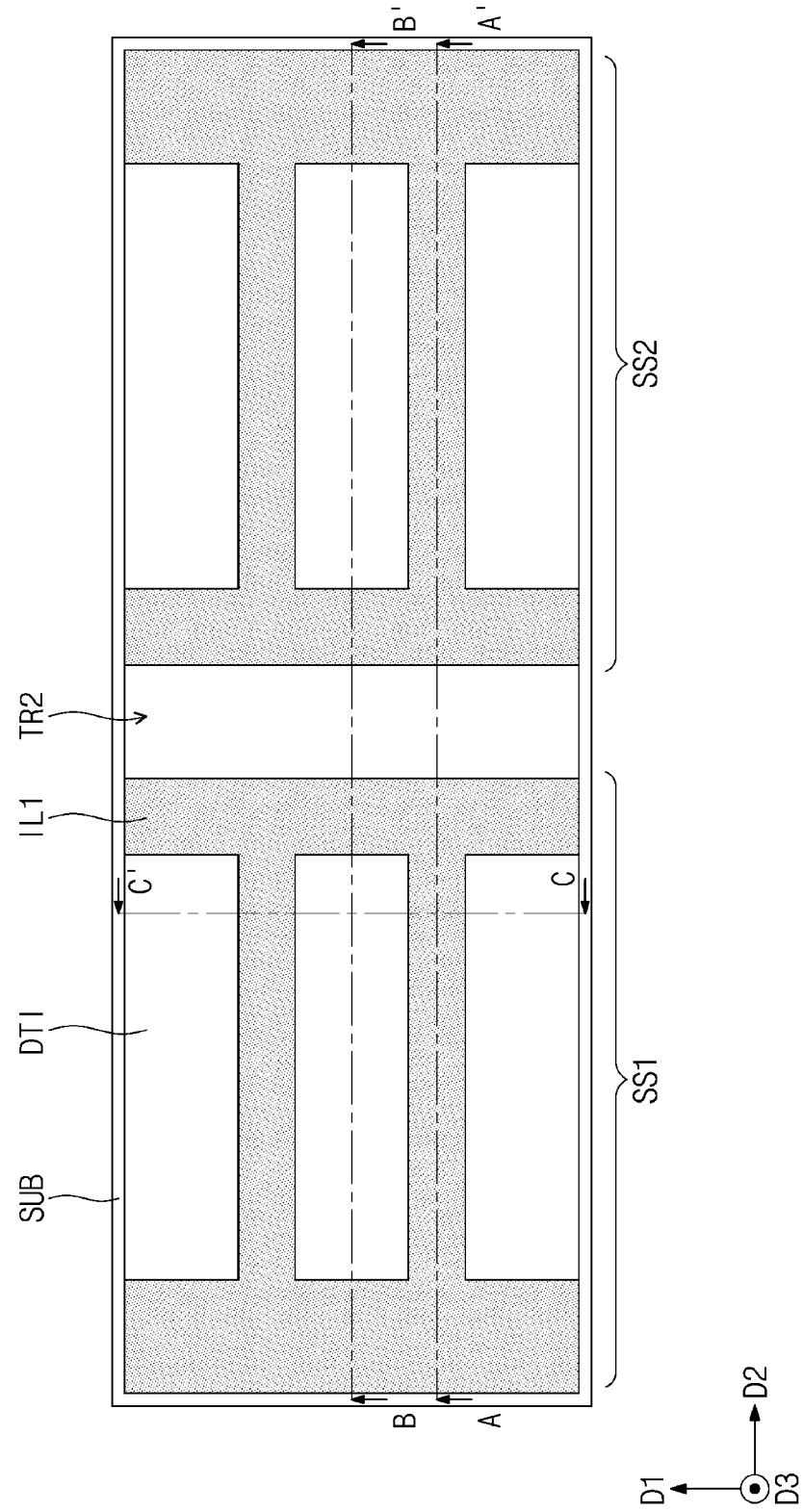
Figure 13B:
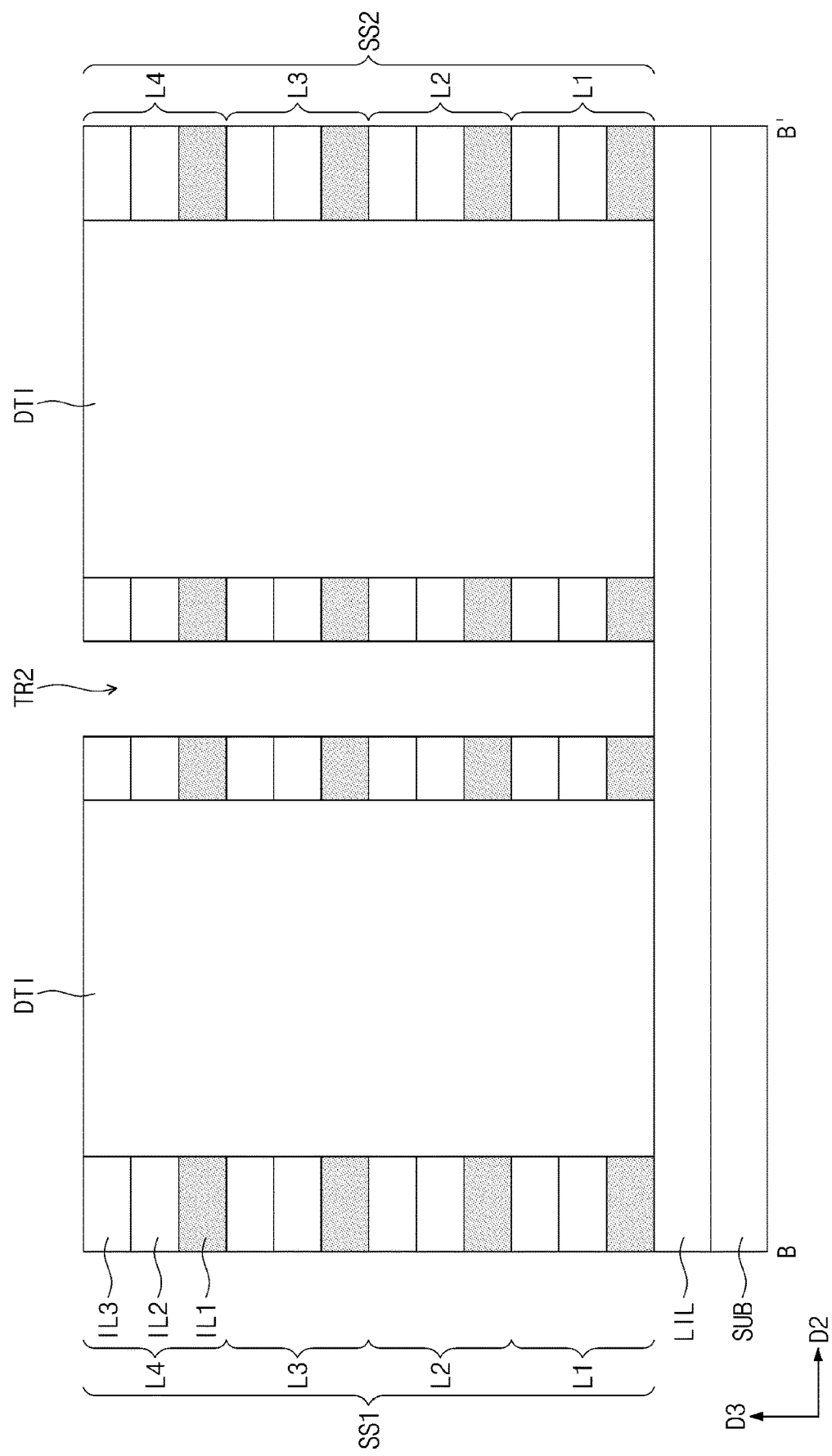
Figure 13C:
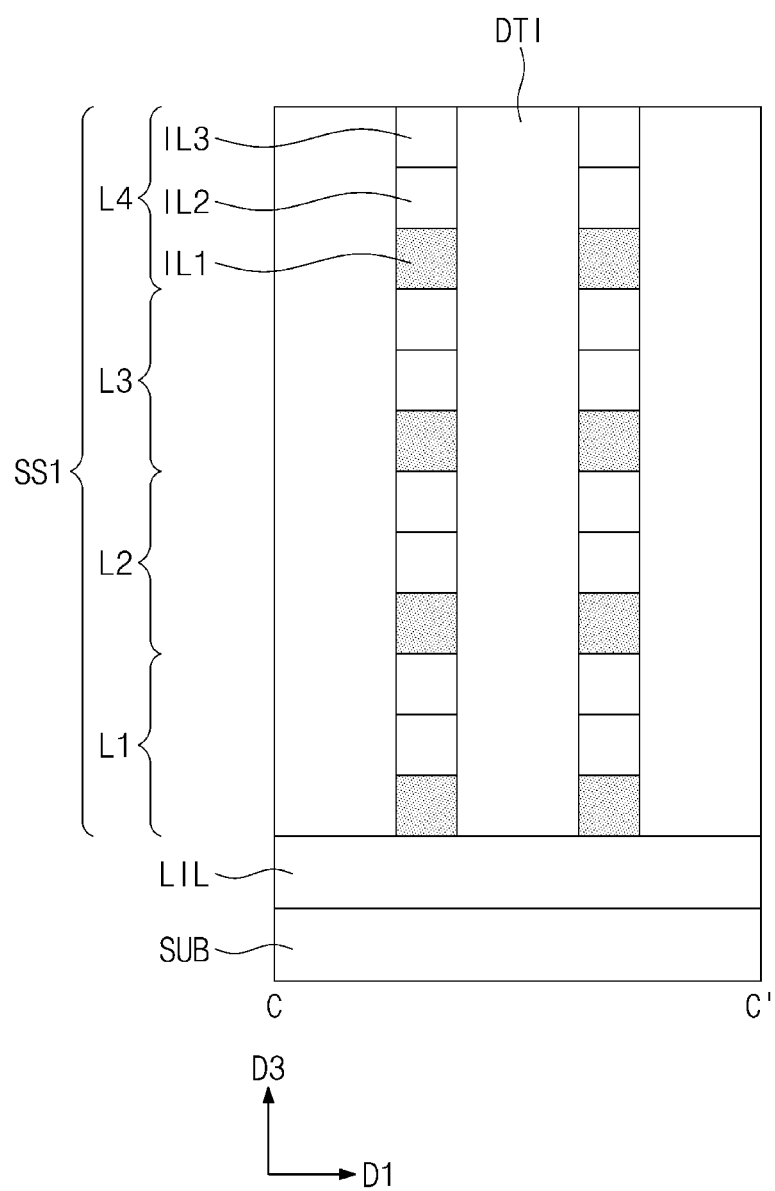
Figure 14:
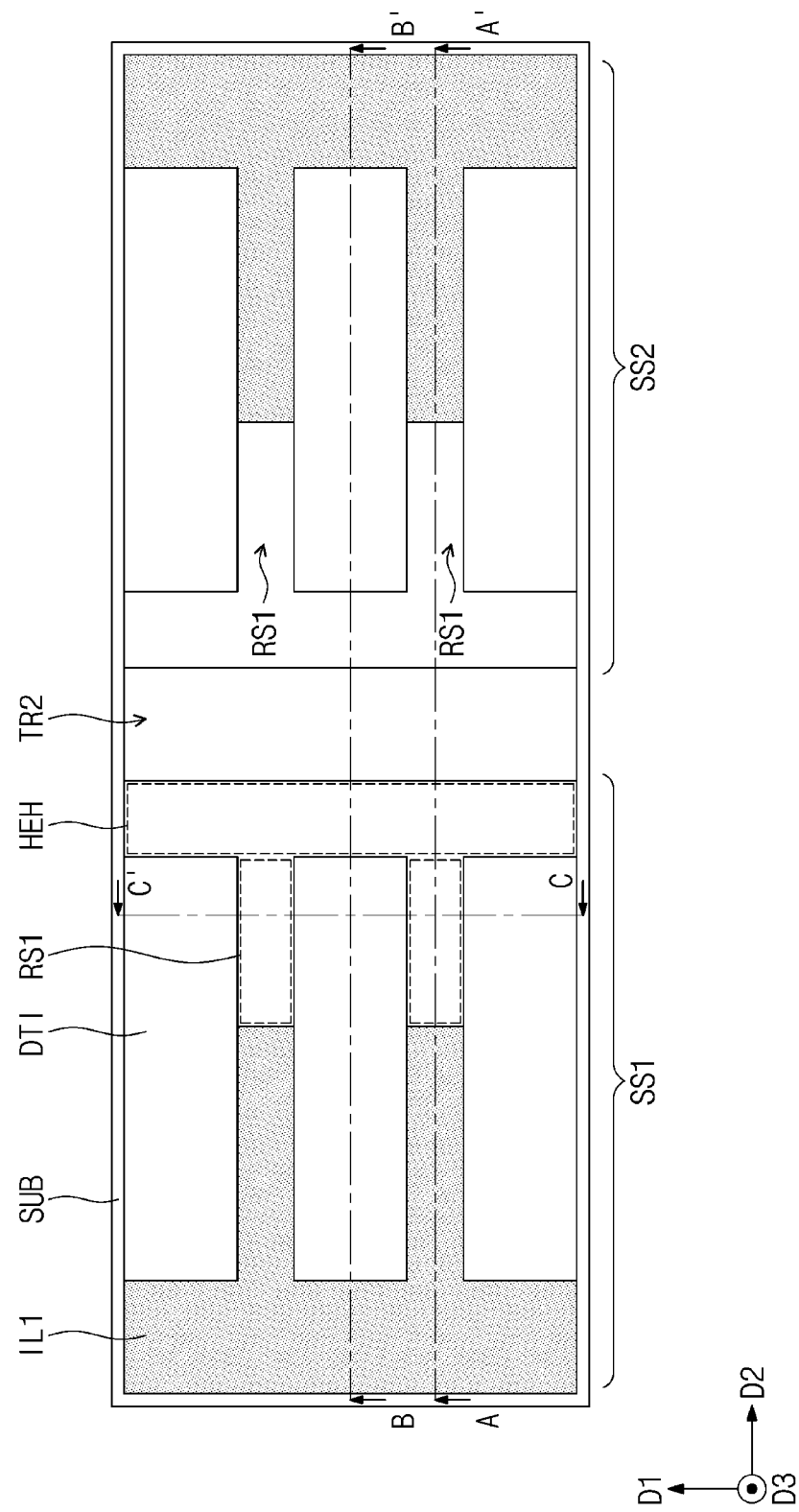
Figure 15A:
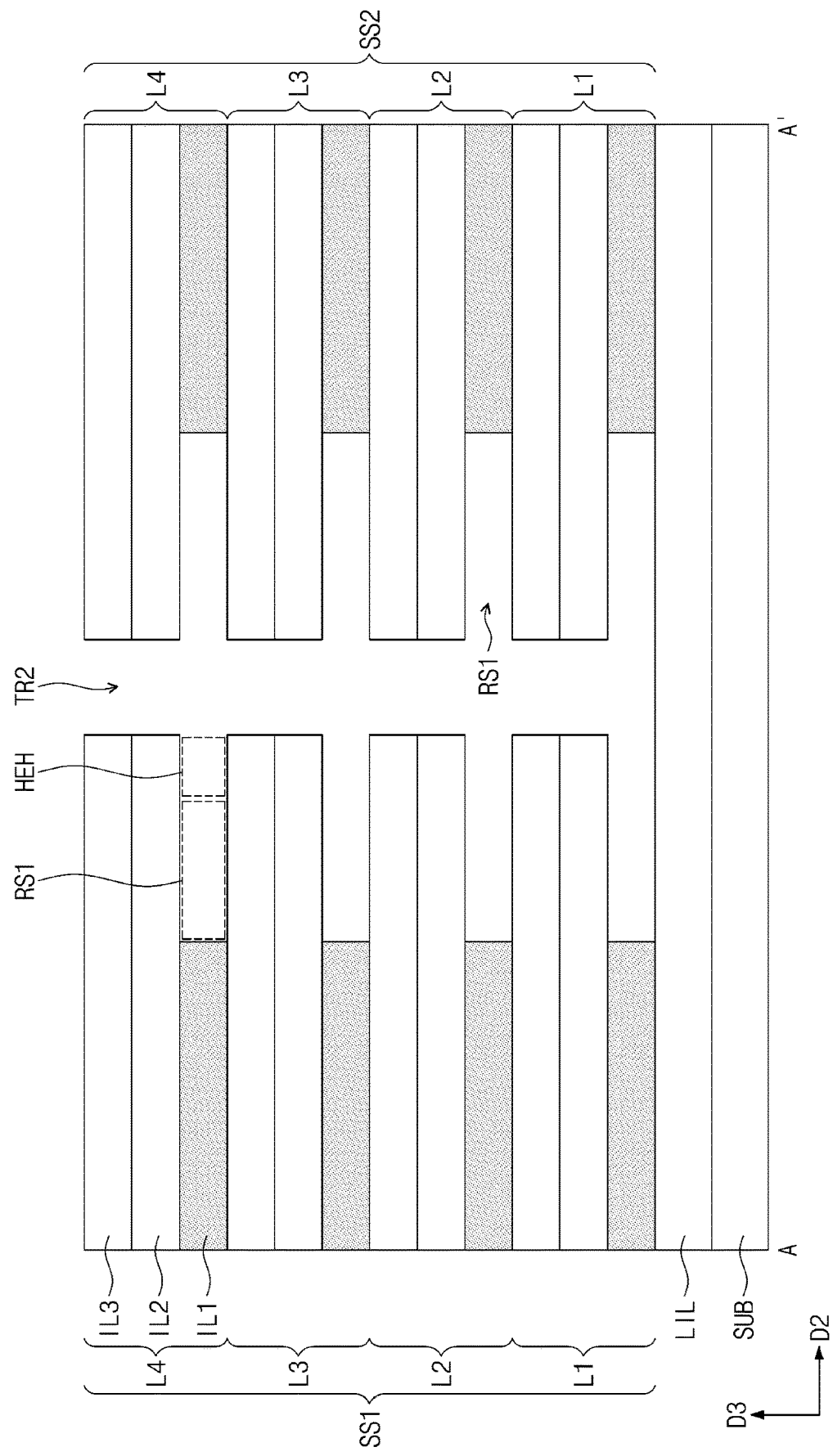
Figure 15B:
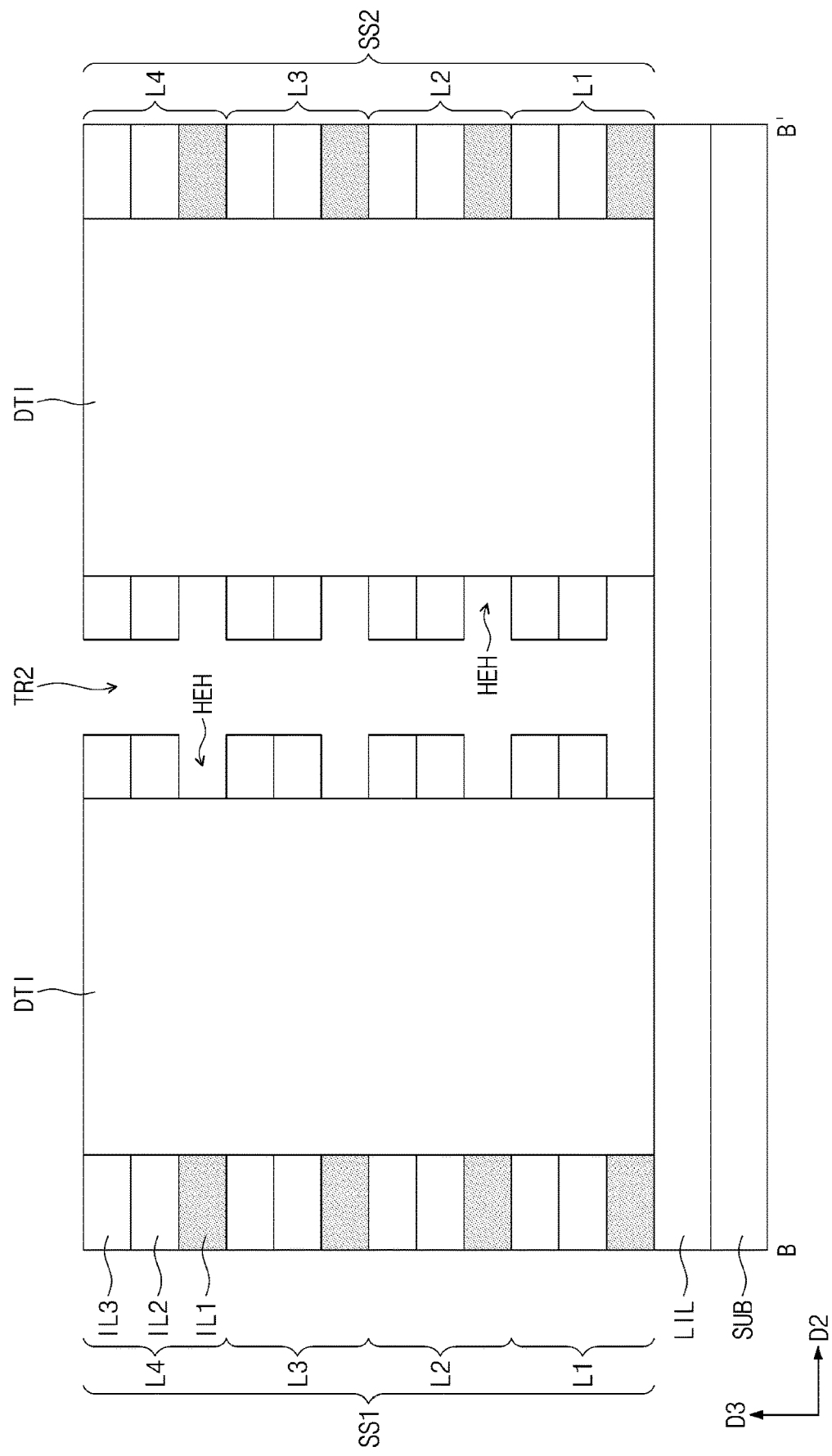
Figure 15C:
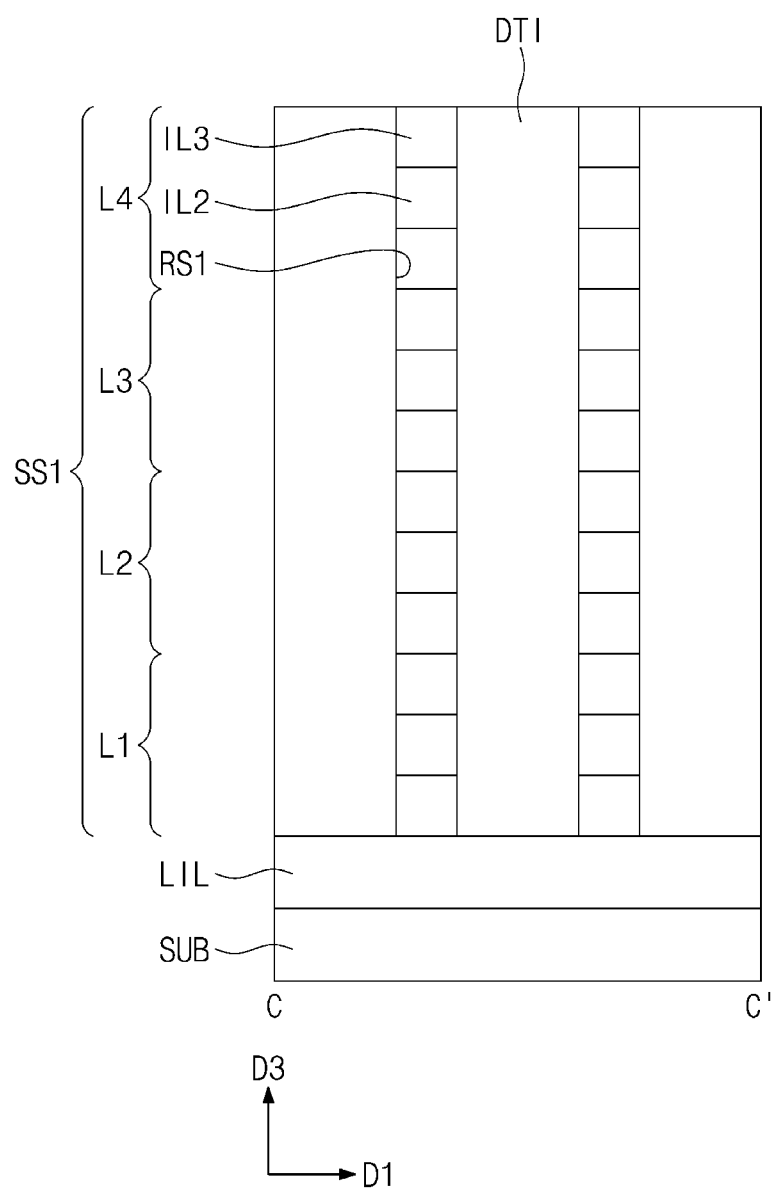
Figure 16:
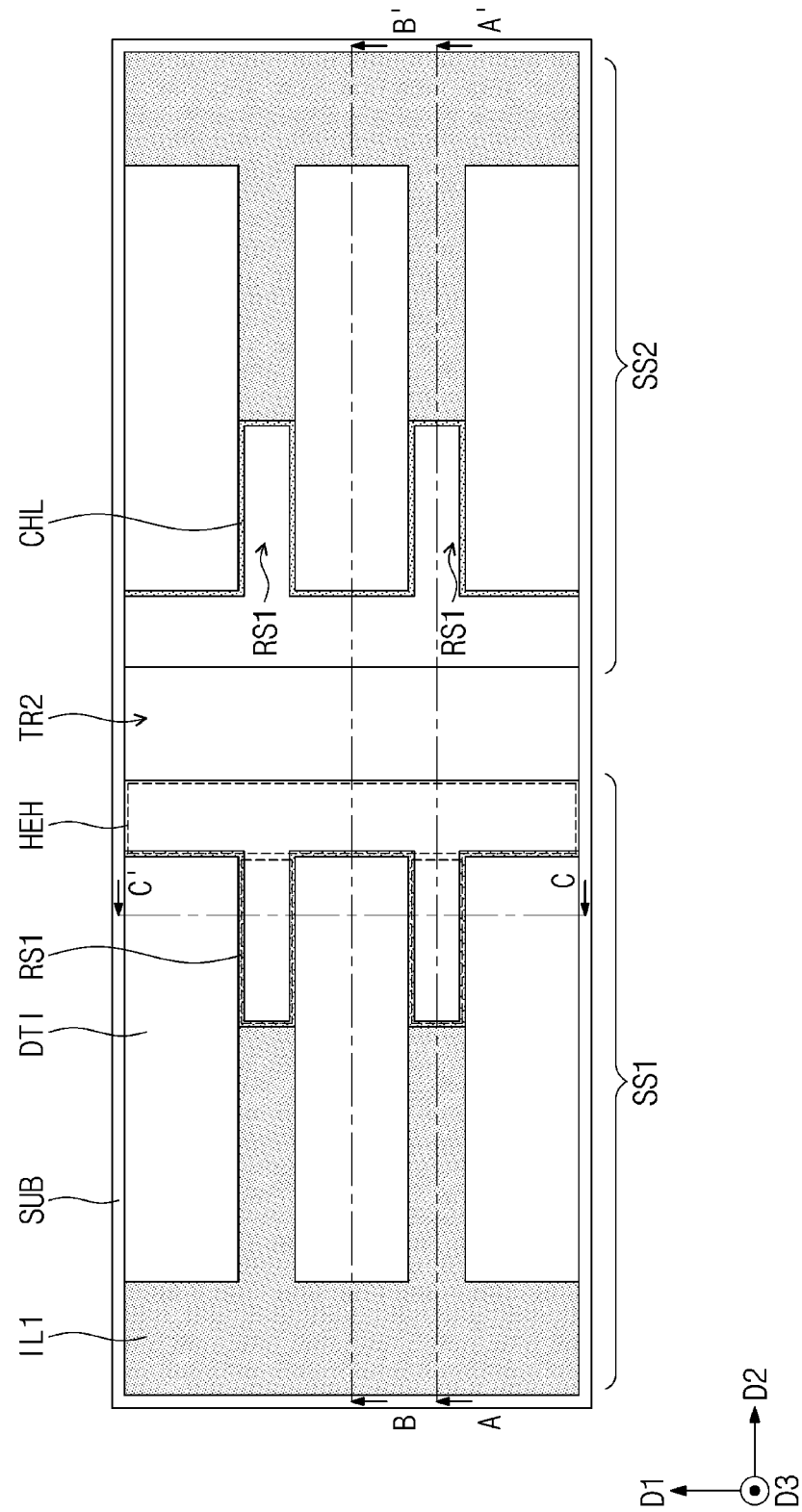
Figure 17A:
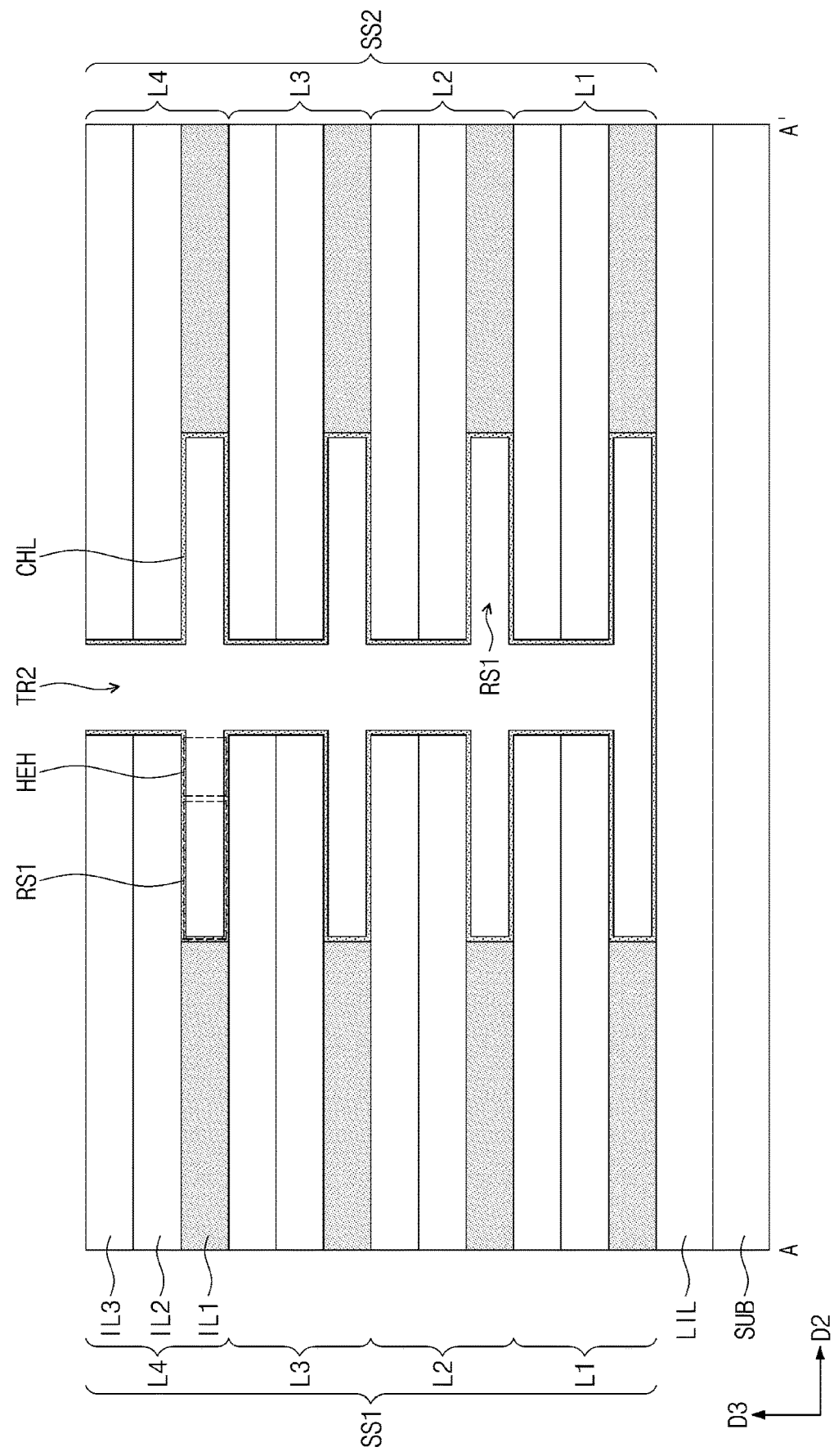
Figure 17B:
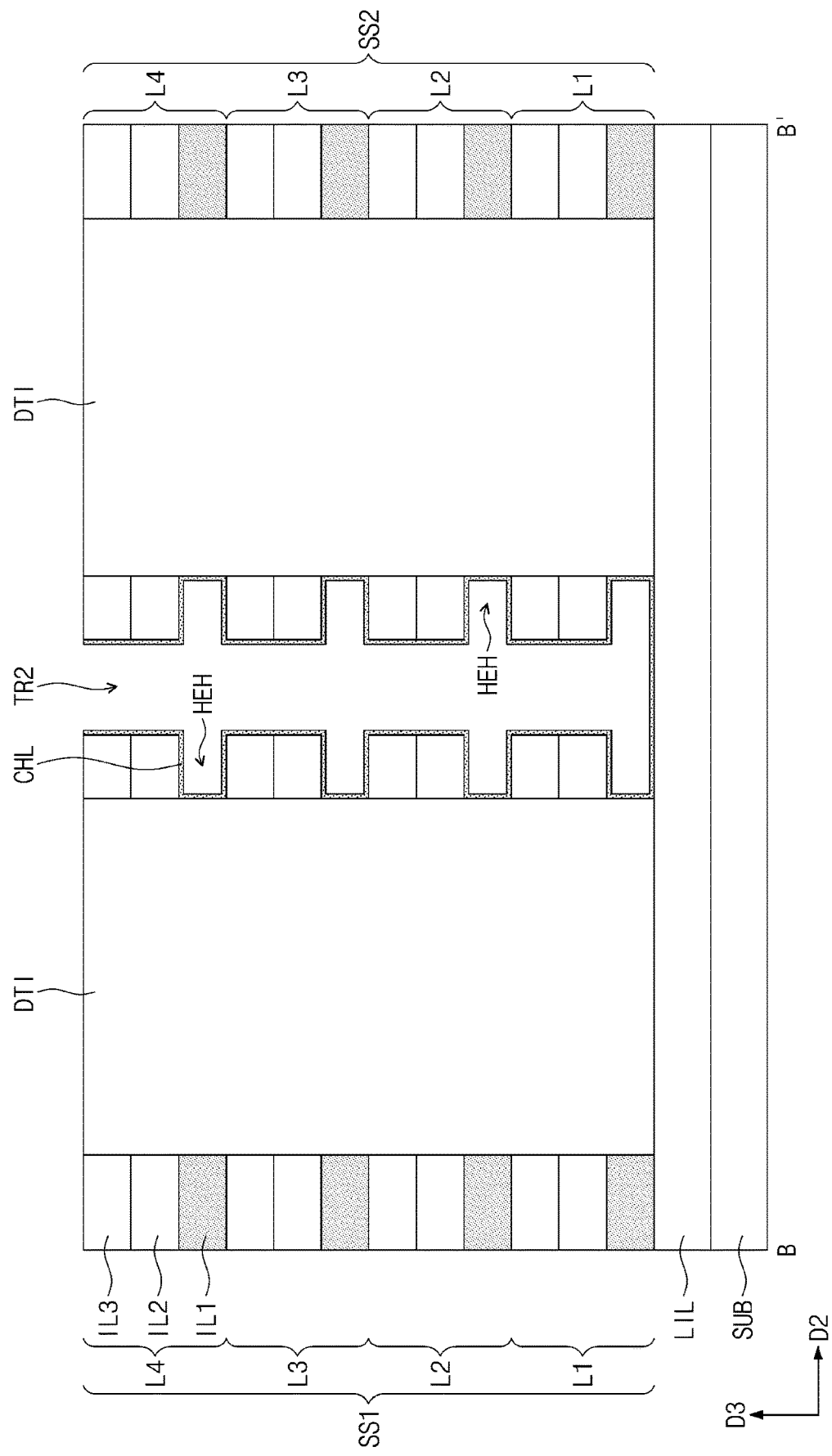
Figure 17C:
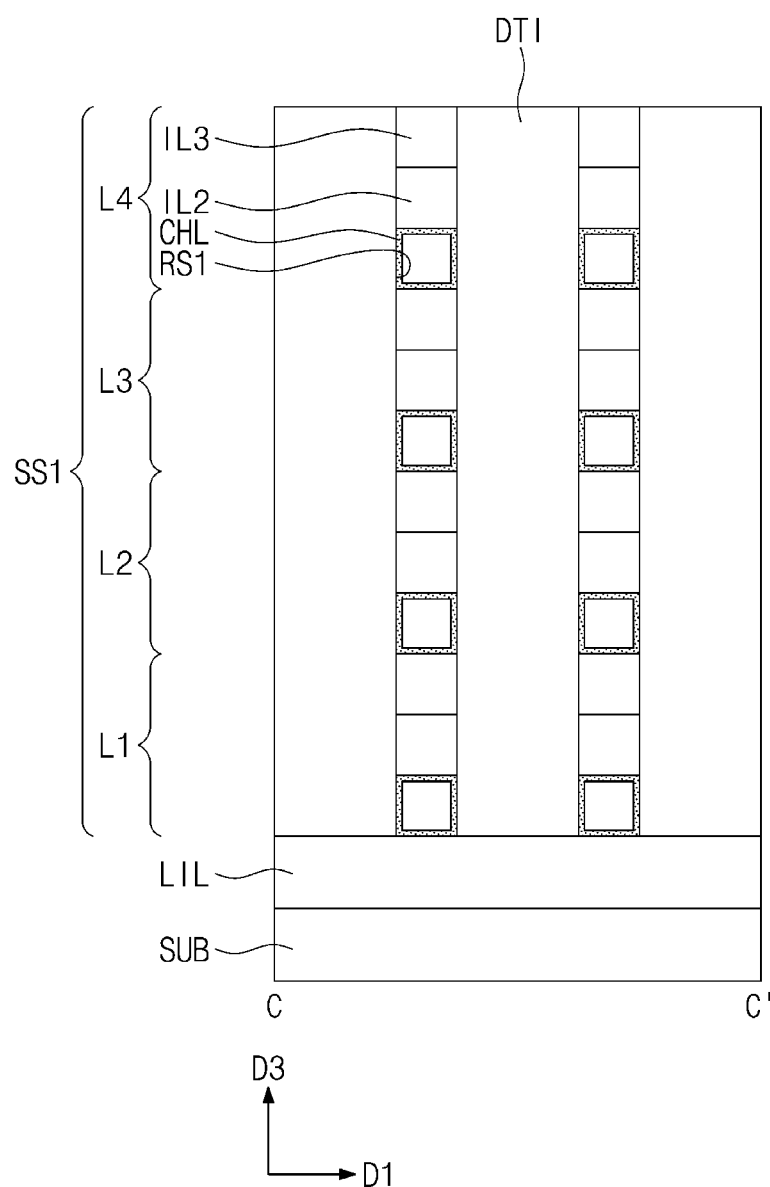
Figure 18:
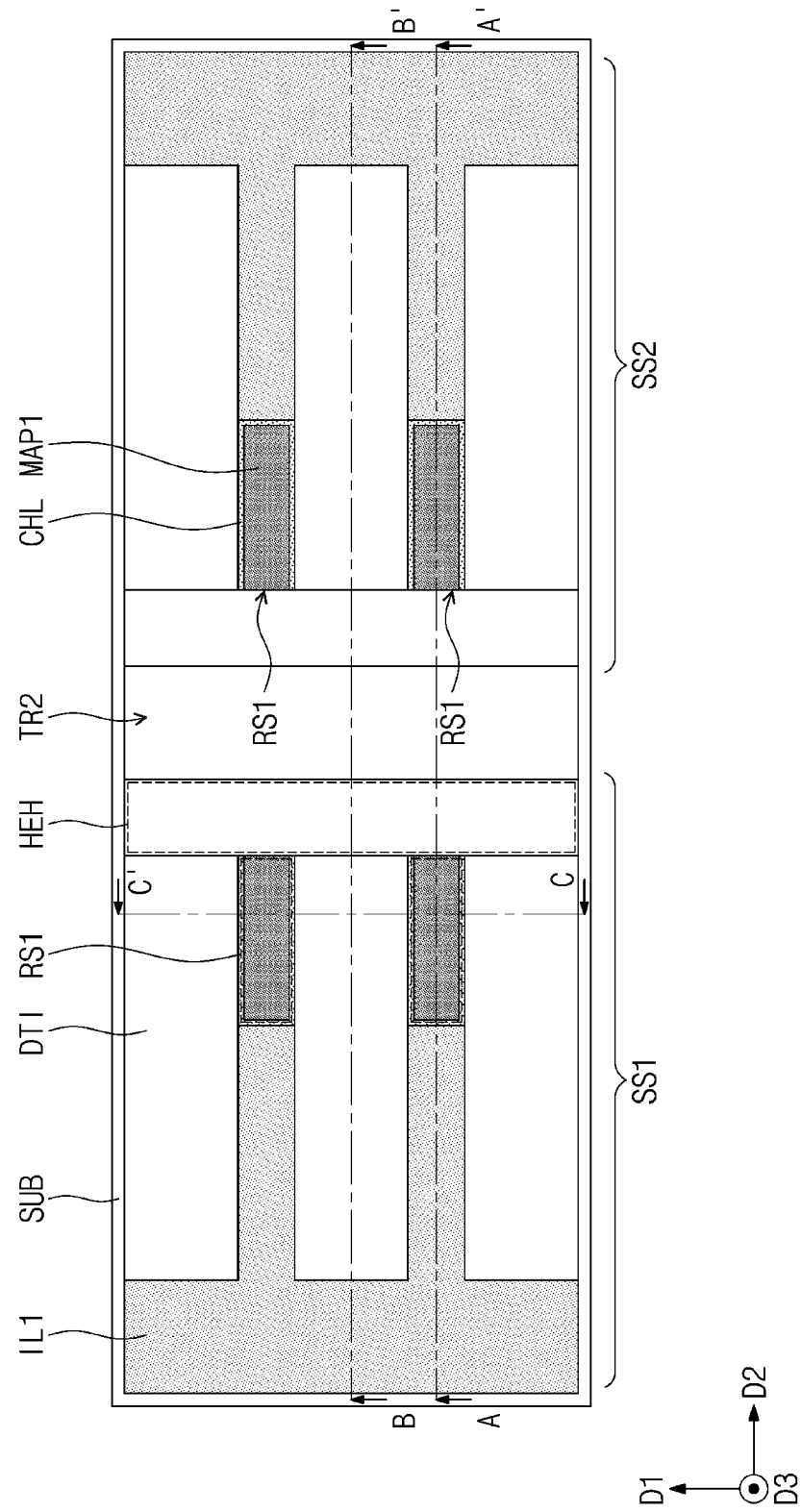
Figure 19C:
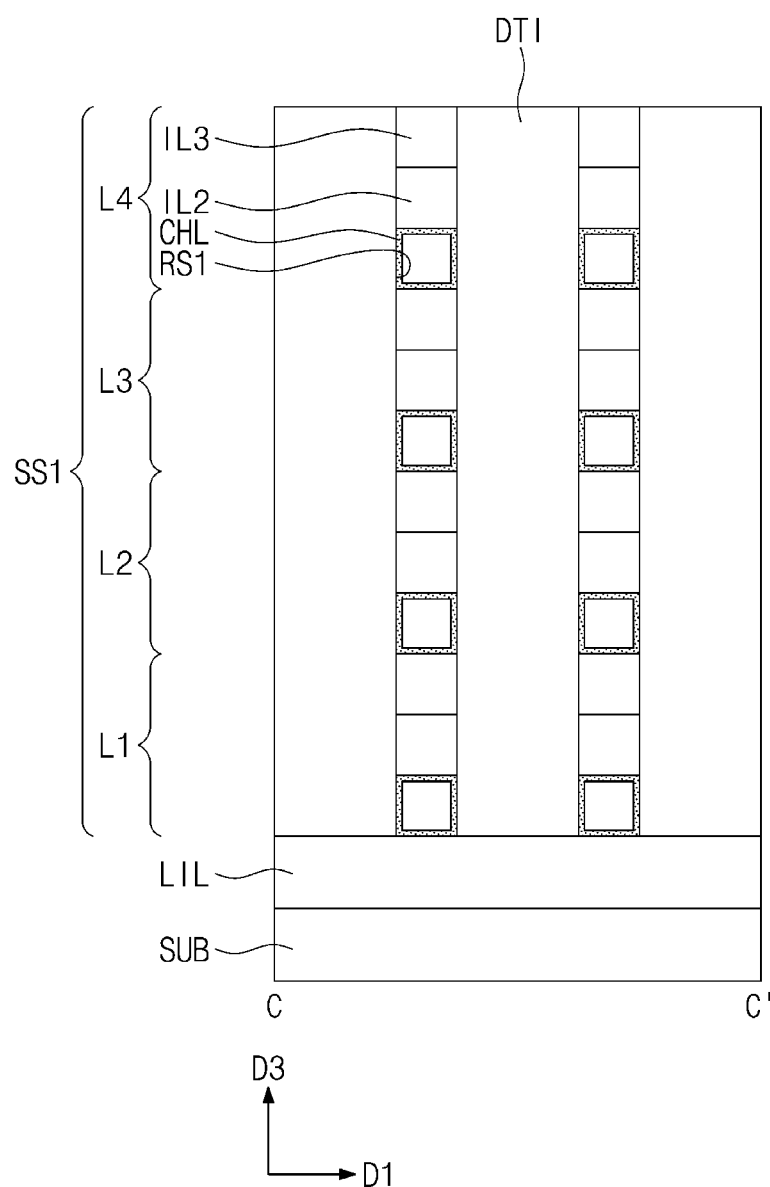
Figure 20:
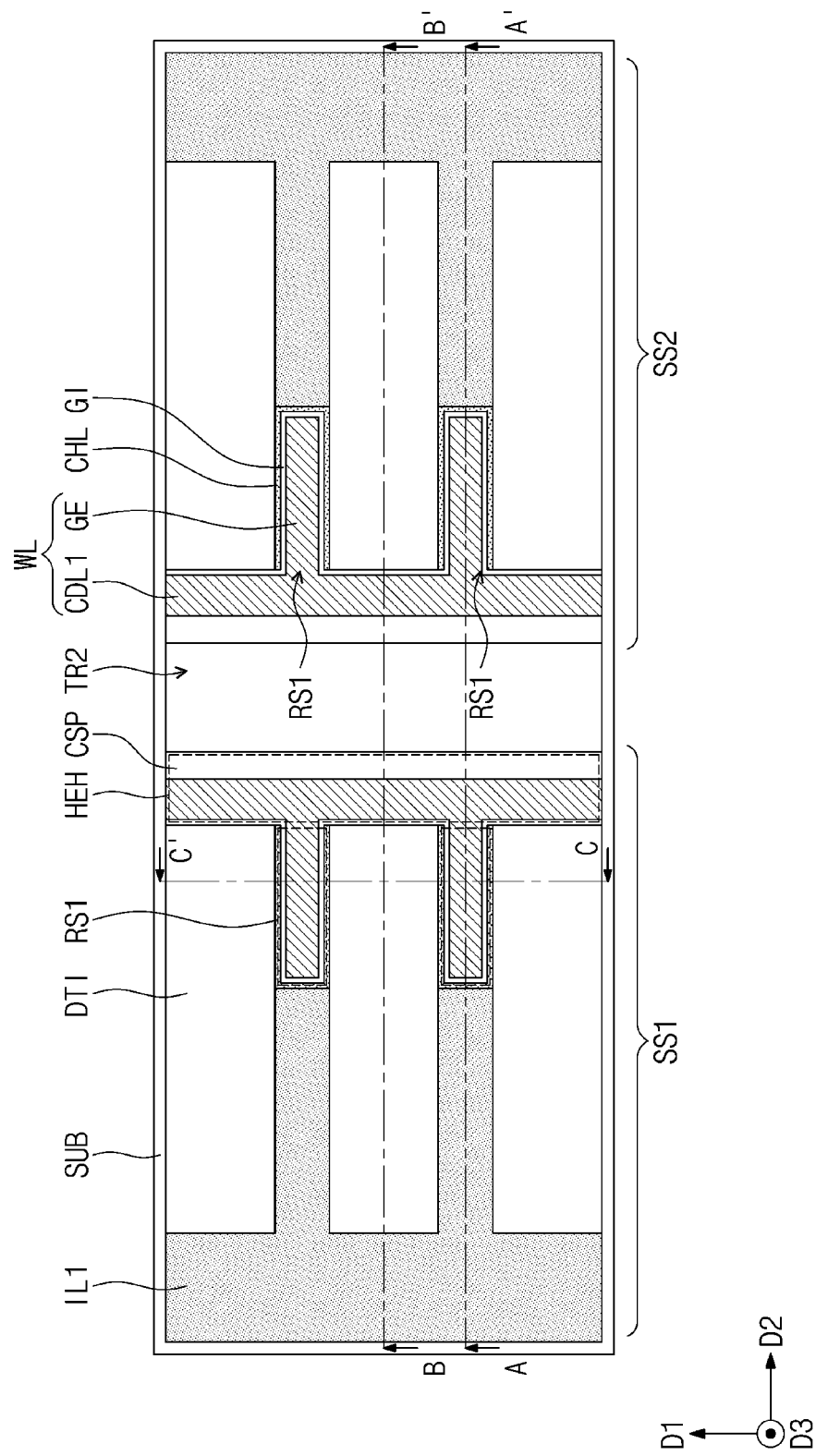

FIG. 8 illustrates a plan view showing a three-dimensional semiconductor memory device according to some embodiments of the present inventive concept. FIGS. 9A, 9B, 9C, 9D, and 9E illustrate cross-sectional views respectively taken along lines A-A', B-B', C-C', D-D', and E-E' of FIG. 8. In the embodiment that follows, a detailed description of technical features repetitive to those discussed above with reference to FIGS. 1 to 7 will be omitted, and a difference thereof will be explained in detail.

Referring to FIGS. 8 and 9A to 9E, a lower layer LIL may be provided on a substrate SUB. In some embodiments of the present inventive concept, the lower layer LIL may be a dielectric layer interposed between the substrate SUB and first and second stack structures SS1 and SS2. In some embodiments of the present inventive concept, the lower layer LIL may be the peripheral circuit layer PER discussed with reference to FIG. 5. The first and second stack structures SS1 and SS2 may be provided on the lower layer LIL. The first and second stack structures SS1 and SS2 may be adjacent to each other in the second direction D2.

Each of the first and second stack structures SS1 and SS2 may include first, second, third, and fourth layers L1, L2, L3, and L4 sequentially stacked on the substrate SUB. Each of the first to fourth layers L1 to L4 may include a word line WL, a channel layer CHL, a gate dielectric layer GI, a capping pattern CSP, a second dielectric layer 112, a connection part PRP of a bit line BE, and a third dielectric layer IL3. Each of the first to fourth layers L1 to L4 may further include a data storage element DS electrically connected to the channel layer CHL. The first to fourth layers L1 to L4 are example, and an additional layer or layers may be stacked on the fourth layer L4.

The word line WL, the channel layer CUL, the gate dielectric layer GI, the capping pattern CSP, and the data storage element DS may be provided at a bottom portion of a corresponding one of the first to fourth layers L1 to L4. For example, the word line WL, the channel layer CHL, the gate dielectric layer GI, the capping pattern CSP, and the data storage element DS may be provided below the second dielectric layer IL2. The connection part PRP of the bit line BL may be provided at the same level as that of the second dielectric layer IL2. For example, ends of the connection part PRP and the second dielectric layer IL2 may face each other. The third dielectric layer IL3 may be provided at a top portion of a corresponding one of the first to fourth layers L1 to L4. The third dielectric layer IL3 may cause the channel layer CHL at an upper layer to separate vertically (e.g., in the third direction D3) from the connection part PRP at a lower layer.

The bit line BL may extend in a vertical direction (e.g., the third direction D3) along a sidewall of a corresponding one of the first and second stack structures SS1 and SS2. The bit line BL may include a second conductive line CDL2 having a linear shape that extends in the third direction D3, and may also include a plurality of connection parts PRP that horizontally protrude from the second conductive line CDL2. The plurality of connection parts PRP may be integrally formed with the second conductive line CDL2.

The connection parts PRP of the bit line BL may extend into the first to fourth layers L1 to L4. Each of the connection parts PRP may extend toward the channel layer CHL in a direction parallel to the second direction D2. Each of the connection parts PRP may be in contact with at least a portion of the channel layer CHL that corresponds thereto, thereby being electrically connected to the corresponding channel layer CHL. For example, the connection part PRP may electrically connect the bit line BL and the channel layer CHL to each other.

The word line WL may include a first conductive line CDL1 that extends in the first direction D1 and a plurality of gate electrodes GE connected to the first conductive line CDL1. As discussed above with reference to FIGS. 2 and 3, the plurality of gate electrodes GE may have a comb shape connected to a sidewall of the first conductive line CDL1. The gate electrode GE may extend from the sidewall of the first conductive line CDL1 in a direction parallel to the second direction D2.

The capping pattern CSP may be interposed between the first conductive line CDL1 of the word line WL and the second conductive line CDL2 of the bit line BL. The capping pattern CSP may be in direct contact with the first conductive line CDL1 and the second conductive line CDL2. The capping pattern CSP may electrically insulate the first conductive line CDL1 and the second conductive line CDL2 from each other.

The channel layer CHL may surround a top surface TS, a bottom surface BS, opposite sidewalls SW, and an end EN1 of the gate electrode GE that corresponds to the channel layer CHL. For example, as discussed above, a memory cell transistor according to some embodiments of the present inventive concept may have a three-dimensional channel-all-around structure in which a channel surrounds a gate. As the memory cell transistor according to some embodiments of the inventive concept has the channel-all-around structure, the gate electrode GE may increase in channel controllability.

Each of the channel layers CHL may include a channel region, a source region, and a drain region. The source region (or drain region) of the channel layer CHL may be connected to the connection part PRP of the bit line BL. The drain region (or source region) of the channel layer CHL may be adjacent to the end EN1 of the gate electrode GE, For example, the drain region (or source region) of the channel layer CHL may be provided at an end EN2 of the channel layer CHL. The channel region of the channel layer CHL may be provided between the source region and the drain region.

The gate dielectric layer GI may be interposed between the channel layer CHL and the gate electrode GE. For example, the gate dielectric layer GI may be interposed between the end EN2 of the channel layer CHL and the end EN1 of the gate electrode GE. The gate dielectric layer GI may extend from a surface of the gate electrode GE to a surface of the first conductive line CDL1. The gate dielectric layer GI may electrically insulate the first conductive line CDL1 from the connection part PRP of the bit line BL.

The connection part PRP of the bit line may extend onto the channel layer CHL and may directly contact the channel layer CHL. The connection part PRP may be in partial contact with a top surface of the channel layer CHL. As a result, the bit line BL may be electrically insulated from the source region (or drain region) of the channel layer CHL.

A plurality of vertical insulators DTI may be provided to penetrate each of the first and second stack structures SS1 and SS2. Each of the vertical insulators DTI may extend in the second direction D2. The vertical insulators DTI may be arranged along the first direction D1. The vertical insulator DTT may serve as a device isolation layer that separates the channel layers CHL that are adjacent to each other in the first direction D1. In other words, the vertical insulator DTI is disposed between the channel layers CHL that are adjacent to each other in the first direction D1. The vertical insulator DTI may include at least one selected from a silicon oxide layer, a silicon nitride layer, a silicon oxynitride layer, a carbon-containing silicon oxide layer, a carbon-containing silicon nitride layer, and a carbon-containing silicon oxynitride layer.

Each of the data storage elements DS may include a first electrode EL1, a dielectric layer DL, and a second electrode EL2. The data storage elements DS of one of the first and second stack structures SS1 and SS2 may share one dielectric layer DL and one second electrode EL2. For example, for one of the first and second stack structures SS1 and SS2, the first electrode EL1 may be provided in plural, and ca one dielectric layer DL may cover surfaces of the plurality of first electrodes EL1. One second electrode EL2 may be provided on one dielectric layer DL.

The data storage element DS according to some embodiments of the inventive concept may have the capacitor structure discussed above with reference to FIG. 4A. For example, the first electrode EL2 may have a hollow cylindrical shape. The second electrode EL2 may be inserted into an internal space of the first electrode EL1. The present inventive concept, however, is not limited thereto, and the data storage element D may have the same structure as that discussed above with reference to FIG. 4B or 4C.

The first electrodes EL1 in a single layer may be arranged in the first direction D1. The first electrode EL1 may be connected to the end EN2 of the channel layer CHL. For example, the first electrode EL1 may be connected to the drain region (or source region) of the channel layer CHL. The second electrodes EL2 may be connected in common to a plate PLT.

A separation insulator ISS may be interposed between the first and second stack structures SS1 and SS2 The separation insulator ISS may extend in the first direction D1 between the first and second stack structures SS1 and SS2 that are adjacent to each other. The second conductive line CDL2 of each of the bit lines BL may penetrate the separation insulator ISS. The separation insulator ISS may electrically insulate the second conductive lines CDL2 from each other. The separation insulator ISS may include at least one selected from a silicon oxide layer, a silicon nitride layer, and a silicon oxynitride layer.

FIGS. 10, 12, 14, 16, 18, 20, 22, 24, and 26 illustrate plan views showing a method of fabricating a three-dimensional semiconductor memory device according to some embodiments of the present inventive concept. FIGS. 11A, 13A, 15A, 17A, 19A, 21A, 23A, 25A, and 27A illustrate cross-sectional views taken along line A-A' of FIGS. 10, 12, 14, 16, 18, 20, 22, 24, and 26, respectively. FIGS. 11B, 13B, 15B, 17B, 19B, 21B, 23B, 25B, and 27B illustrate cross-sectional views taken along line B-B' of FIGS. 10, 12, 14, 16, 18, 20, 22, 24, and 26, respectively. FIGS. 11C, 13C, 15C, 17C, 19C, 21C, 23C, 25C, and 27C illustrate cross-sectional views taken along line C-C' of FIGS. 10, 12, 14, 16, 18, 20, 22, 24, and 26, respectively.

Referring to FIGS. 10 and 11A to 11C, a lower layer LIL may be formed on a substrate SUB. In some embodiments of the present inventive concept, the lower layer. LIL may be a dielectric layer that is formed on the substrate SUB. In some embodiments of the present inventive concept, the lower layer LIL may include the peripheral circuit layer PER discussed with reference to FIG. 5.

A stack structure SS may be formed on the lower layer LIL. The formation of the stack structure SS may include sequentially stacking first, second, third, and fourth layers L1, L2, L3, and L4. For example, the formation of each of the first to fourth layers L1 to L4 may include forming a first dielectric layer IL1, forming a second dielectric layer IL2 on the first dielectric layer IL1, and forming a third dielectric layer IL3 on the second dielectric layer IL2. For example, each of the first to fourth layers L1 to L4 may include a first dielectric layer IL1, a second dielectric layer IL2, and a third dielectric layer IL3 that are sequentially stacked.

The first to third dielectric layers IL1 to IL3 may independently include at least one selected from a silicon oxide layer, a silicon nitride layer, a silicon oxynitride layer, a carbon-containing silicon oxide layer, a carbon-containing silicon nitride layer, a carbon-containing silicon oxynitride layer, and a polysilicon layer. The first to third dielectric layers IL1 to IL3 may include different materials from each other. The first to third dielectric layers IL1 to IL3 may have materials whose etch selectivity are different from each other. For example, one of the first to third dielectric layers IL1 to IL3 may include a silicon oxide layer, another of the first to third dielectric layers IL1 to IL3 may include a silicon nitride layer, and still another of the first to third dielectric layers IL1 to IL3 may include a carbon-containing silicon nitride layer. Alternatively, the still another of the first to third dielectric layers IL1 to IL3 may include a polysilicon layer.

The stack structure SS may be patterned to form first trenches TR1 that penetrate the stack structure SS. The first trenches TR1 may expose a top surface of the lower layer LIL. The first trenches TR1 may each have a bar shape that extends in a second direction D2. The first trenches TR1 may be arranged at a regular pitch along a first direction D1.

The first trenches TR1 may be filled with a dielectric material to form vertical insulators DTI in corresponding first trenches TR1. The vertical insulators DTI may define device regions ACR on the stack structure SS. For example, the device region ACR may be defined between a pair of vertical insulators DTI that are adjacent to each other in the first direction D1 (see FIG. 10). Each of the active regions ACR may have a linear shape that extends in the second direction D2. The vertical insulators DTI may separate the device regions ACR from each other.

The vertical insulator DTI may include at least one selected from a silicon oxide layer, a silicon nitride layer, a silicon oxynitride layer, a carbon-containing silicon oxide layer, a carbon-containing silicon nitride layer, and a carbon-containing silicon oxynitride layer. The vertical insulator DTI may include a material having an etch selectivity with respect to the first to third dielectric layers IL1 to IL3.

Referring to FIGS. 12 and 13A to 13C, the stack structure SS may be patterned to form a second trench TR2 that extends in the first direction D1. The second trench TR2 may expose a top surface of the substrate SUB. The second trench TR2 may divide the stack structure SS into a first stack structure SS1 and a second stack structure SS2 that are separated from each other in the second direction D2. The second trench TR2 may expose the first to third dielectric layers IL1 to IL3 of each of the first and second stack structures SS1 and SS2.

Referring to FIGS. 14 and 15A to 15C, the first dielectric layers IL1 exposed to the second trench TR2 may be partially etched. For example, a wet etching process may be performed to selectively etch the first dielectric layers IL1 exposed to the second trench TR2. The second and third dielectric layers IL2 and IL3 and the vertical insulators DTI may remain intact during the wet etching process.

The first dielectric layers IL1 may be partially removed to form a horizontal extension hole HEH and first recesses RS1 at each of the first to fourth layers L1 to L4. The horizontal extension hole HEH may extend in the first direction D1 between the third dielectric layer IL3 and the second dielectric layer IL2. The horizontal extension hole HEH may expose sidewalls of the vertical insulators DTI.

The first recesses RS1 may extend from the horizontal extension hole HEH in a direction parallel to the second direction D2. Each of the first recesses RS1 may be formed by removing a portion of the device region ACR. The first recess RS1 may extend a pair of neighboring vertical insulators DTI. The horizontal extension hole HEH and the first recesses RS1 extending therefrom may each have a comb shape. In each of the first recesses RS1 and the horizontal extension holes HEH, a surface of the second dielectric layer IL2 of one of the first to fourth layers L1 to L4 and a surface of third dielectric layer IL3 of another one of the first to fourth layers L1 to L4 may be exposed.

Referring to FIGS. 16 and 17A to 17C, a channel layer CHL may be conformally formed through the second trench TR2 in the horizontal extension hole HEH and the first recesses RS1. The channel layer CHL may be formed by using chemical vapor deposition (CVD) or atomic layer deposition (ALD). The channel layer CHL may be tamed to have a thickness that is relatively small that is not sufficiently enough to completely fill the horizontal extension hole HEH and the first recesses RS1.

The channel layer CHL may include any semiconductor material that not only can be formed by deposition but also can serve as a channel of a memory cell transistor. In some embodiments of the present inventive concept, the channel layer CHL may include an amorphous oxide semiconductor, such as indium-gallium-zinc oxide (IGZO) or indium-tin-zinc oxide (ITZO), In some embodiments of the present inventive concept, the channel layer CHL may include a two-dimensional semiconductor, such as metal, chalcogenide, graphene, or phosphorene.

Referring to FIGS. 18 and 19A to 19C, first mask patterns MAP1 may be formed on corresponding first recesses RS1. The first mask pattern MAP1 may be formed to selectively fill the first recess RS1 except the horizontal extension hole HEH. In other words, the areas corresponding to the horizontal extension holes HEH are not provided with the first mask patterns MAP1.

For example, the formation of the first mask patterns MAP1 may include using the second trench TR2 to form a first mask layer that fills the first recesses RS1 and the horizontal extension hole HEH, and using the horizontal extension hole HEH to wet-etch the first mask layer until the sidewall of the vertical insulator DTI is exposed.

The first mask patterns MAP1 may be used as an etching mask to etch the channel layer CHL, and thus the channel layers CHL may remain in the first recesses RS1. For example, a plurality of channel layers CHL may be formed which are separated from the channel layer CHL. The vertical insulators DTI may separate the channel layers CHL from each other.

Referring to FIGS. 20 and 21A to 21C, the first mask patterns MAP1 may all be removed, and only the channel layer CHL may remain in the first recess RS1. A gate dielectric layer GI and a word line WL may be formed in the first recesses RS1 and the horizontal extension hole HEH.

For example, the second trench TR2 may be used to conformally deposit the gate dielectric layer GI. The second trench TR2 may be used to deposit a first metal layer on the gate dielectric layer GI. The first metal layer may be formed to completely fill the first recesses RS1 and the horizontal extension hole HEH. Afterwards, the first metal layer and the gate dielectric layer GI that are formed in the second trench TR2 may be removed to form the gate dielectric layer GI and a word line WL in the first recesses RS1 and the horizontal extension hole HEH. The word line WL may include a first conductive line CDL1 formed in the horizontal extension hole HEH, and may also include gate electrodes GE formed in the first recesses RS1.

The first conductive line CDL1 may be partially removed to form a capping pattern CSP in an area from which the first conductive line CDL1 is removed. The capping pattern CSP may be formed to extend in the first direction D1 together with the first conductive line CDL1, while covering a sidewall of the first conductive line CDL1.

Figure 21A:
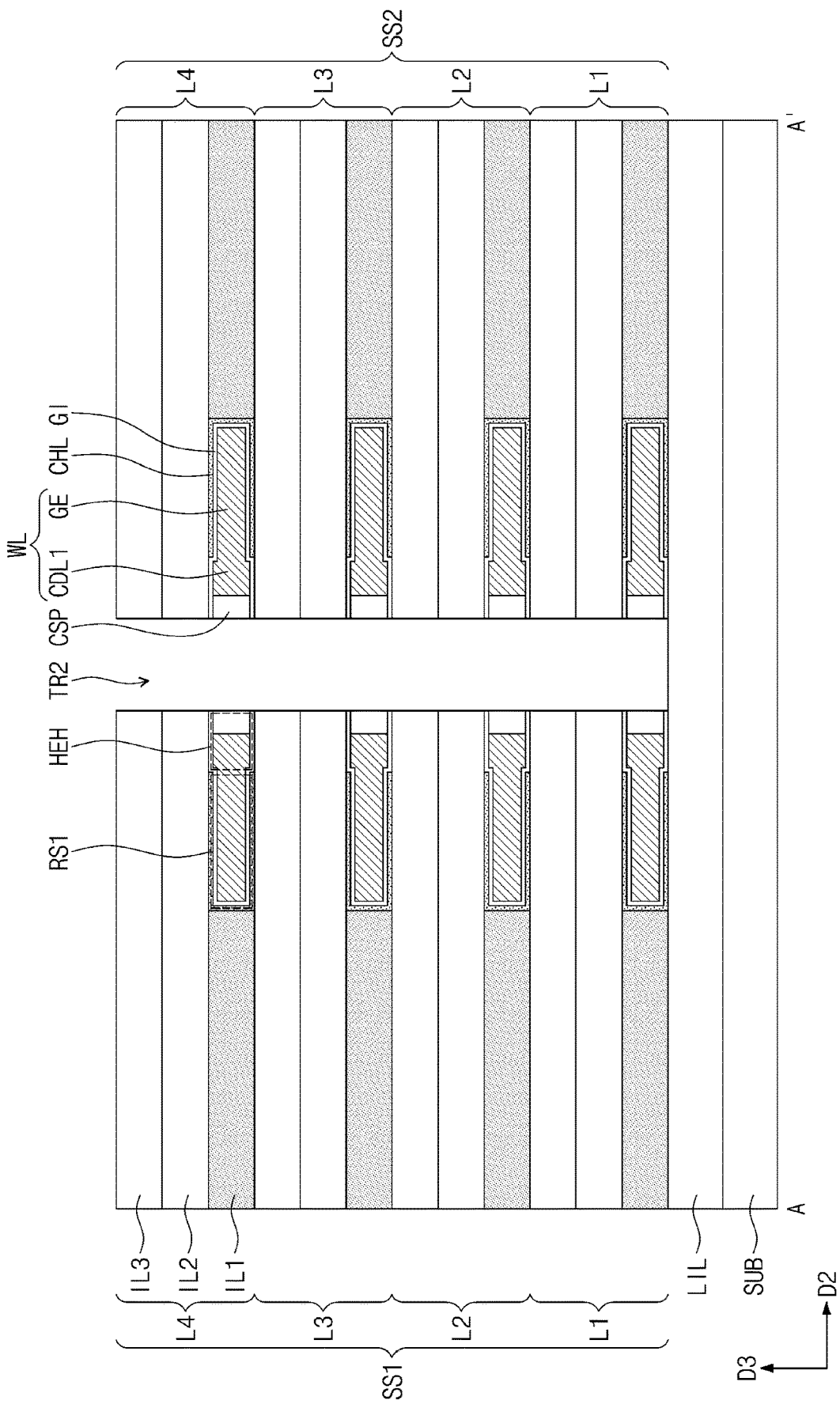
Figure 21B:
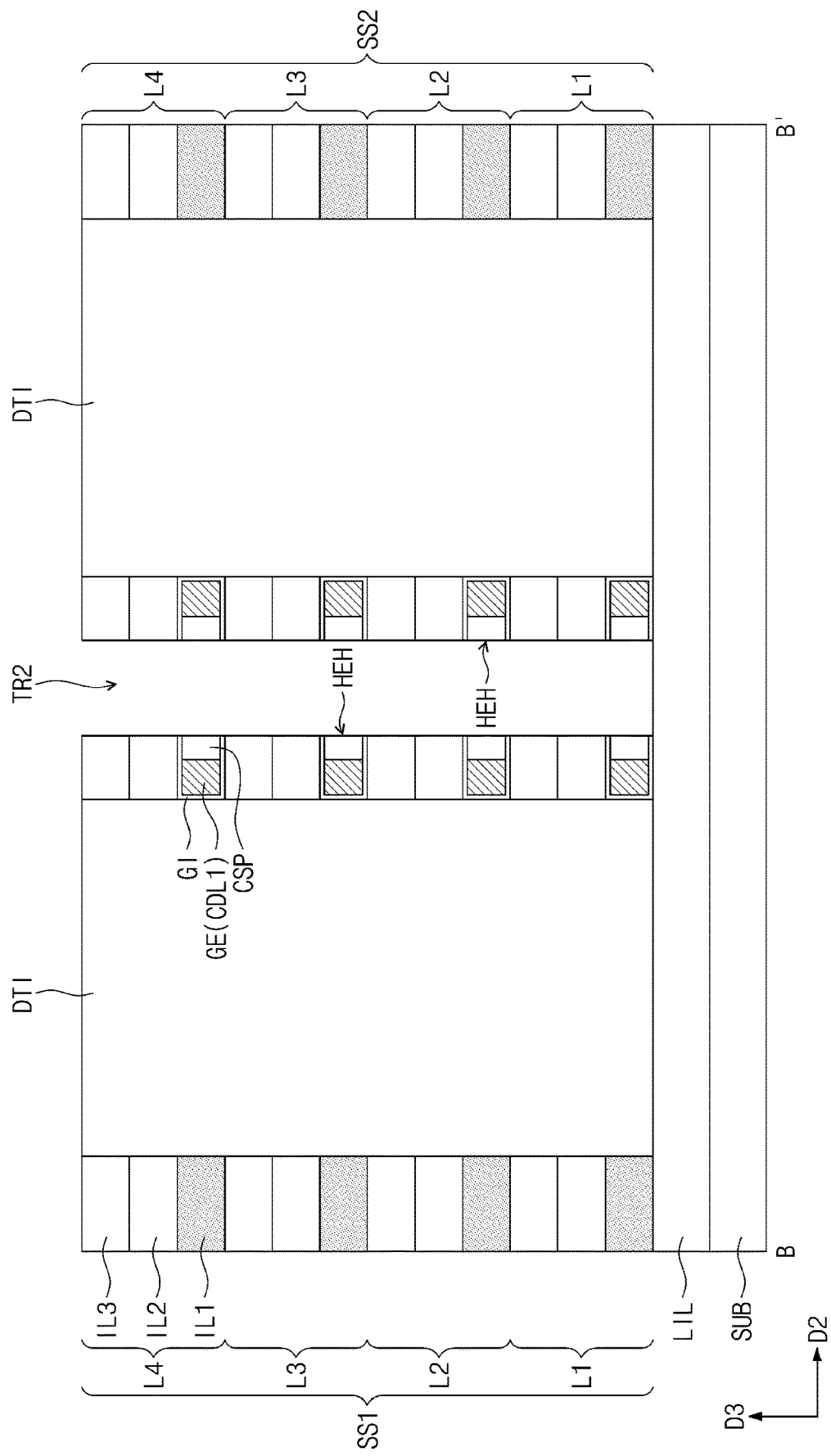
Figure 21C:
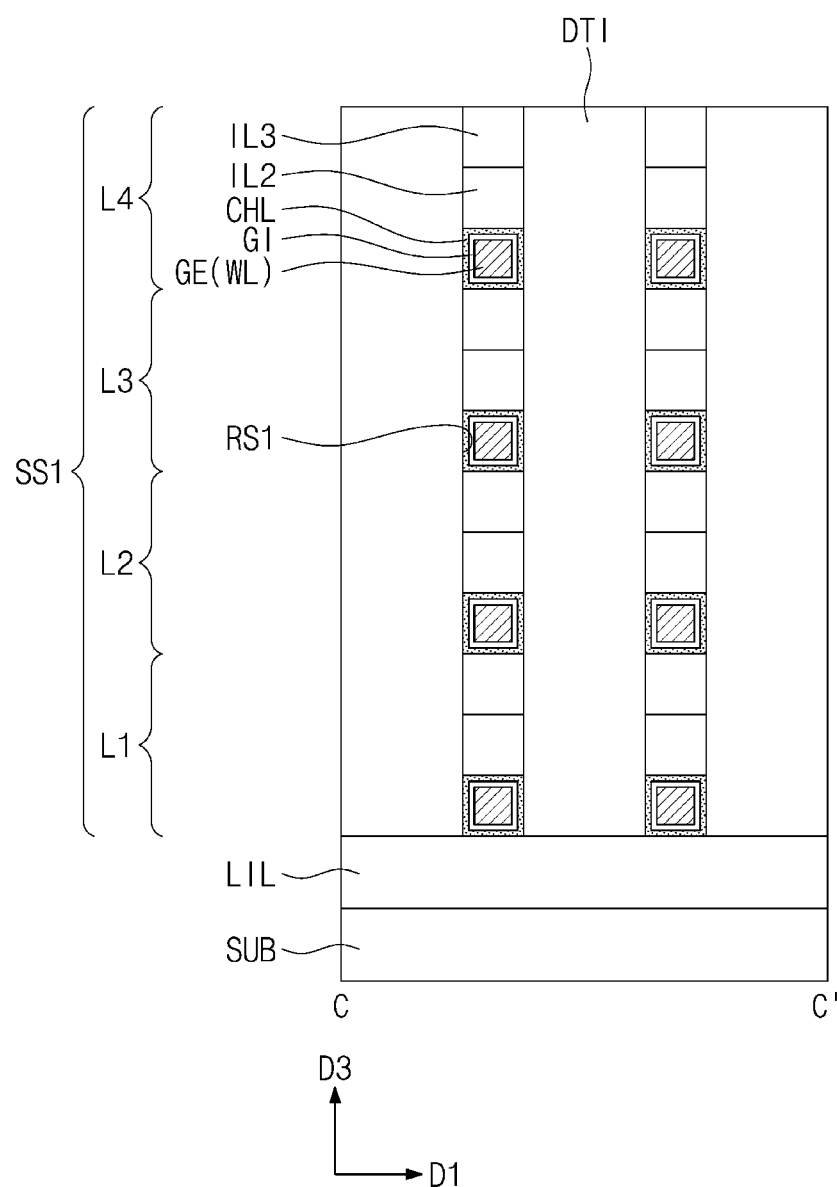
Figure 22:
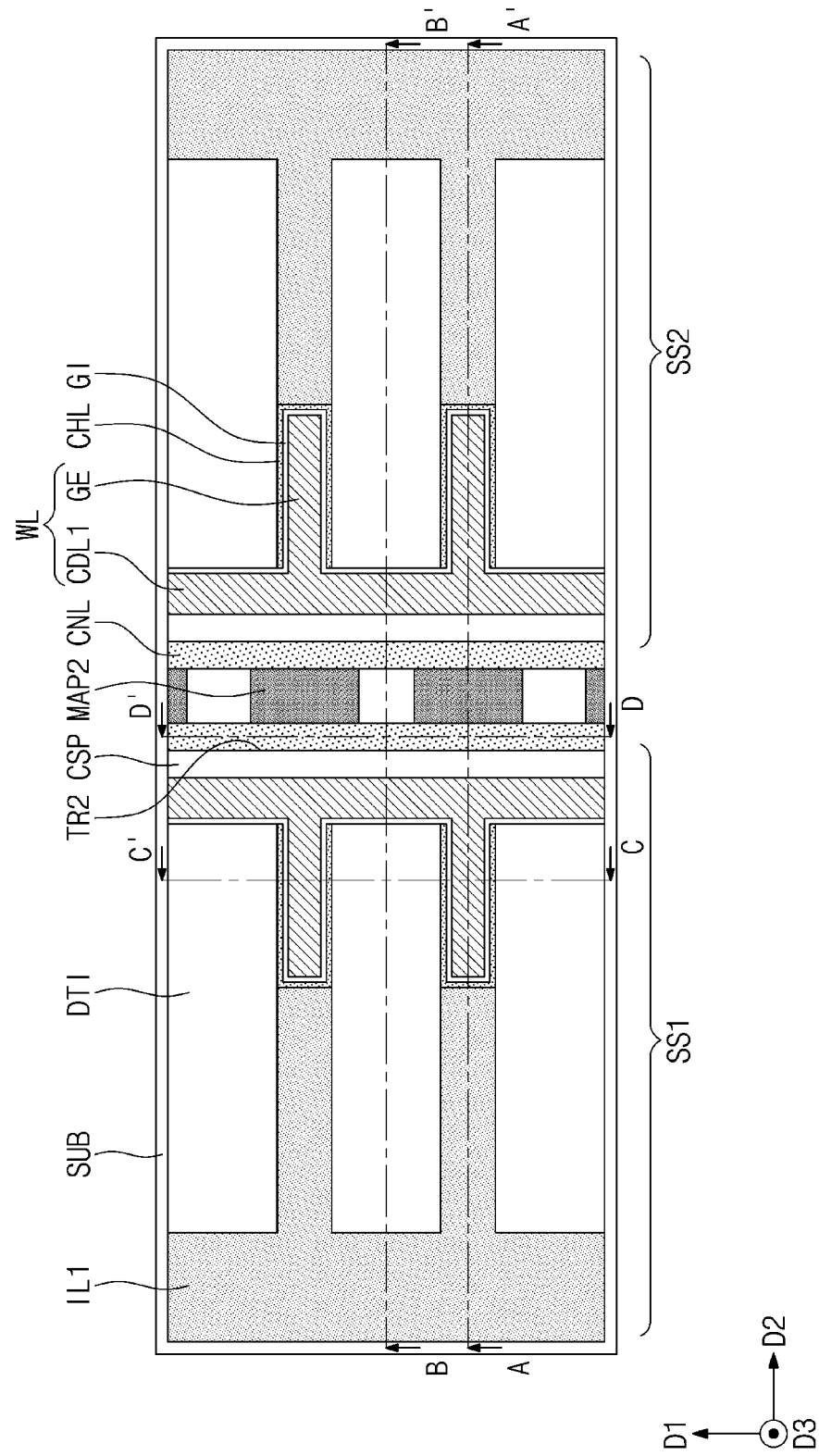
Figure 23A:
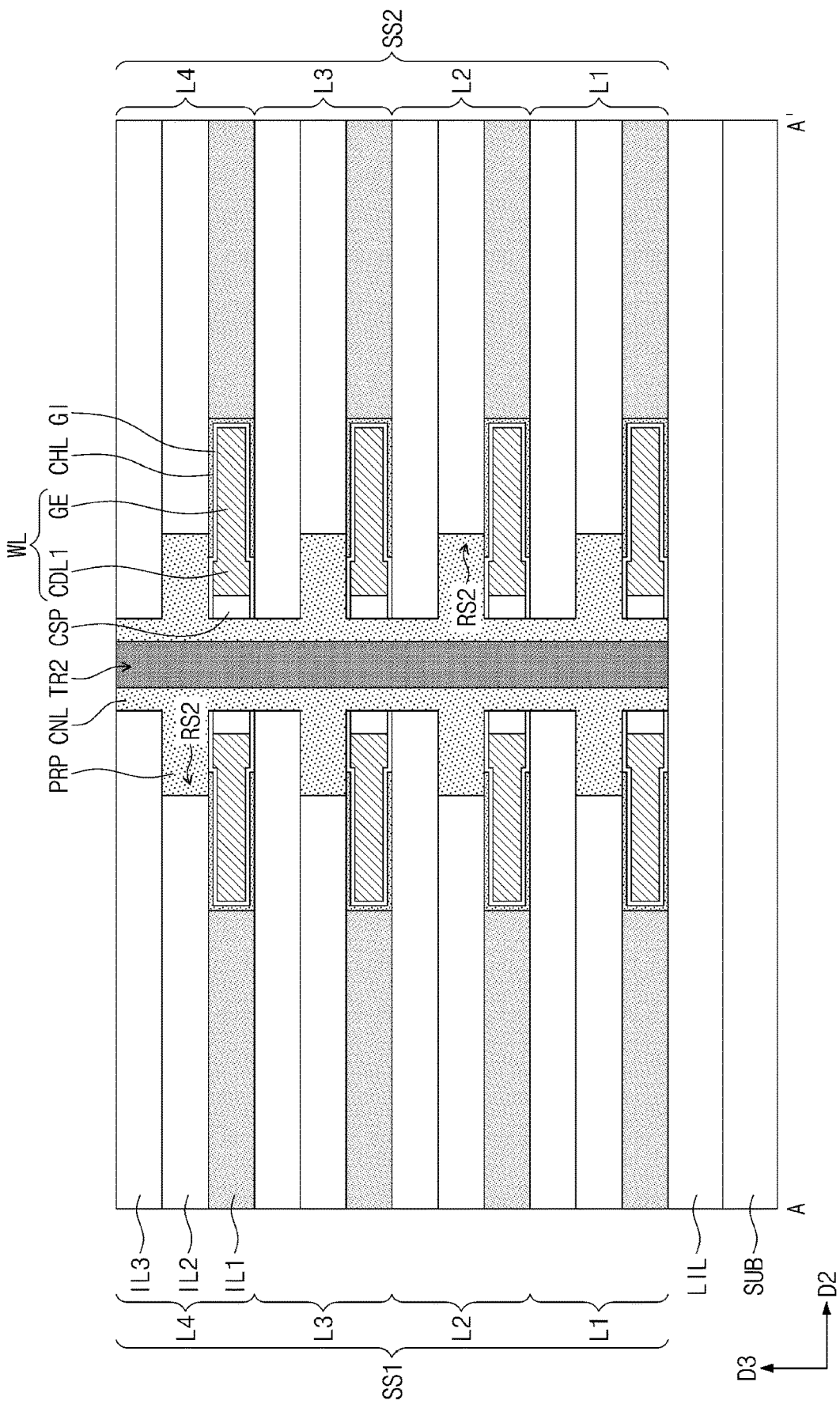
Figure 23B:
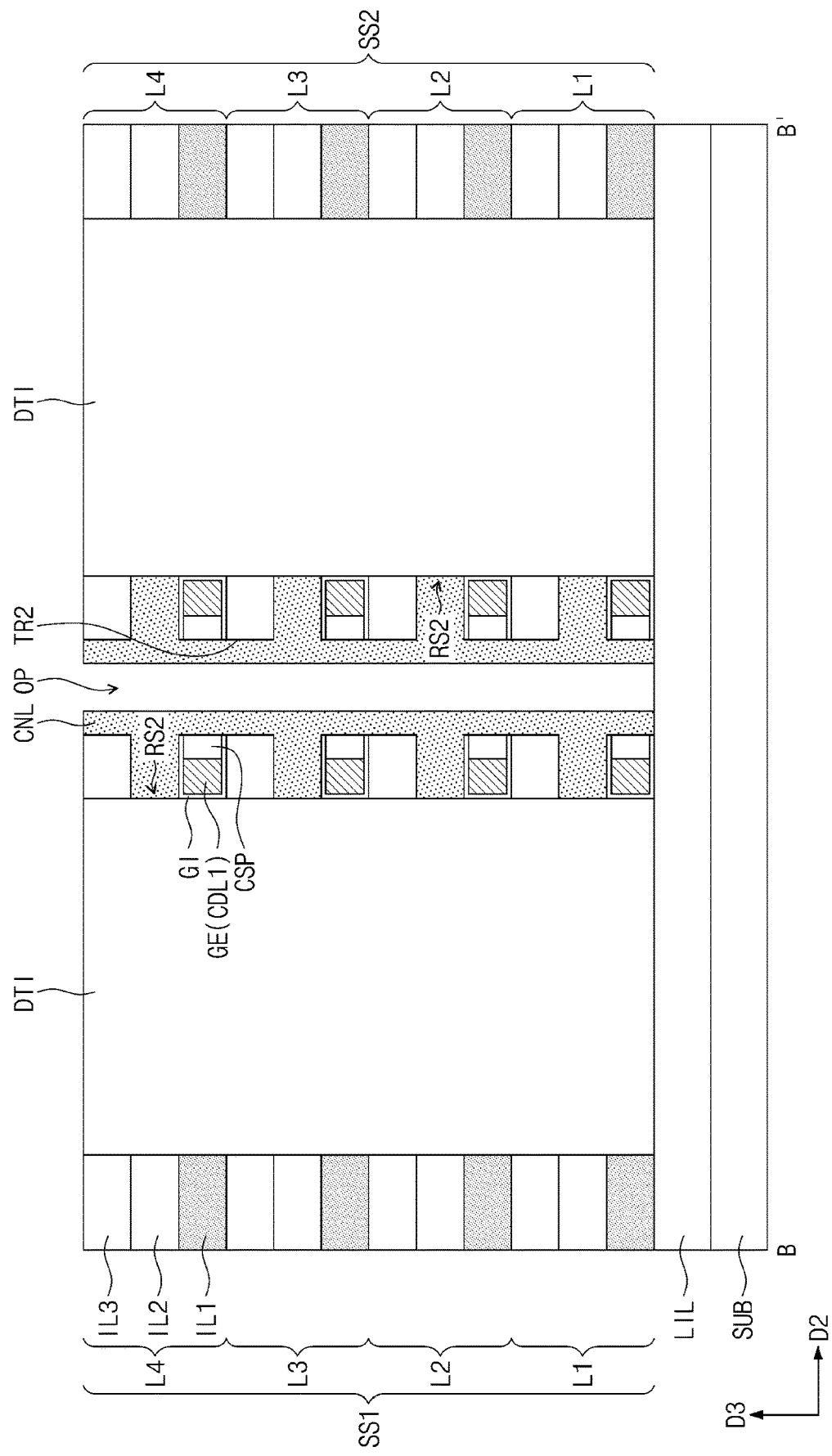
Figure 23C:
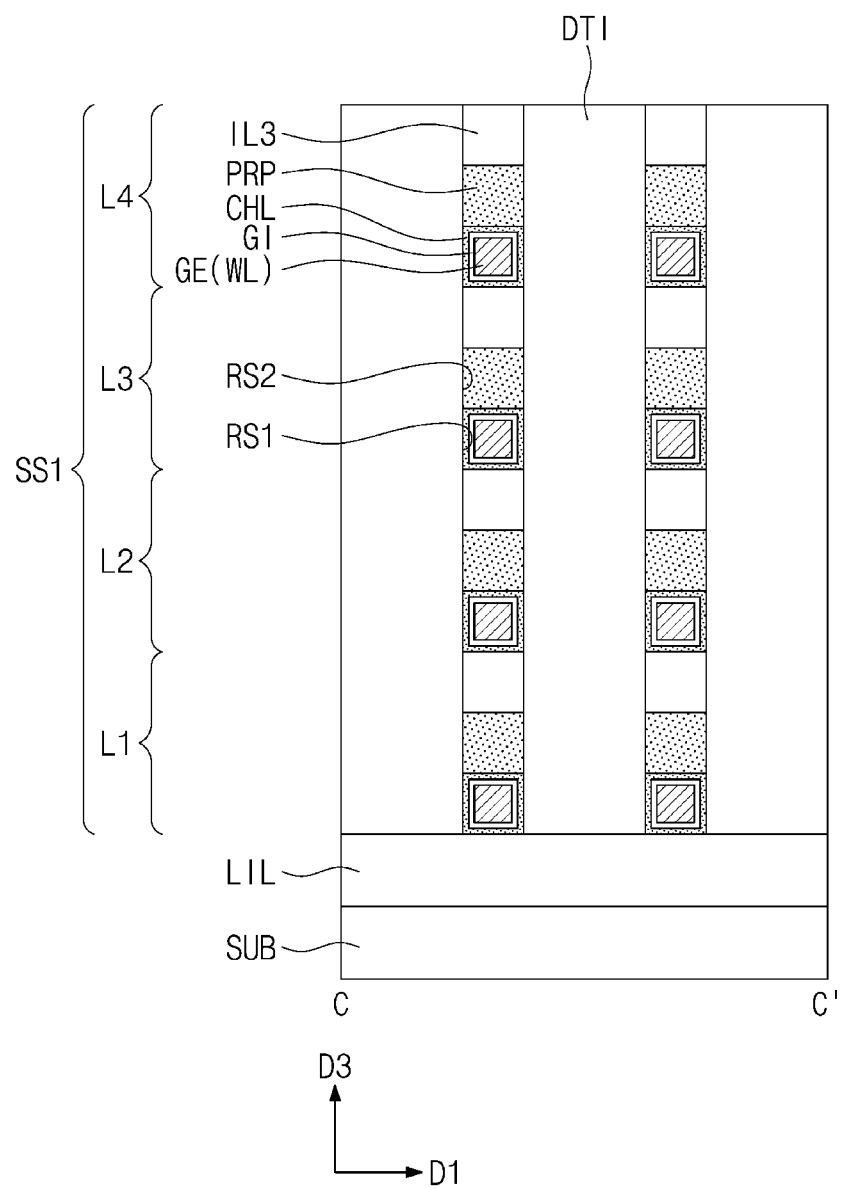
Figure 24:
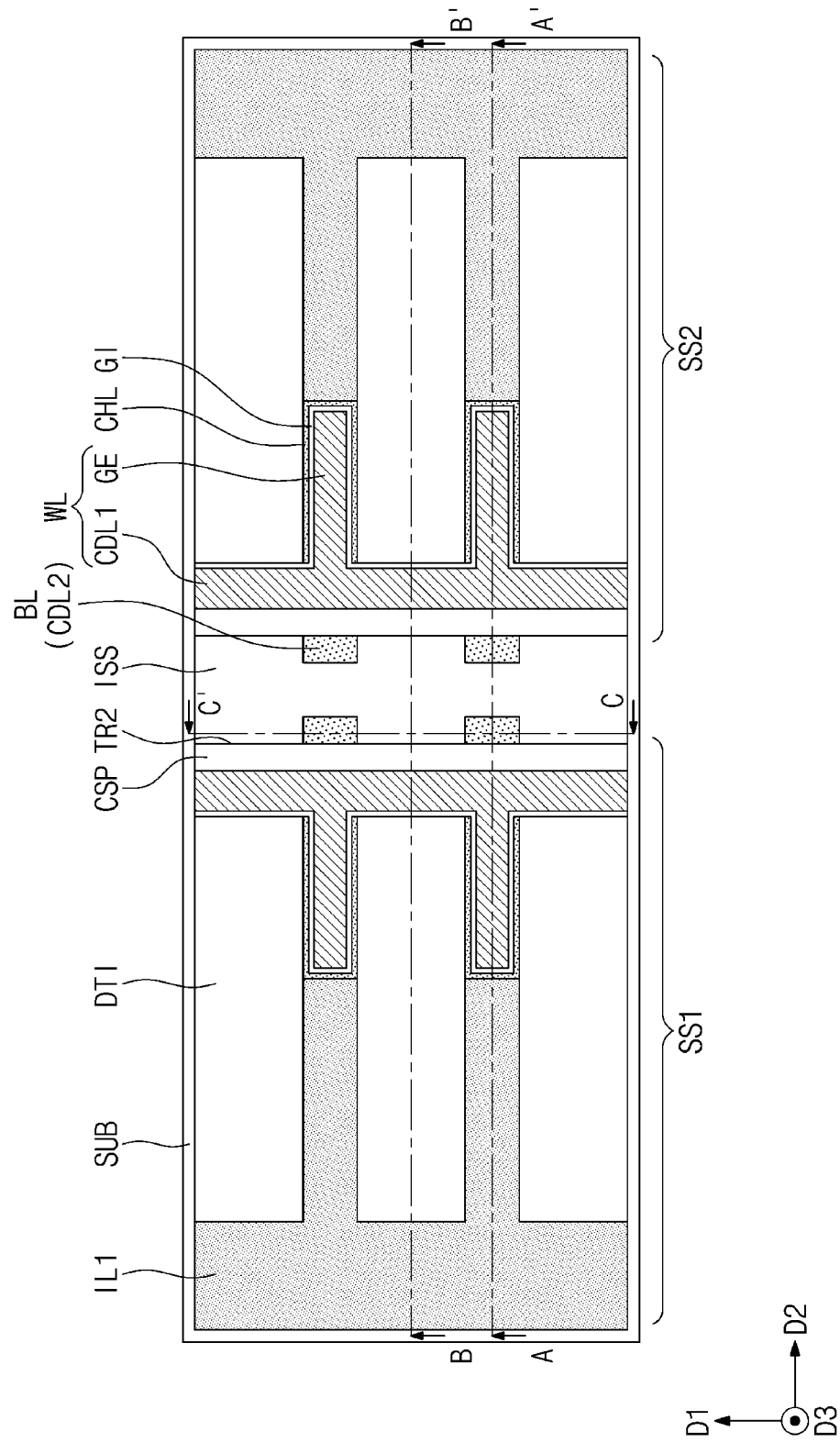
Figure 25A:
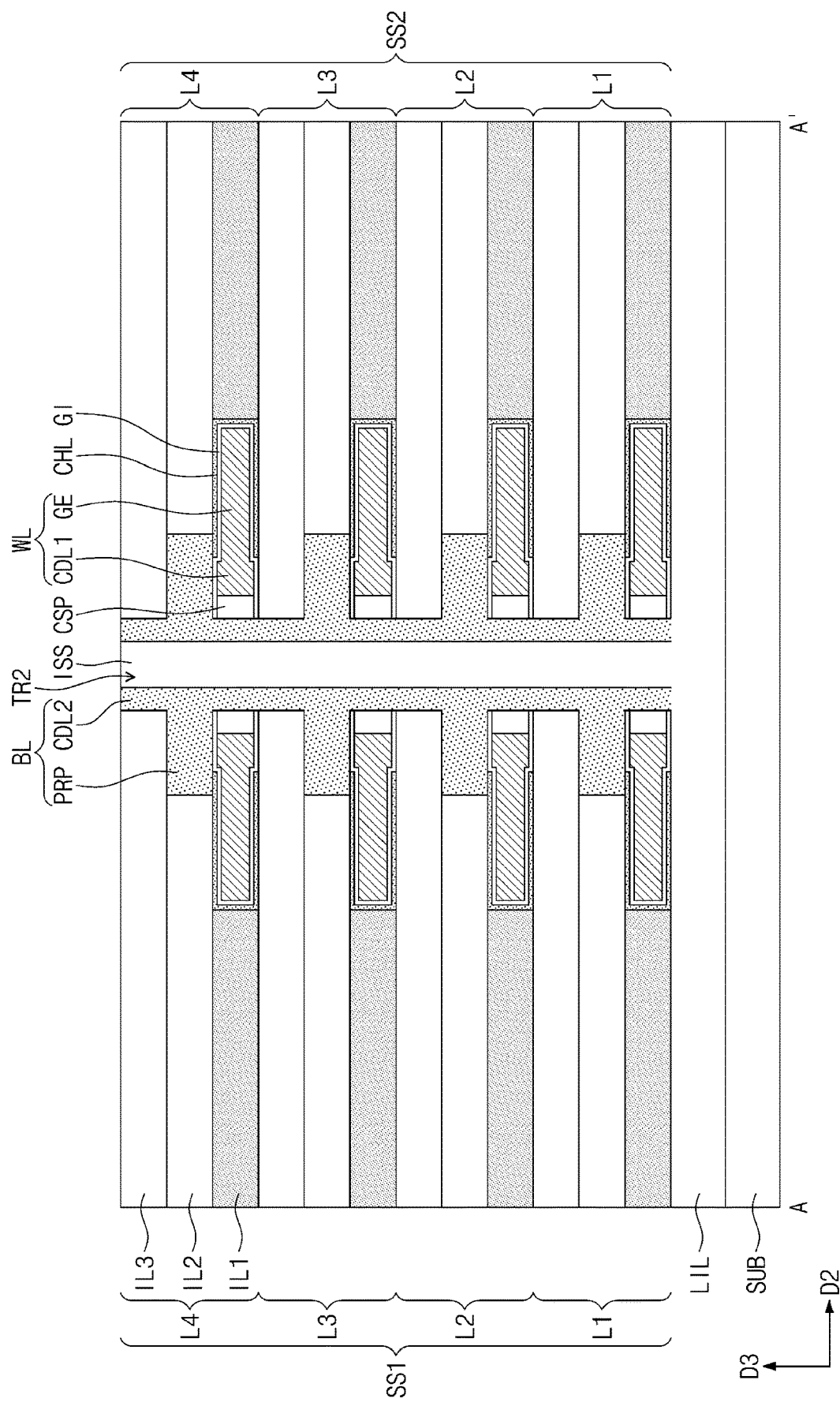
Figure 25B:
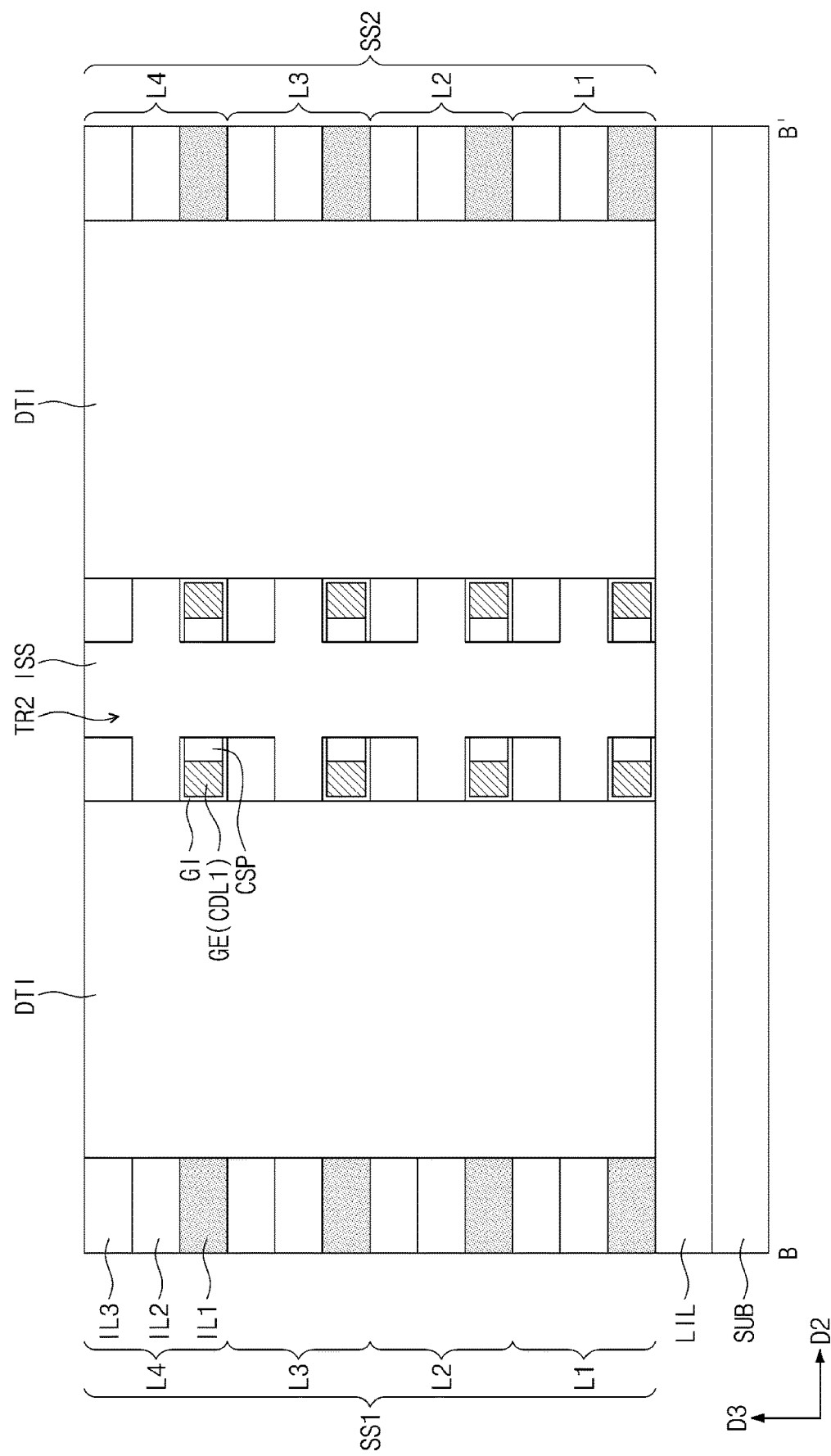
Figure 25C:
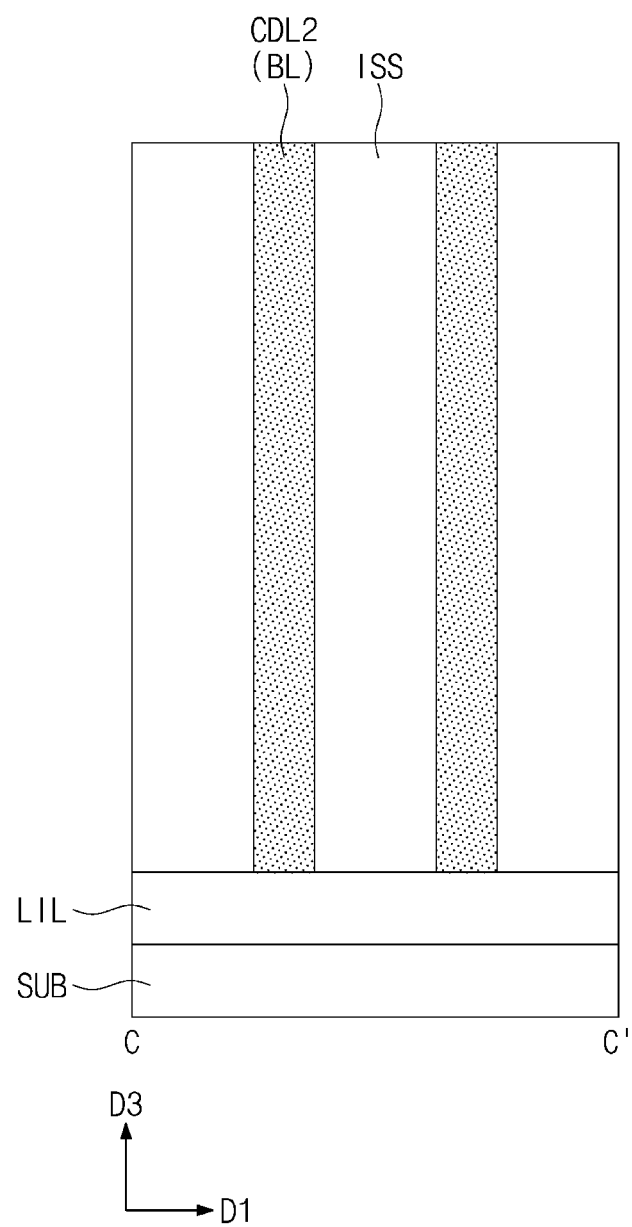
Figure 26:
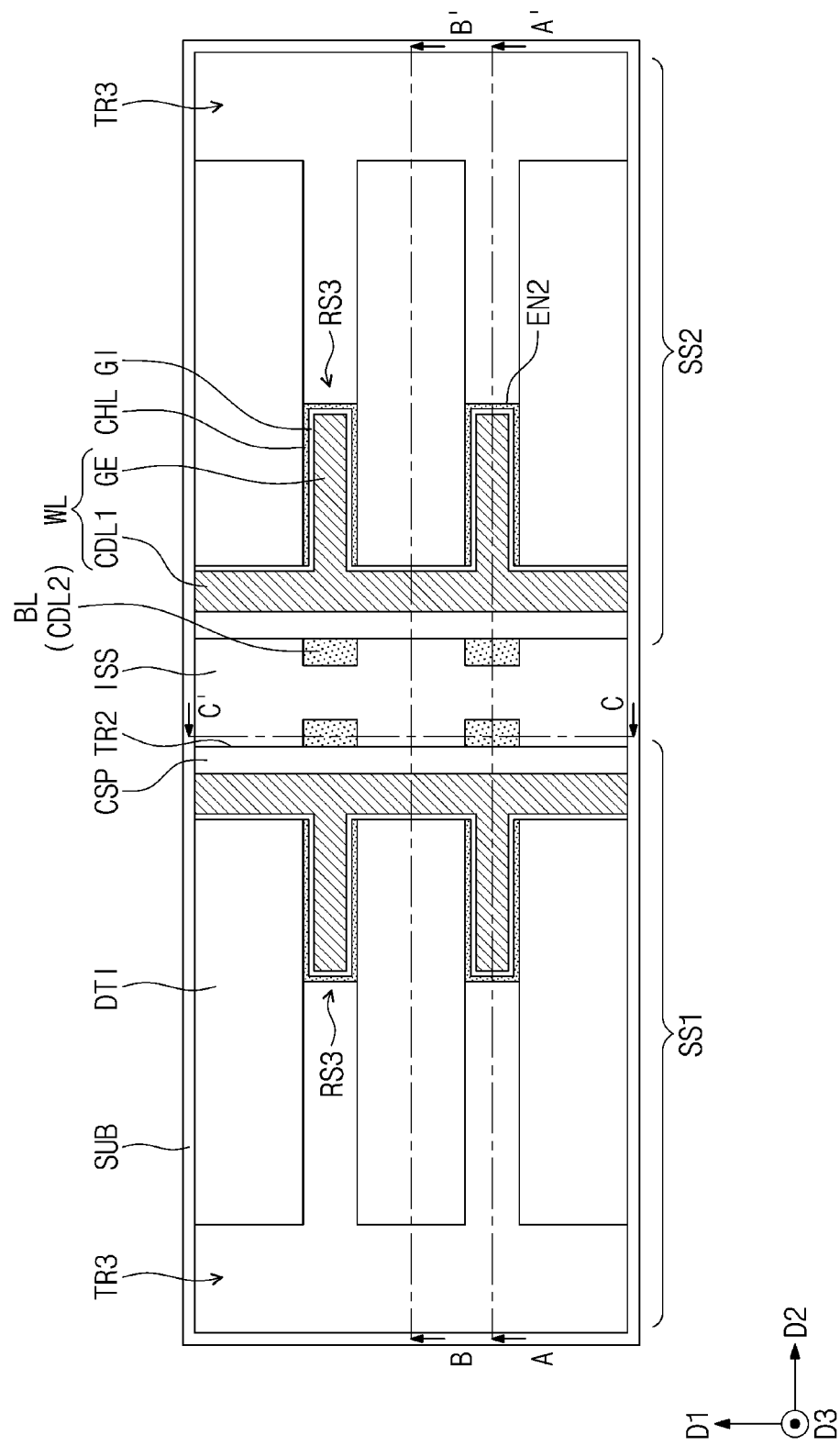
Figure 27A:
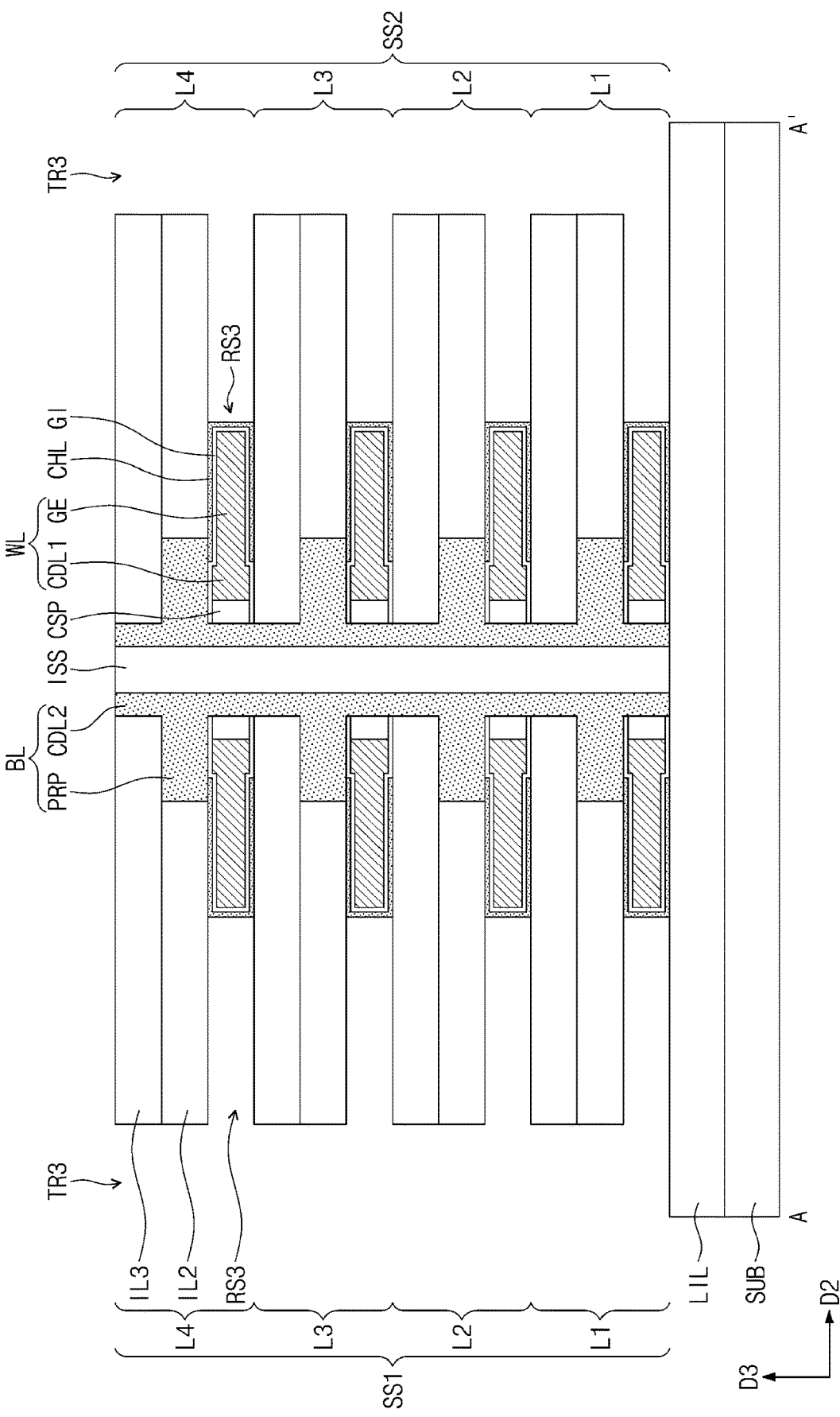
Figure 27B:
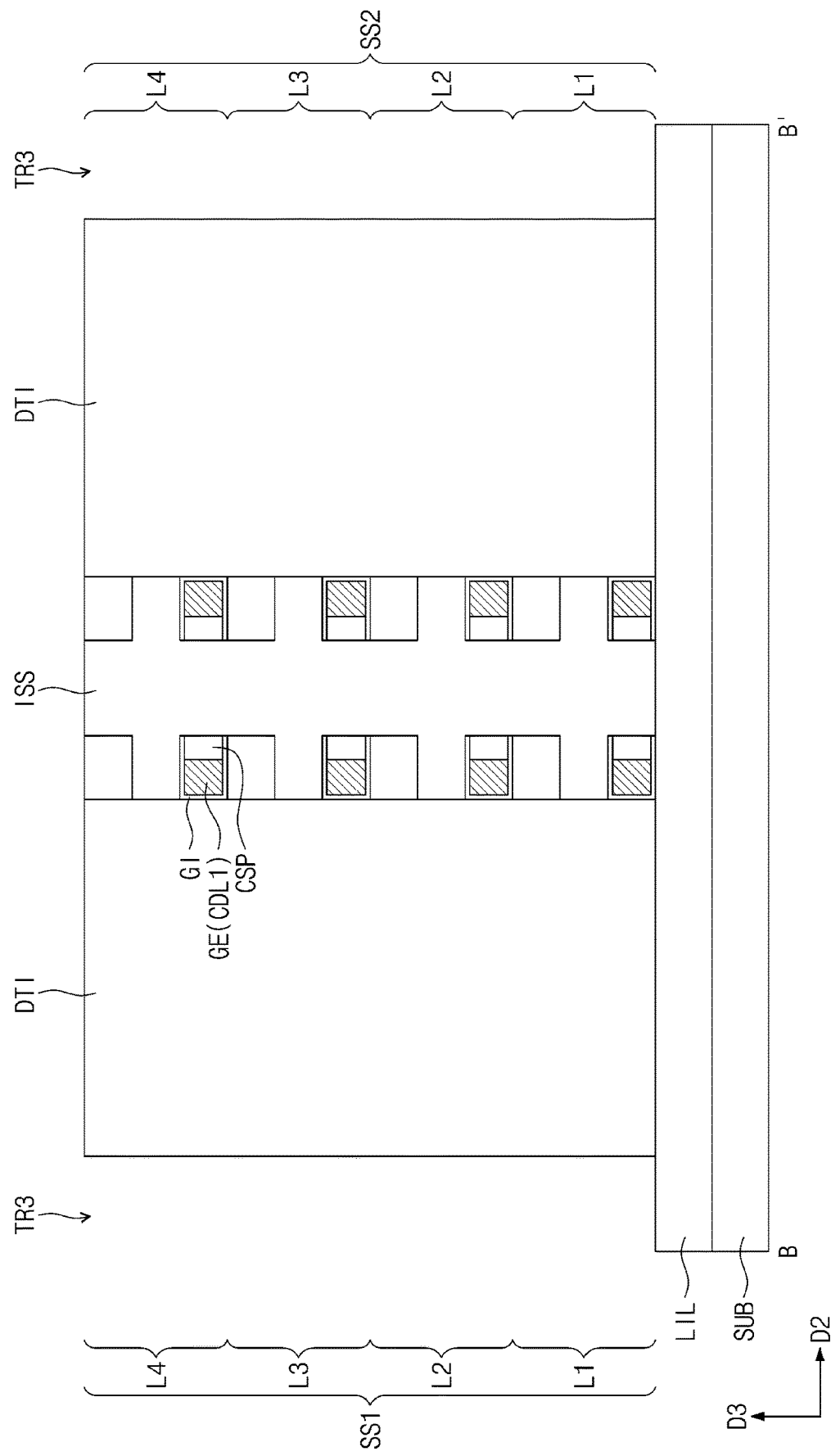
Figure 27C:
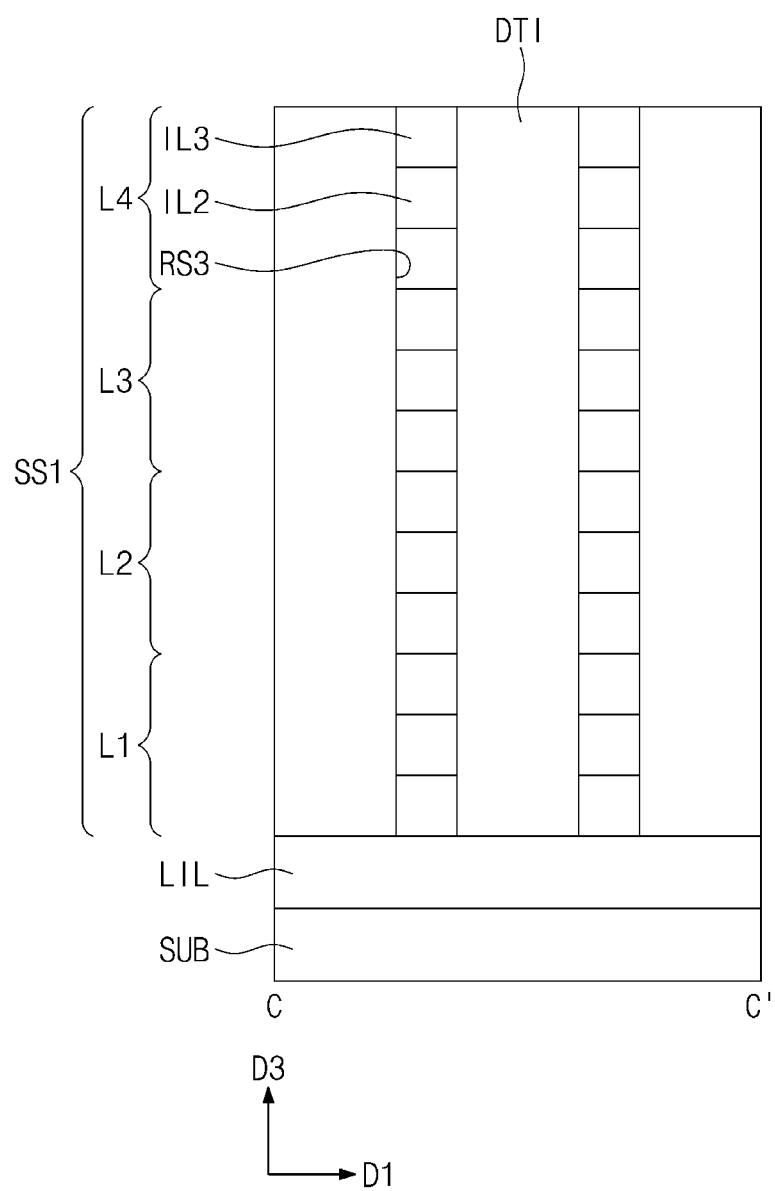

As the gate dielectric layer GI and the gate electrode GE are sequentially formed on the channel layer CHL in the first recess RS1, the channel layer CHL may surround the gate electrode GE (see FIG. 21C).

Referring to FIGS. 22 and 23A to 23C, the second dielectric layer IL2 exposed to the second trench TR2 may be partially etched. For example, a wet etching process may be performed in which only the second dielectric layers IL2 are selectively etched through the second trench TR2. The third dielectric layers IL3 and the vertical insulators DTI may remain intact during the wet etching process.

The second dielectric layers IL2 may be partially removed to form second recesses RS2 between the word line WL and the third dielectric layer IL3 on each of the first to fourth layers L1 to L4. Although a portion of the word line WL is provided between the second recess RS2 and the third dielectric layer IL3, another portion of the word line WL connected thereto is provided between the second dielectric layer IL2 and the third dielectric layer IL3. The second recess RS2 may be formed to expose at least a portion of the channel layer CHL.

In some embodiments of the present inventive concept, the second recess RS2 may be used to perform a doping process on a portion of the channel layer CHL. The doping process may allow the portion of the channel layer CHL to have electrical properties for serving as a source (or drain) of a memory cell transistor. For example, when the channel layer CHL includes an amorphous oxide semiconductor, the doping process may be performed in such a way that one or more of hydrogen (H), oxygen (O), and silicon (Si) are implanted as impurities.

A second metal layer CNL may be deposited in the second recesses RS2. The second metal layer CNL may be formed to completely fill the second recesses RS2. The second metal layer CNL may be formed to contact at least a portion of the channel layer CHL. In this case, the second metal layer CNL may directly contact the portion of the channel layer CHL and a portion of the gate dielectric layer GI. The second metal layer CNL may fill a portion of the second trench TR2.

Second mask patterns MAP2 may be formed in a remaining space of the second trench TR2 in which the second metal layer CNL is formed. Each of the second mask patterns MAP2 may have a pillar shape that vertically extends in a third direction D3. Openings OP may be defined between the second mask patterns MAP2. The openings OP may expose the lower layer LIL.

For example, the formation of the second mask patterns MAP2 may include forming a second mask layer in the second trench TR2, and anisotropically etching the second mask layer to form the openings OP.

Referring to FIGS. 24 and 25A to 25C, the second metal layer CNL may be wet-etched through the openings OP between the second mask patterns MAP2. The second metal layer CNL may undergo a wet etching process to form a plurality of bit lines BL that are separated from each other in the first direction D1. For example, the wet etching process may be used for node separation of the bit lines BL.

The bit line BL may include a connection part PRP formed in the second recess RS2 and a second conductive line CDL2 formed in the second trench TR2. The connection part PRP may electrically connect the bit line BL and the channel layer CHL to each other. This is so, because the connection part PRP, which is integrally formed with the second conductive line CDL2, is in direct contact with the channel CML. The gate dielectric layer GI and the capping pattern CSP may separate the bit line BL from the word line WL.

The second mask patterns MAP2 may be selectively removed. After the removal of the second mask patterns MAP2, a separation insulator ISS may be formed to fill the second trench TR2. The separation insulator ISS may separate the first stack structure SS1 and the second stack structure SS2 from each other in the second direction D2.

Referring to FIGS. 26 and 27A to 27C, a third trench TR3 may penetrate each of the first and second stack structures SS1 and SS2. The third trench TR3 may extend in the first direction D1. The third trench TR3 may expose the first, second, and third dielectric layers IL1, IL2, and IL3 included in each of the first and second stack structures SS1 and SS2.

The first dielectric layer IL1 exposed to the third trench TR3 may be etched. For example, a wet etching process may be performed in which only the first dielectric layers IL1 are selectively etched through the third trench TR3. The second and third dielectric layers IL2 and IL3 and the vertical insulators DTI may remain intact during the wet etching process.

The removal of the first dielectric layers IL1 may form third recesses RS3 on a lower portion of each of the first to fourth layers L1 to L4. The third recess RS3 may extend between a pair of neighboring vertical insulators DTI. The third recess RS3 may expose an end EN2 of the channel layer CHL.

In some embodiments of the present inventive concept, a doping process may be performed on the end EN2 of the channel layer CHL exposed to the third recess RS3. The doping process may allow the end EN2 of the channel layer CHL to have electrical properties for serving as a drain (or source) of a memory cell transistor. For example, when the channel layer CHL includes an amorphous oxide semiconductor, the doping process may be performed in such a way that one or more of hydrogen (H), oxygen (O), and silicon (Si) are implanted as impurities.

Referring back to FIGS. 8 and 9A to 9E, data storage elements DS may be correspondingly formed in the third recesses RS3. For example, the formation of the data storage element DS may include sequentially forming a first electrode EL1, a dielectric layer DL, and a second electrode EL2 in the third recess RS3. The second electrode EL2 may be formed to fill not only the third recesses RS3 but also the third trench TR3. The second electrode EL2 that fills the third trench TR3 may serve as a plate PLT.

Figure 28:
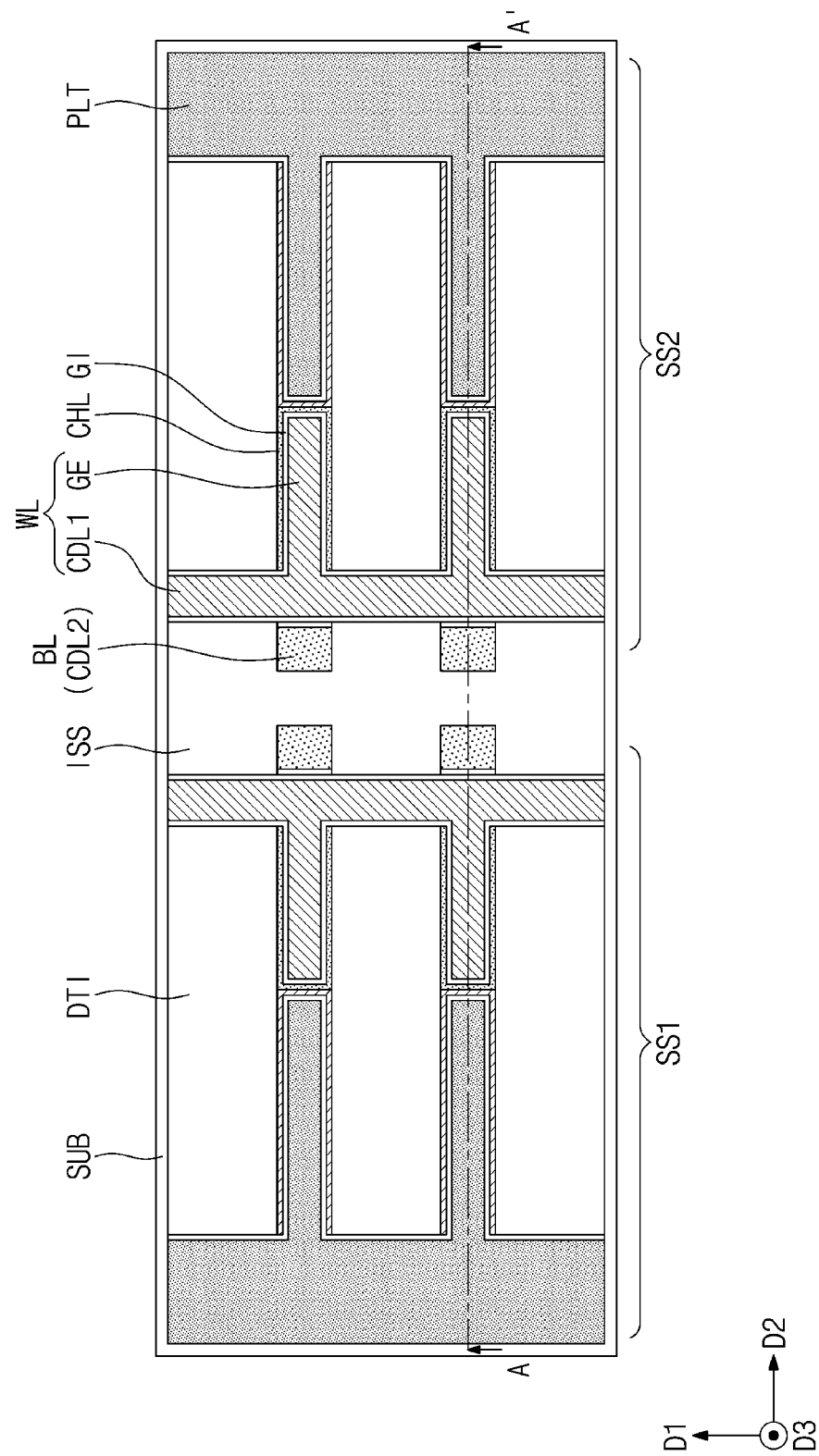
FIG. 28 illustrates a plan view showing a three-dimensional semiconductor memory device according to some embodiments of the present inventive concept.
Figure 29:
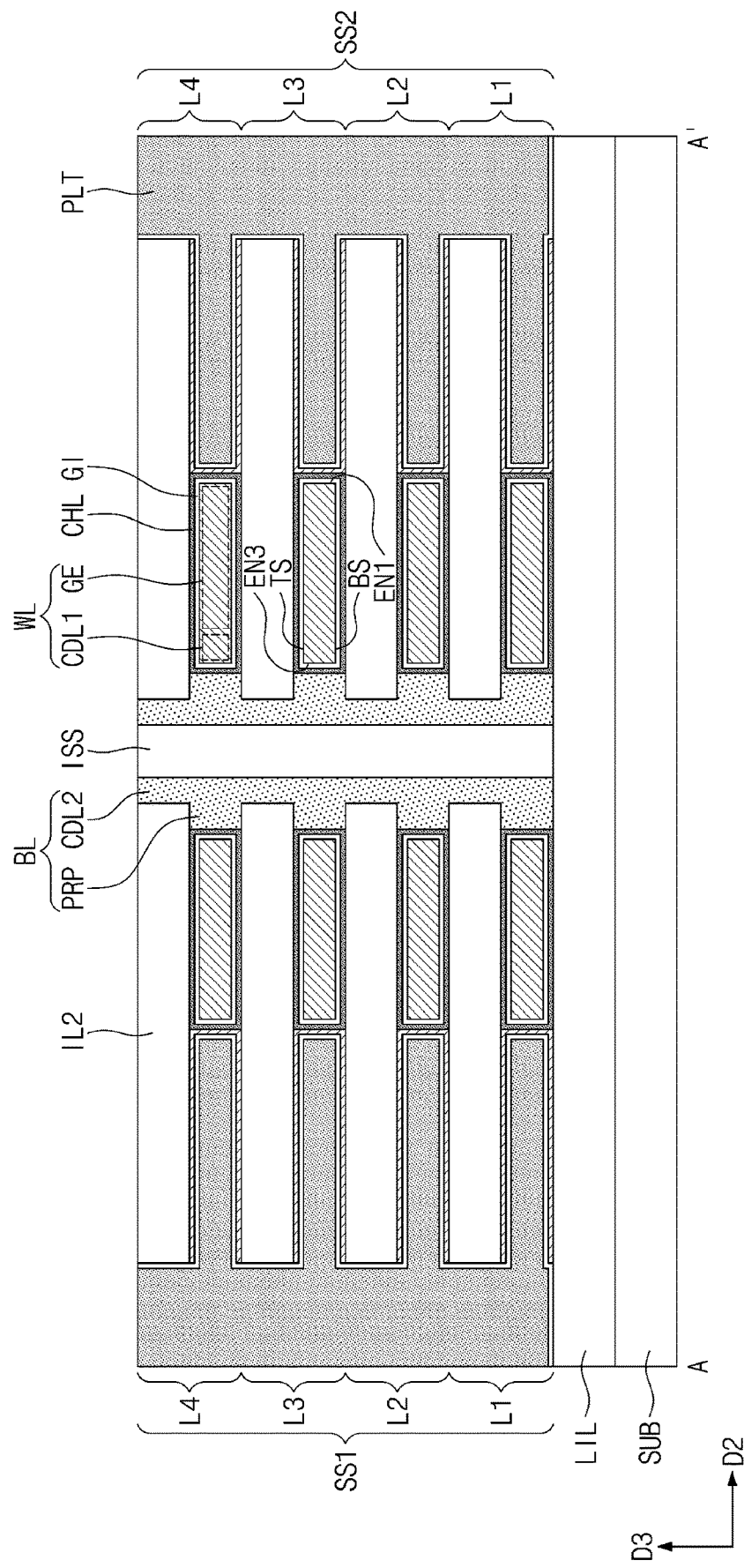
FIG. 29 illustrates a cross-sectional view taken along line A-A' of FIG. 28.

FIG. 28 illustrates a plan view showing a three-dimensional semiconductor memory device according to some embodiments of the present inventive concept. FIG. 29 illustrates a cross-sectional view taken along line A-A' of FIG. 28. In the embodiment that follows, a detailed description of technical features repetitive to those discussed above with reference to FIGS. 8 and 9A to 9E will be omitted, and a difference thereof will be discussed in detail.

Each of first and second stack structures SS1 and SS2 may include first, second, third, and fourth layers L1, L2, L3, and L4 that are sequentially stacked. Each of the first to fourth layers L1 to L4 may include a word line WL, a channel layer CHL, a gate dielectric layer GI, a data storage element DS, a connection part PRP of a bit line BL, and a second dielectric layer IL2.

The third dielectric layer IL3, which is discussed above with reference to FIGS. 8 and 9A to 9E, may be omitted. The word line WL, the channel layer CHL, the gate dielectric layer GI, the data storage element DS, and the connection part PRP may be provided at the same level in each of the first to fourth layers 1 to L4. For each of the first to fourth layers L1 to L4, the second dielectric layer IL2 may be provided on the word line WL, the channel layer CHL, the gate dielectric layer GI, the data storage element DS, and the connection part PRP.

For each of the first and second stack structures SS1 and SS2 shown in FIGS. 8 and 9A to 9E, each of the first to fourth layers L1 to L4 may be formed to have a three-layered structure. For each of the first and second stack structures SS1 and SS2 according to the present embodiment, each of the first to fourth layers L1 to L4 may have a two-layered structure. Therefore, each of the first to fourth layers L1 to L4 according to the present embodiment may have a height less than that of each of the first to fourth layers L1 to L4 shown in FIGS. 8 and 9A to 9E. In other words, each of the first to fourth layers L1 to L4 according to the present embodiment may be thinner than that of each of the first to fourth layers L1 to L4 shown in FIGS. 8 and 9A to 9E. As a result, the first and second stack structures SS1 and SS2 according to the present embodiment may decrease in height and increase in integration of memory cells.

The gate dielectric layer GI may completely surround a surface of the word line WL. The word line WL may be provided thereon with the channel layer CHL that encloses circumference of the word line WL In other words, the channel layer CHL may surround the gate dielectric layer GI. The channel layer CHL may be provided on a top surface TS, a bottom surface BS, an end EN1, and an opposing end EN3 of the word line WL. The channel layer CHL may be provided not only on the gate electrode GE of the word line WL but also on the first conductive line CDL1 of the word line WL.

The connection part PRP of the bit line BL may be in contact with an end of the channel layer CHL. The second conductive line CRL2 of the bit line BL may be connected in common to through a plurality of connection parts PRP through the channel layers CHL that are stacked.

Figure 30:
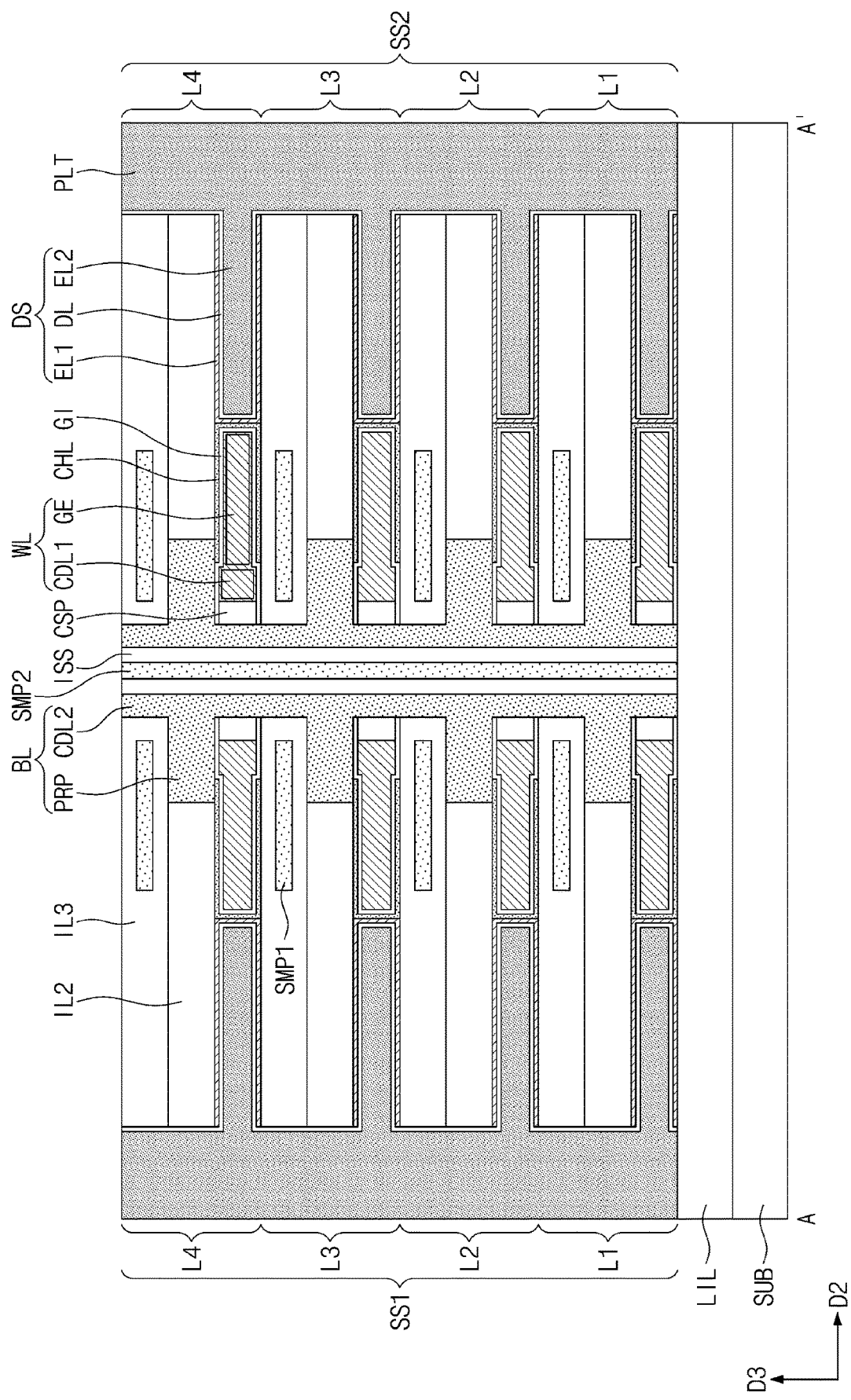
FIGS. 30 and 31 illustrate cross-sectional views taken along line A-A' of FIG. 8, showing a three-dimensional semiconductor memory device according to some embodiments of the present inventive concept.
Figure 31:
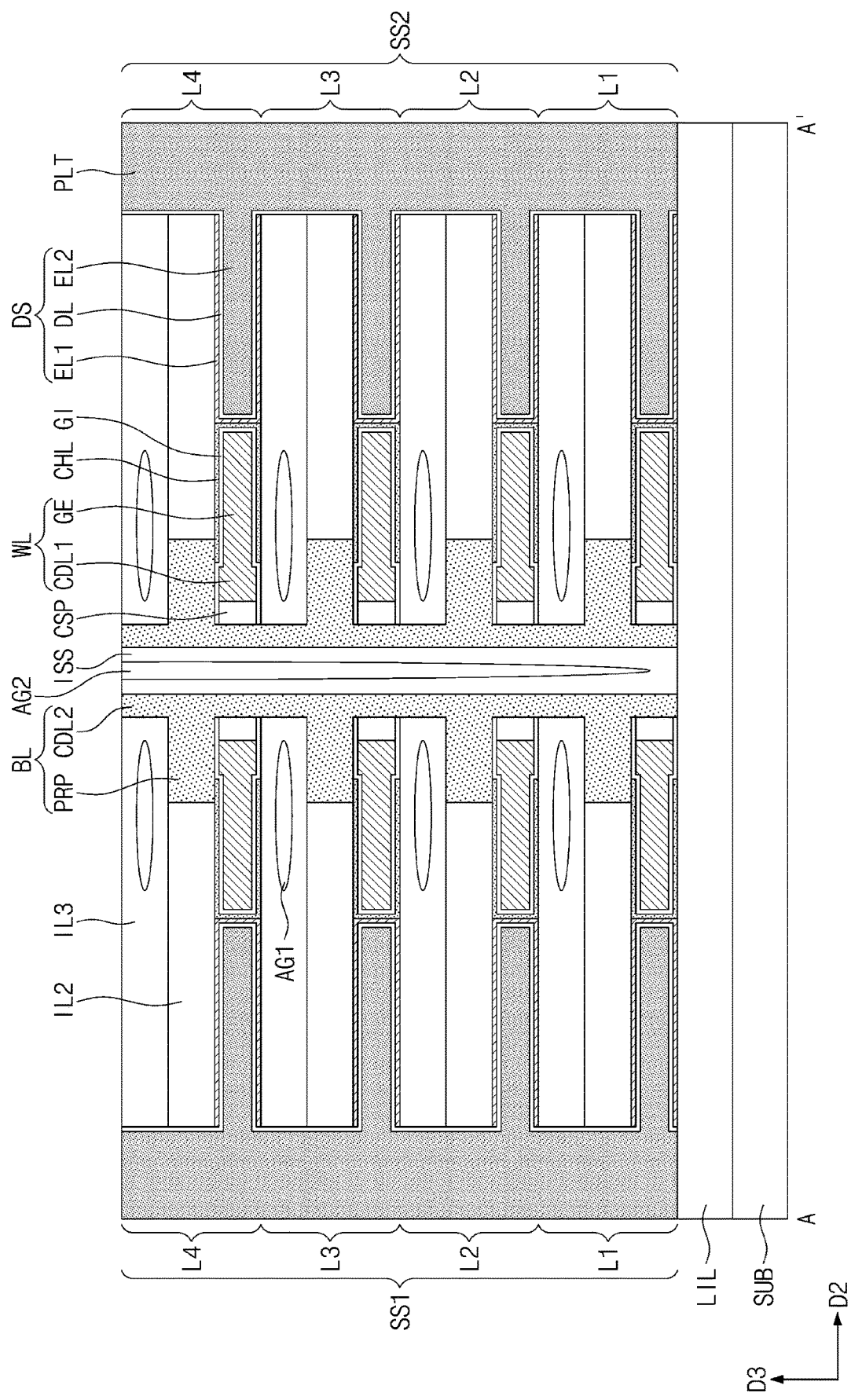

FIGS. 30 and 31 illustrate cross-sectional views taken along line A-A' of FIG. 8, showing a three-dimensional semiconductor memory device according to some embodiments of the present inventive concept.

Referring to FIG. 30, a first shield pattern SMP1 may be interposed between the word lines WL that are vertically adjacent to each other. For example, the first shield pattern SMP1 may be provided in the third dielectric layer IL3.

The first shield pattern SMP1 may reduce a coupling capacitance caused by mutual interference between neighboring word lines WL. For example, the first shield pattern SMP1 may extend in the first direction D1 together with the word line WL and may connect with a node that applies a ground voltage.

A second shield pattern SMP2 may be interposed between the bit lines BL that are horizontally adjacent to each other. The second shield pattern SMP2 may have a linear or pillar shape that vertically extends in the third direction D3. The second shield pattern SMP2 may penetrate the separation insulator ISS.

The second shield pattern SMP2 may reduce a coupling capacitance caused by mutual interference between neighboring bit lines BL. For example, the second shield pattern SMP2 may be connected to a node that applies a ground voltage.

Referring to FIG. 31, a first air gap AG1 may be provided to in place of the first shield pattern SMP1. For example, the first air gap AG1 may be provided in the third dielectric layer IL3. A second air gap AG2 may be provided in place of the second shield pattern SMP2. The second air gap AG2 may be provided in the separation insulator ISS.

Because the first air gap AG1 has a relatively low dielectric constant, it is possible to reduce a coupling capacitance caused by mutual interference (e.g., crosstalk) between the word lines WL. When the first air gap AG1 is absent, a thickness of the third dielectric layer IL3 may have to be increased to reduce capacitance between the word lines WL. In contrast, according to some embodiments of the present inventive concept, because the first air gap AG1 whose dielectric constant is low is provided between the word lines WL, the third dielectric layer IL3 may have a relatively small thickness. Accordingly, the first and second stack structures SS1 and SS2 may have relatively small heights.

The second shield pattern SMP2 may also reduce coupling capacitance caused by mutual interference between neighboring bit lines BL. There may be a relatively small distance may be provided between the bit lines BL that are adjacent to each other across the second air gap A62.

A three-dimensional semiconductor memory device according to some embodiments of the present inventive concept may be configured such that a gate electrode is surrounded with a channel layer. Therefore, the gate electrode may increase in channel controllability. The channel layer according to an embodiment of the present inventive concept may be formed by a deposition process that uses an amorphous oxide semiconductor or a two-dimensional semiconductor, thus, it is possible to easily achieve vertically stacked channels and three-dimensional channels.

A three-dimensional semiconductor memory device according to some embodiments of the present inventive concept may be configured such that a bit line is formed vertically and a word line is formed horizontally. Accordingly, process defects may decrease and device reliability may increase in achieving a three-dimensional memory cell array.

Although some example embodiments of inventive concept have been discussed with reference to accompanying figures, it will be understood that various changes in form and details may be made thereto without departing from the spirit and scope of inventive concept as set forth in the following, claims. It therefore will be understood that the embodiments described above are illustrative and not limiting.

What is claimed is:

1. A semiconductor memory device, comprising:
a stack structure including a plurality of layers that are vertically stacked on a substrate, each of the plurality of layers including a word line, a channel layer, and a data storage element electrically connected to the channel layer; and
a bit line that vertically extends on one side of the stack structure,
wherein the word line includes:
a first conductive line that extends in a first direction; and
a gate electrode that protrudes in a second direction from the first conductive line, the second direction intersecting the first direction,
wherein the channel layer is on the gate electrode,
wherein the bit line includes a connection part electrically connected to the channel layer, and
wherein a first portion of the channel layer is connected to the connection part, the first portion being sandwiched between the connection part and the gate electrode,
wherein the gate electrode includes a plurality of gate electrodes that protrude in the second direction from the first conductive line, and the word line has a comb shape.

2. The semiconductor memory device of claim 1, wherein the channel layer is on a top surface, a bottom surface, and one end of the gate electrode.

3. The semiconductor memory device of claim 1, wherein the channel layer has a hollow internal space, and
the gate electrode is disposed in the internal space of the channel layer.

4. The semiconductor memory device of claim 1, further comprising a gate dielectric layer between the channel layer and the gate electrode.

5. The semiconductor memory device of claim 1, wherein the bit line further includes a second conductive line that vertically extends,
wherein the connection part protrudes in the second direction from the second conductive line.

6. The semiconductor memory device of claim 1, wherein the channel layer includes an amorphous oxide semiconductor or a two-dimensional semiconductor.

7. The semiconductor memory device of claim 1, wherein a second portion of the channel layer is connected to the data storage element.

8. The semiconductor memory device of claim 1, wherein the data storage element includes:
a first electrode electrically connected to the channel layer;
a second electrode on the first electrode; and
a dielectric layer between the first electrode and the second electrode.

9. The semiconductor memory device of claim 1, further comprising:
a peripheral circuit layer between the substrate and the stack structure; and
a through contact that electrically connects at least one of the word line and the bit line to the peripheral circuit layer.

10. A semiconductor memory device, comprising:
a plurality of word lines that are stacked and spaced apart from each other on a substrate, the word lines extending in a first direction parallel to a top surface of the substrate;
a bit line that extends vertically across the word lines;
a gate electrode that protrudes in a second direction from a corresponding one of the word lines, wherein the second direction intersects the first direction and is parallel to the top surface of the substrate;
a channel layer overlapping the gate electrode; and
a data storage element electrically connected to the channel layer,
wherein the channel layer has a hollow shape,
wherein the gate electrode is provided in an internal space of the channel layer, and
wherein the bit line is electrically connected to the channel layer.

11. The semiconductor memory device of claim 10, wherein
the gate electrode includes a plurality of gate electrodes that protrude in the second direction from the word line, and
the word line has a comb shape.

12. The semiconductor memory device of claim 10, wherein the channel layer includes an amorphous oxide semiconductor or a two-dimensional semiconductor.

13. The semiconductor memory device of claim 10, wherein the bit line includes a second conductive line that extends vertically and a connection part that protrudes in the second direction from the second conductive line,
wherein the connection part is electrically connected to the channel layer.

14. The semiconductor memory device of claim 10, further comprising a peripheral circuit layer electrically connected to the word lines and the bit line,
wherein the peripheral circuit layer is below or above a memory cell array layer.

15. A semiconductor memory device, comprising:
a word line on a substrate, the word line including a first conductive line that extends in a first direction parallel to a top surface of the substrate and a plurality of gate electrodes that protrude in a second direction from the first conductive line, the second direction intersecting the first direction;
a plurality of bit lines that intersect the word line and extend vertically;
a plurality of channel layers, each of the plurality of channel layers disposed between a corresponding one the plurality of bit lines and a corresponding one of the plurality of gate electrodes; and
a plurality of data storage elements, wherein each of the data storage elements is electrically connected to a corresponding one of the channel layers,
wherein the word line has a comb shape, and
wherein a portion of each of the plurality of gate electrodes is disposed inside a corresponding channel layer.

16. The semiconductor memory device of claim 15, wherein the plurality of channel layers include an amorphous oxide semiconductor or a two-dimensional semiconductor.

17. The semiconductor memory device of claim 15, wherein each of the plurality of bit lines includes:
   a second conductive line that extends vertically; and
   a connection part that protrudes in the second direction from the second conductive line,
   wherein the connection part is electrically connected to the channel layer that corresponds to the connection part.

18. The semiconductor memory device of claim 15, wherein each of the plurality of channel layers surrounds a surface of a corresponding gate electrode.

19. The semiconductor memory device of claim 18, wherein
   each of the plurality of channel layers has a hollow shape, and
   the corresponding gate electrode is provided in an internal space of the channel layer.

* * * * *